United States Patent
Takeda

(10) Patent No.: US 7,532,536 B2
(45) Date of Patent: May 12, 2009

(54) SEMICONDUCTOR MEMORY DEVICE

(75) Inventor: Koichi Takeda, Tokyo (JP)

(73) Assignee: NEC Corporation, Tokyo (JP)

( * ) Notice: Subject to any disclaimer, the term of this patent is extended or adjusted under 35 U.S.C. 154(b) by 237 days.

(21) Appl. No.: 10/577,398

(22) PCT Filed: Sep. 17, 2004

(86) PCT No.: PCT/JP2004/014035

§ 371 (c)(1),
(2), (4) Date: Apr. 27, 2006

(87) PCT Pub. No.: WO2005/041203

PCT Pub. Date: May 6, 2005

(65) Prior Publication Data

US 2007/0041239 A1     Feb. 22, 2007

(30) Foreign Application Priority Data

Oct. 27, 2003   (JP)   ............................. 2003-365436

(51) Int. Cl.
*G11C 8/00*     (2006.01)
*G11C 7/10*     (2006.01)
*G11C 11/00*    (2006.01)

(52) U.S. Cl. .................. 365/230.05; 365/154; 365/156; 365/189.04

(58) Field of Classification Search ............. 365/230.05
See application file for complete search history.

(56) References Cited

U.S. PATENT DOCUMENTS 4,441,169 A * 4/1984 Sasaki et al. ................. 365/190
4,723,229 A   2/1988 Hartgring et al.
4,928,266 A * 5/1990 Abbott et al. ........... 365/189.14

(Continued)

FOREIGN PATENT DOCUMENTS

JP      61-026997      2/1986

(Continued)

OTHER PUBLICATIONS

A.J. Bhavnagarwala et al., "The Impact of Intrinsic Device Fluctuations on CMOS SRAM Cell Stability," IEEE Journal of Solid-State Circuits, vol. 36: Apr. 4, 2001.

(Continued)

*Primary Examiner*—Son L Mai
(74) *Attorney, Agent, or Firm*—Foley & Lardner LLP

(57) ABSTRACT

The SRAM cells of a semiconductor storage device each comprise first and second inverter circuits loop-connected with each other to form a hold circuit; two access transistors; and a hold control transistor connected in series with a drive transistor of the second inverter circuit. While the memory cell is not accessed, the hold control transistor causes the first and second inverter circuits to form the loop connected hold circuit for statically holding data. When the memory cell is accessed, the hold control transistor causes the first and second inverter circuits to be disconnected from the loop connection for dynamically holding data, thereby preventing data corruption that would otherwise possible occur due to a read operation. Moreover, a sense amplifier circuit that uses a single bit line to read data from a memory cell is disposed in a space appearing in the memory cell array, thereby effectively using the area.

29 Claims, 47 Drawing Sheets

U.S. PATENT DOCUMENTS

| | | | |
|---|---|---|---|
| 5,353,251 A * | 10/1994 | Uratani et al. | 365/189.05 |
| 5,808,933 A * | 9/1998 | Ross et al. | 365/156 |
| 5,812,445 A * | 9/1998 | Yamauchi | 365/154 |
| 5,831,896 A * | 11/1998 | Lattimore et al. | 365/154 |
| 5,877,979 A * | 3/1999 | Li et al. | 365/154 |
| 5,986,923 A * | 11/1999 | Zhang et al. | 365/154 |
| 6,549,453 B2 * | 4/2003 | Wong | 365/156 |
| 6,940,746 B2 * | 9/2005 | Kushida | 365/154 |
| 7,038,926 B2 * | 5/2006 | Jeong et al. | 365/63 |
| 7,110,317 B2 * | 9/2006 | Song et al. | 365/226 |
| 2003/0185044 A1 * | 10/2003 | Nii | 365/154 |
| 2004/0125683 A1 * | 7/2004 | Iwahashi et al. | 365/230.05 |
| 2006/0044866 A1 * | 3/2006 | Tsukamoto et al. | 365/154 |

FOREIGN PATENT DOCUMENTS

| | | |
|---|---|---|
| JP | 61-188795 | 8/1986 |
| JP | 04-085789 | 3/1992 |
| JP | 07-230692 | 8/1995 |
| JP | 10-188570 | 7/1998 |
| JP | 11-017025 | 1/1999 |

OTHER PUBLICATIONS

H. Sakakibara et al., "A 750 MHz Cache DRAM LSi with Speed Scalable Design and Programmable at-Speed Function-Array BIST," 2003 IEEE International Solid-State Circuits Conference.

* cited by examiner

PRIOR ART

PRIOR ART

PRIOR ART

SEMICONDUCTOR MEMORY DEVICE

TECHNICAL FIELD

The present invention relates to semiconductor memory devices and, more particularly, to a semiconductor memory device comprising a minimum number of transistors, operating at an ultra-high speed and an ultra-low voltage, preventing data corruption during the read operation.

BACKGROUND POTENTIAL ART

With custom ICs for use in an ASIC (Application Specific Integrated Circuit) or the like, attempts have heretofore been taken to refine transistors to the lower a power supply voltage for thereby improving operating speeds. With these custom ICs, a variety of memory devices are embedded. A need also arises for these embedded memory devices to similarly operate at the high speed and low power supply voltages and, in application to, for instance, cash memories or the like, a static random access memory (SRAM: Static Random Access Memory that is herein after referred to as SRAM) similarly needs to operate at the high speed and low power supply voltages.

An SRAM of the related art is described with reference to FIG. 1. FIG. 1 shows a circuit structure of a unit cell (hereinafter referred to as an SRAM cell) of the related art SRAM by which a cache memory is structured. In a case where a word line signal WL lies a low voltage potential, forming two CMOS (Complementary Metal Oxide Semiconductor) inverters in loop connection enables data to be stably stored. That is, one of the CMOS inverts has an input formed of a data storage node V1 to allow inverted data of data stored in the node V1 to be output to a data storage node V2 and the other of the CMOS inverts has an input formed of a data storage node V2 to allow inverted data of data stored in the node V2 to be output to the data storage node V1.

However, in an event that the word line signal WL is accessed to be raised to a high voltage potential, the data storage nodes V1, V2 and bit line pair BLT, BLN are made conductive to each other via access transistors to cause the low voltage potential of the data storage nodes V1, V2 to be raised from a ground potential, resulting in a difficulty of stably holding data. In general, with the related art SRAM, a static noise margin (SNM: Static Noise Margin) has heretofore been used as an index for measuring a stability of data storage during access operation.

That is, a butterfly curve is drawn as shown in FIG. 2 when two DC (direct current) characteristics are overlapped each other with an SRAM formed of two separate inverters by which DC characteristics of the respective inverters are obtained to allow a DC characteristic output of one of the inverters to be a DC characteristic input of the other of the inverters. The SNM is defined as one side of a maximal square inscribed in the butterfly curve.

This SNM has been subjected to future prospects in Literature 1 (A. J. Bhavnagarwala "The impact of intrinsic device fluctuations on CMOS SRAM cell stability," IEEE Journal of Solid State Circuit, Vol. 36, No. 4, April 2001 (FIG. 5, FIG. 10)). That is, a channel length of a used transistor is refined as shown in FIG. 3 and if the channel length of the transistor shifts from 250 nm to 50 nm, not only the SNM has a decreased average value but also a deviation in the SNM increases. Accordingly, remarkable deterioration occurs in a worst value of the SNM. With the channel length of a value of 50 nm as shown, the worst value of the SNM becomes a value less than "0" and, hence, stored data has a risk of being corrupted when read operation is executed and a word line signal goes to a high voltage potential.

In the meanwhile, Literature 2 (H. Sakakibara, "A 750 MHZ 144 Mb cache DRAM LSI with speed scalable design and programmable at-speed function-array BIST," IEEE International Solid State Circuit Conference, 2003 (FIG. 1)) has proposed an SRAM with a read-only port. This SRAM has a memory cell comprised of eight transistors wherein a bit line takes a full swing only with a cell current of a memory cell. An original object of this system is to obtain an operating speed improvement effect in case of advancing a generation. Furthermore, since no flow of electric charge occurs from the bit line to a data storage node inside a cell during the read operation, no probability occurs for stored data to be corrupted due to read operation in an issue encountered by the related art SRAM in a future. Consequently, the SRAM resulting from such a circuit configuration can perform not only a high-speed operation in an advanced generation but also stable operation.

As disclosed in Literature 1 stated above, with the related art SRAM using six transistors, deterioration occurs in the worst value of the SNM, causing a difficulty to occur in stable data storage as a future possibility. In this respect, reference is now made to FIGS. 5 and 6 in combination to describe a mechanism why corruption of stored data occurs during the read operation that would occur when the SNM has insufficient value.

With a conventional cell, as a word line signal WL is selected as shown in FIG. 6(A), a low voltage potential "0" of a data storage node merely increases from a ground potential to a slight extent as shown in FIG. 6(B) in case of a storage node of the conventional cell. However, fluctuation occurs in a threshold voltage of an NMOS (N-channel MOS) transistor forming an inverter adapted to be applied with that voltage potential and if a remarkable drop occurs in the threshold voltage, the NMOS transistor tends to be turned on and, hence, an output of the inverter drops from a high voltage potential "1". This causes a voltage potential of the data storage node to be inverted as shown in FIG. 6(C), causing corruption of data to occur.

In the meanwhile, while no corruption of stored data caused by read operation takes place in the SRAM cell with the read-only port disclosed in Literature 2, an issue arises in a consequence of the eight transistors with the resultant need for five control signals as a whole causing an increase in a memory cell dimension.

The present invention has an issue to be addressed wherein even if ultra-high speed operation or ultra-low voltage operation are needed, a need arises to provide the eight transistors with a large number of control signals in order for structuring a memory cell operative to prevent corruption of stored data resulting from read operation and, therefore, a difficulty is encountered in reducing a memory cell dimension.

DISCLOSURE OF INVENTION

The present invention has been completed with a view to addressing the above issues and has an object to provide a static random access memory (SRAM) that even when needed to operate at a ultra-speed with ultra-low voltage, can be realized in a reduced memory cell dimension using a memory cell composed of a minimum number of transistors for preventing corruption of stored data caused during the read operation.

According to the present invention, the memory cell of the static random access memory (SRAM) comprises first and second inverter circuits connected in loop to form a storage circuit and a storage control circuit serially connected to a drive transistor of the second inverter circuit to be operative to allow the first and second inverter circuits connected in loop to form the storage circuit for statically storing data when the memory cell is inactivated whereas when the memory cell is activated, a loop connection of the first and second inverter circuits is disconnected to dynamically store data. Dynamically storing data during the activation of the memory cell enables the prevention of corruption of data caused by read operation.

Further, causing a second access transistor connected to an output of the second inverter circuit to reset the output of the second inverter circuit to a low voltage potential during write operation allows the writ operation to be easily performed whereby the memory cell can be constructed of a less number of transistors with reduced number of control signals.

Furthermore, data transfer between a memory cell and a sense amplifier is efficiently performed using a sense amplifier applied with cell data from the memory cell through a single bit line. The memory cells are placed in layout in an L-shaped region and inverted in mirror such that a cell array configuration has a vacant space in such a region. Separately placing sense amplifiers in the vacant space enables a cellblock to be formed in a small surface area in an efficient manner.

BRIEF DESCRIPTION OF THE DRAWINGS

FIGS. 9(A) and (B) are view showing one example of a timing chart of writing "0" and writing "1" in FIG. 7.

FIG. 10 is a view showing a circuit structure of a memory cell of an SRAM of a second embodiment.

BEST MODE FOR CARRYING OUT THE INVENTION

Reference is made to the accompanying drawings to provide a detailed description of a circuit structure of a memory cell and a related layout, a circuit structure of a sense amplifier and a related layout, a circuit structure of a sub decoder and a layout of a cellblock for realizing a semiconductor memory device according to the present invention operative at an ultra-high speed with ultra-low voltage.

First Embodiment

Figure 1:
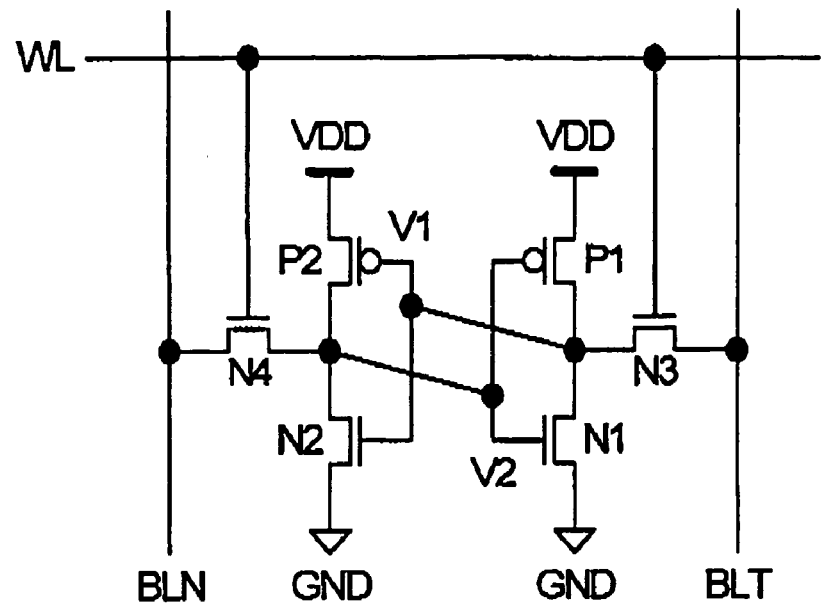
FIG. 1 is a view showing one example of a circuit structure of an SRAM of the related art (Literature 1).
Figure 2:
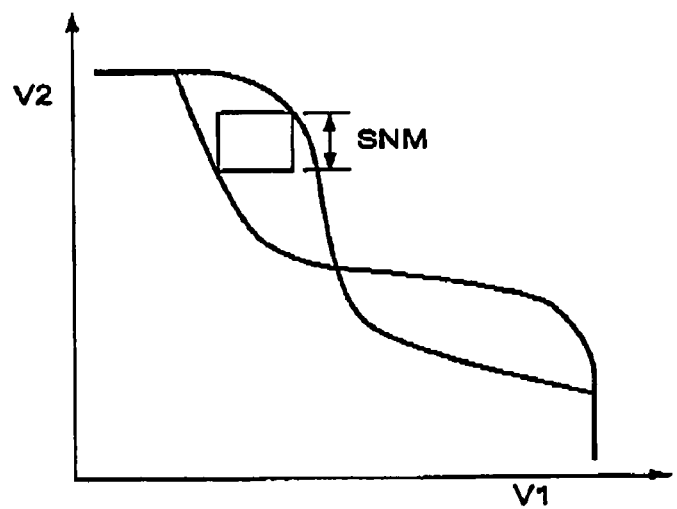
FIG. 2 is an illustrative view of an SNM representing a stable operation in the SRAM of the related art.
Figure 3:
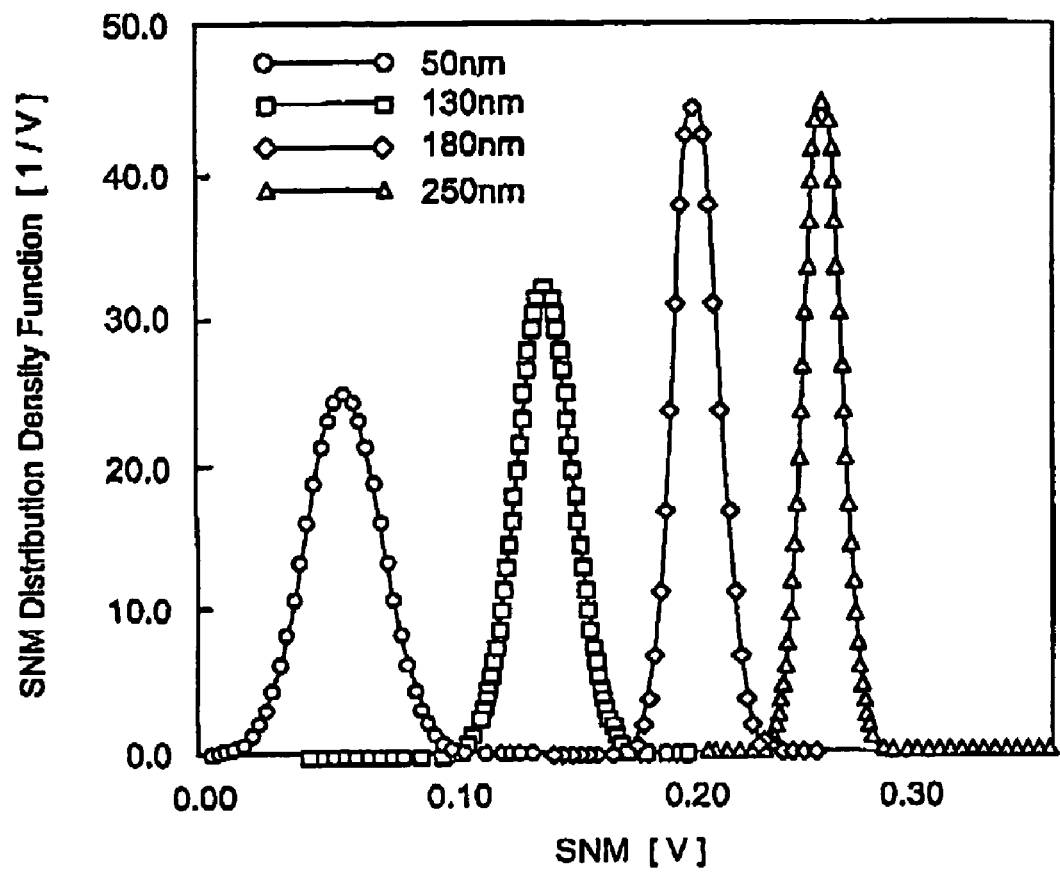
FIG. 3 is an illustrative view of the SNM in terms of a channel length of a transistor in the SRAM of the related art.
Figure 4:
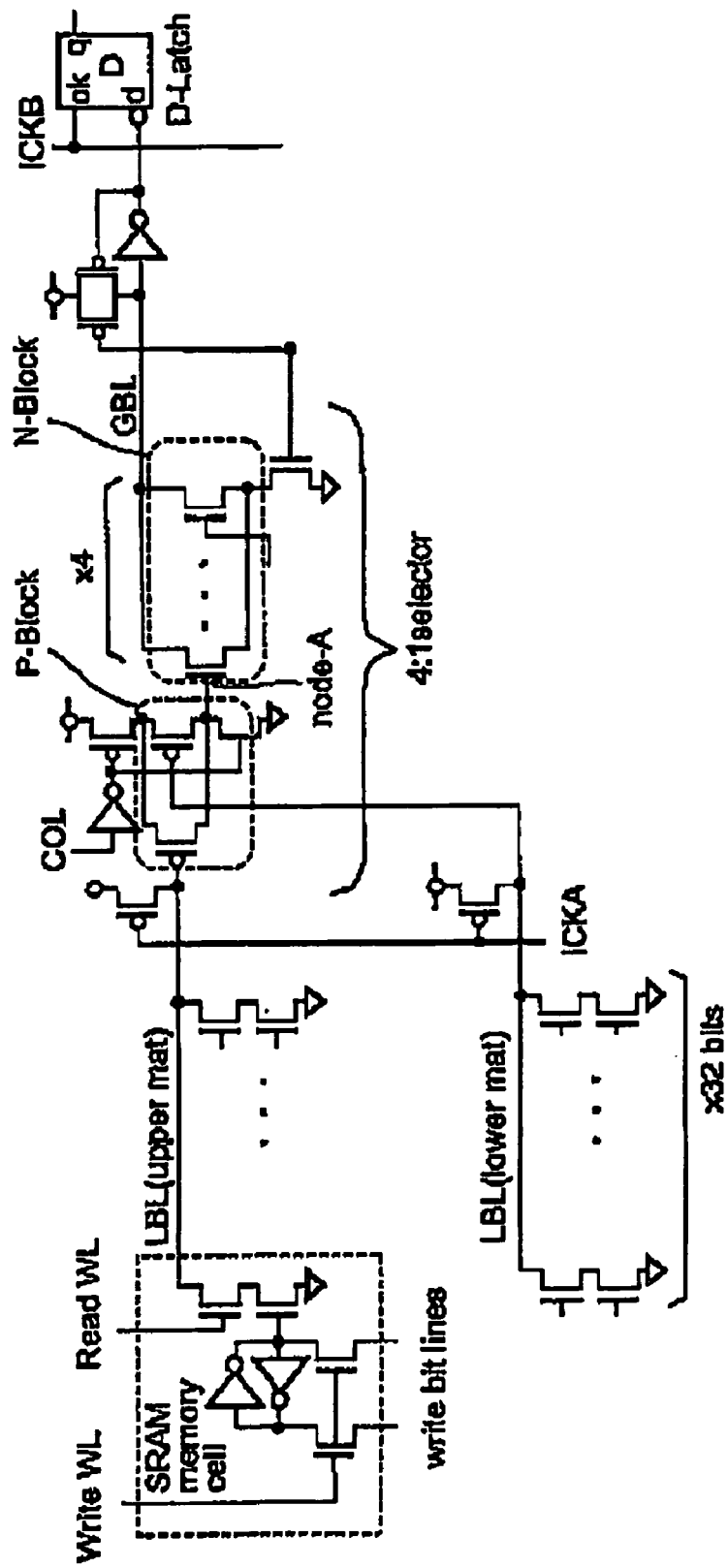
FIG. 4 is a view showing one example of a circuit structure of an SRAM of the related art (Literature 2).
Figure 5:
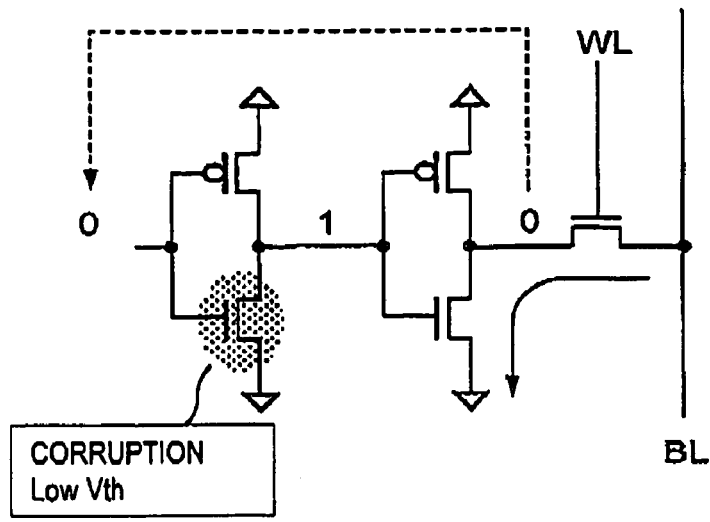
FIG. 5 is a circuitry illustrative view showing one example of a mechanism on data corruption caused by read operation of the SRAM of the related art.
Figure 6:
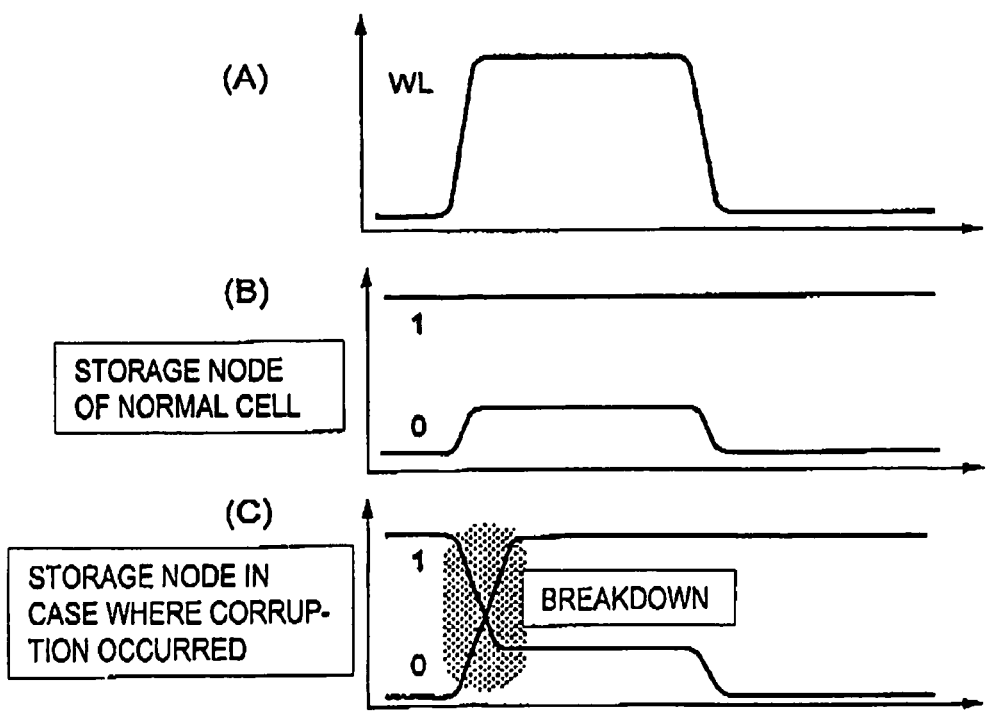
FIGS. 6(A), (B) and (C) are illustrative views showing the mechanism on data corruption caused by read operation of the SRAM of the related art, with (A) showing read operation, (B) showing usual example of a data storage node and (C) showing a fluctuation existence example.
Figure 7:
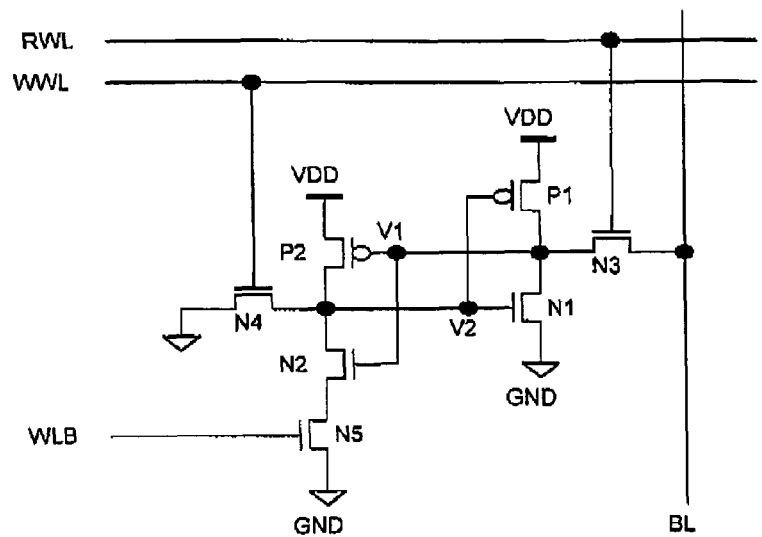
FIG. 7 is a view showing a circuit structure of a memory cell of an SRAM of a first embodiment.
Figure 8:
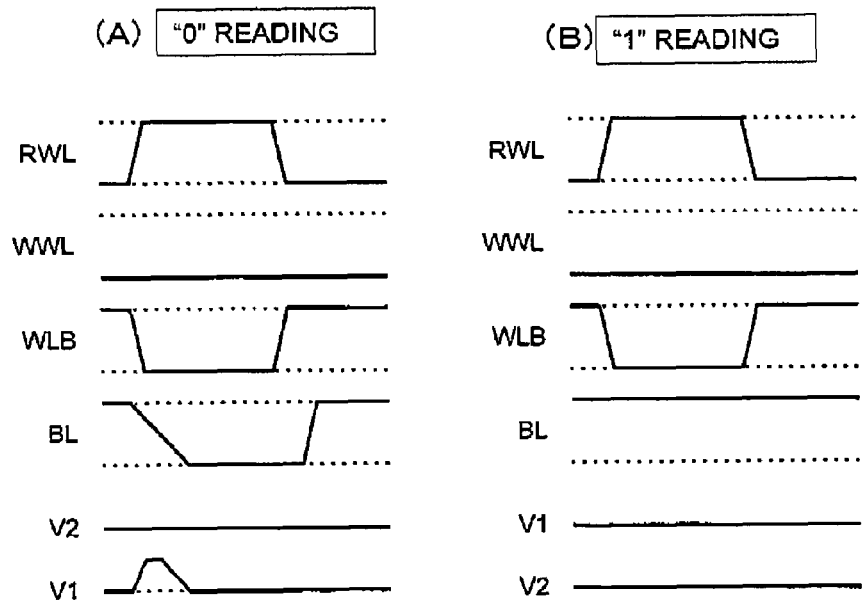
FIGS. 8(A) and (B) are view showing one example of a timing chart of reading "0" and reading "1" in FIG. 7.
Figures 9, 10:
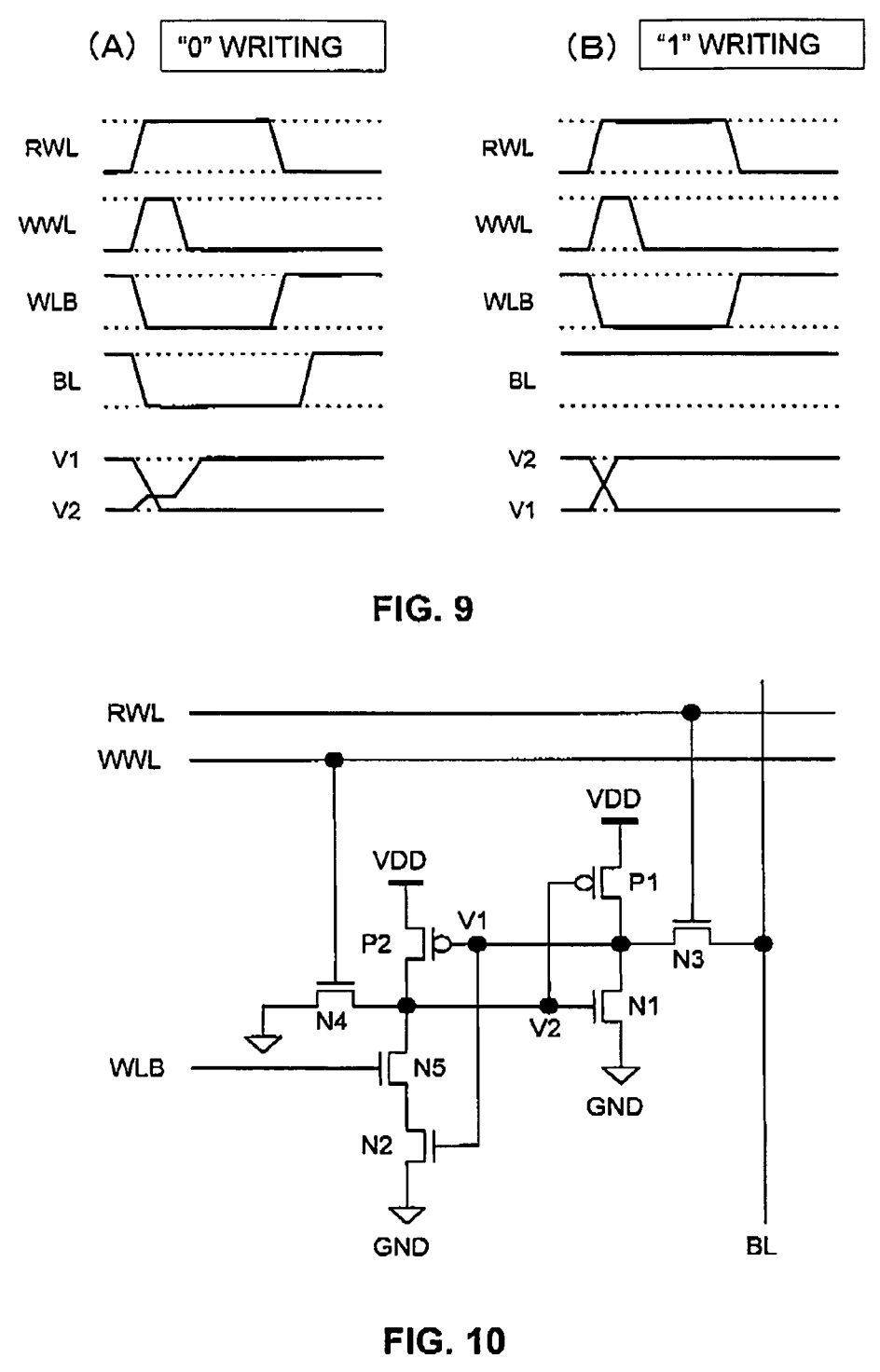

A first embodiment according to the present invention is described with reference to FIGS. 7 to 9. FIG. 7 shows a circuit structure representing an SRAM cell of a static random memory of the first embodiment. FIG. 8 is shown a timing chart for read operation, (A) is shown the reading "0" and (B) is shown the reading "1". FIG. 9 is shown a timing chart for write operation, (A) is shown the writing "0" and (B) is shown writing "1".

The RAM cell, shown in FIG. 7, is comprised of seven transistors including a PMOS transistor P1 and an NMOS transistor N1 by which a first CMOS inverter is formed, a PMOS transistor P2 and an NMOS transistor N2 by which a second CMOS inverter is formed, NMOS transistors N3 and N4 playing a role as access means, and an NMOS transistor N5 playing a role as a storage control means. Here, the PMOS transistors P1, P2 form the inverter circuit to play a role as load transistors and the NMOS transistors N1, N2 play a role as drive transistors.

The first CMOS inverter is comprised of the PMOS transistor P1 and the NMOS transistor N1 and has an input applied with data appearing at a data storage node V2 to output data to a data storage node V1. The second CMOS inverter is comprised of the PMOS transistor P2 and the NMOS transistor N2 and has an input applied with data appearing at the data storage node V1 to output data to the data storage node V2. With the first and second inverter circuits, the respective PMOS transistors P1, P2 have sources connected to a power supply voltage VDD and the NMOS transistors N1, N2 have sources connected to a ground potential GND directly or via the NMOS transistor N5.

The NMOS transistor N3 is connected to a bit line BL to perform data access to the data storage node V1 using a word line signal RWL. The NMOS transistor N4 has a drain, a source and a gate connected to the data storage node V2, the ground potential and a write word line signal WWL, respectively, and resets the output node V2 of the second CMOS inverter to a low voltage potential "0" using the write word line signal WWL during write operation.

The NMOS transistor N5, playing a role as the storage control means, is inserted between the second CMOS inverter and the ground potential and has a source, a drain and a gate connected to the source of the NMOS transistor N2, the ground potential and an inverted word line signal WLB, respectively. When the memory cell is accessed using the word line signal RWL, the inverted word line signal WLB controls not to turn on the NMOS transistor N2.

Under a status where no memory cell is accessed, the NMOS transistor N5 is turned on to allow the first and second CMOS inverters to be brought into loop connection to form a storage circuit in a static storage condition. With a status when the memory cell is accessed, while the NMOS transistor N5 is turned off thereby disconnecting the second CMOS inverter from the ground potential and the loop connection of the first and second CMOS inverters is interrupted not to form the storage circuit, the second CMOS inverter can be kept in a status prior to disconnection during a short period of time in which the memory cell is accessed. Such a storage condition is referred to as a dynamic storage. The storage control means switches a data storage status over to a static storage status or dynamic storage status.

Referring next to timing charts of read operation in FIG. 8, the read operation is described. FIG. 8(A) represents the reading "0" and FIG. 8(B) represents the reading "1". Hereunder, data "0" or "1" of the memory cell are described below as data states at the data storage node V1.

As shown in FIG. 8, during the read operation, the word line signal RWL is set to a high voltage potential "1" and the inverted word line signal WLB is set to a low voltage potential "0". The write word line WWL is set to a low voltage potential "0".

In a case where the data storage node V1 shown in FIG. 8(A) takes a low voltage potential "0" (while the data storage node V2 takes the high voltage potential "1"), the word line inverted signal WLB is controlled to the low voltage potential "0" and the NMOS transistor N5 is turned off to allow the data storage node V2 to dynamically store the high voltage potential "1". Accordingly, with the NMOS transistor N1 remained under a turn-on state, the high voltage potential "1" of the bit line BL is discharged to the low voltage potential "0", thereby causing the bit line to read the low voltage potential "0" at the data storage node V1. When this takes place, even if the data storage node V1 temporarily raises from the low voltage potential "0", the data storage node V2 of the second CMOS inverter is operative to continuously keep the high voltage potential "1" whereby the bit line BL has a potential discharged to a low voltage potential "0". Accordingly, the read operation can be performed with no corruption of stored data.

In the meanwhile, under a situation where the data storage node V1, shown in FIG. 8B, lies at the high voltage potential "1" (while the data storage node V2 lies at the low voltage potential "0"), the storage control transistor is turned off but the data storage node V2 dynamically stores the low voltage potential "0". The NMOS transistor N1 remains under a turn-off state and both the data storage node V1 and the bit line BL remain at the high voltage potential "1", with the high voltage potential "1" at the data storage node V1 being read on the bit line without causing the discharge operation at the bit line BL. Consequently, no variation takes place in the potential of the bit line BL and both the potentials of the data storage node V1 and the data storage node V2.

Next, reference is made to timing charts of FIG. 9 and description is made of the write operation to be executed in the SRAM cell. FIG. 9(A) shows the writing "0" and FIG. 9(B) shows the writing "1".

As shown in FIG. 9, during write operation, the read operation mentioned above is controlled and, in addition thereto, the write word line WWL is controlled. The word line signal RWL is set to the high voltage potential "1" and the inverted signal WLB is set to the low voltage potential "0" while the data storage node V2 is disconnected from the ground potential by the storage control transistor N5. Setting the write word line WWL to the high voltage potential "1" only for a time period shorter than that of the word line signal RWL allows the output V2 of the second CMOS inverter to be reset to the low voltage potential "0". The bit line BL is set to the writing voltage potential "0" or "1".

When a low voltage potential "0" is intended to be stored at the data storage node V1 shown in FIG. 9(A), setting the bit line BL to the low voltage potential "0" allows the data storage node V1 to be set to the low voltage potential "0", causing the low voltage potential "0" to be written to the data storage node V1. However, during a period in which the write word line signal WWL lies at the high voltage potential "1", the data storage node V2 lies at an intermediate level in response to a current path between the transistors P2 and N4 and the transistor P1 is slightly turned on and no complete low voltage potential "0" is written to the data storage node V1. Accordingly, the write word line signal WWL needs to control so as to allow a period with the high voltage potential "1" to be shorter than the word signal WL such that the data storage node V2 rapidly takes the high voltage potential "1".

Further, When a high voltage potential "1" is intended to be stored at the data storage node V1 shown in FIG. 9(B), the bit line BL is caused to remain at the high voltage potential "1" and the data storage node V1 and the word write line WWL lies at the high voltage potential "1" while the data storage node V2 is reset to the low voltage potential "0" causing the PMOS transistor P1, whose gate is applied with such an input, to be turned on and the NMOS transistor N1 to be turned off. Thus, the data storage node V1 takes the high voltage potential "1" and a high voltage potential "1" is written to the data storage node V1.

With the SRAM of the present embodiment, the memory cell is comprised of a less number of elements including seven transistors and four signal lines. The storage control means switches a storage condition between a static storage and a dynamic storage in which using the transistor N4 to reset the second data storage node V2 to the low voltage potential During write operation enables the prevention of corruption of stored data during the read operation and the realization of a memory cell, operative at an ultra high speed and ultra low voltage, with a small number of component elements and signal lines.

Second Embodiment

A second embodiment according to the present invention will be described with reference to FIG. 10. FIG. 10 is a view showing a circuit structure of a memory cell of an SRAM of the second embodiment according to the present invention. The second embodiment corresponds to a case wherein a connected position of the storage control transistor N5 in the memory cell of the SRAM of the first embodiment is altered and has the same structure as that of the first embodiment in other circuit structures. While with the first embodiment, the storage control transistor N5 is inserted to the source side of the drive transistor N2, the second embodiment allows the storage control transistor N5 to be inserted to the drain side of the drive transistor N2.

The SRAM cell of the second embodiment, shown in FIG. 10, is comprised of seven transistors including a PMOS transistor P1 and an NMOS transistor N1 by which a first CMOS inverter is formed, a PMOS transistor P2 and an NMOS transistor N2 by which a second CMOS inverter is formed, an access transistor NMOS transistors N3 and N4, and a storage control transistor N5.

The NMOS transistor N5, playing a role as a storage control means, is inserted between the PMOS transistor P2 and the NMOS transistor N2 of the second CMOS inverter and has a drain, a source and a gate connected to a data storage node V2, a drain of the NMOS transistor N2 and an inverted word line signal WLB, respectively, performing control not to turn on the NMOS transistor N2 when accessed using the word line signal WLB.

Since the second embodiment corresponds to the case wherein the connected position of the transistor N5 in the memory cell of the SRAM of the first embodiment as set forth above and has the same structure as that of the first embodiment in other circuit structures while entirely having the same function and operation as those of the first embodiment discussed above with reference to FIGS. 8 and 9, description of the same is herein omitted.

With the SRAM of the second embodiment, the memory cell is comprised of a less number of elements including seven transistors and four signal lines. The storage control means switches a storage condition between a static storage and a dynamic storage in which using the transistor N4 to reset the second data storage node V2 to the low voltage potential During write operation enables the prevention of corruption of stored data during the read operation and the realization of a memory cell, operative at an ultra high speed and ultra low voltage, with a small number of component elements and signal lines.

Third Embodiment

Figure 11:
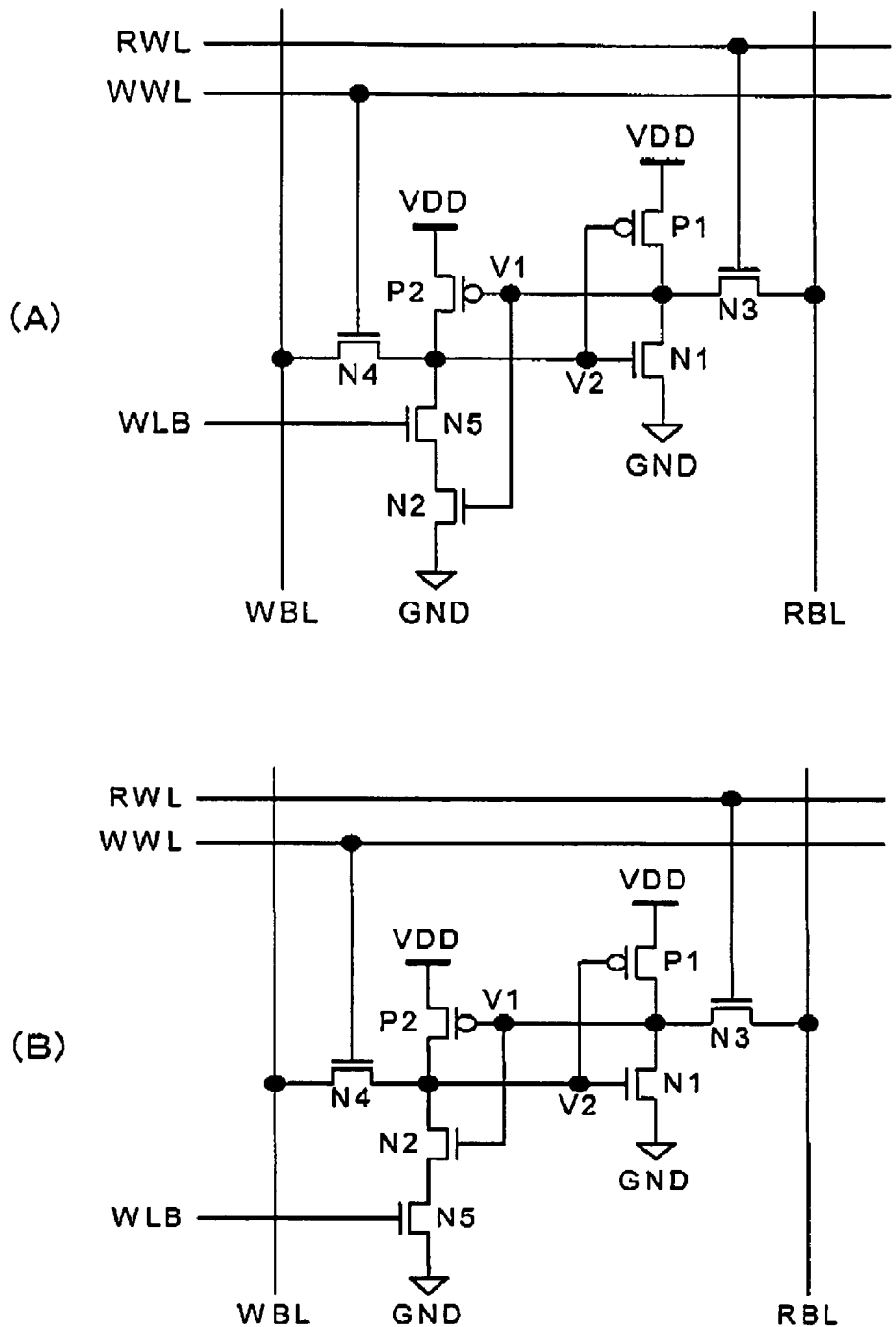
FIGS. 11(A) and (B) are views showing a circuit structure of a memory cell of an SRAM of a third embodiment.
Figure 12:
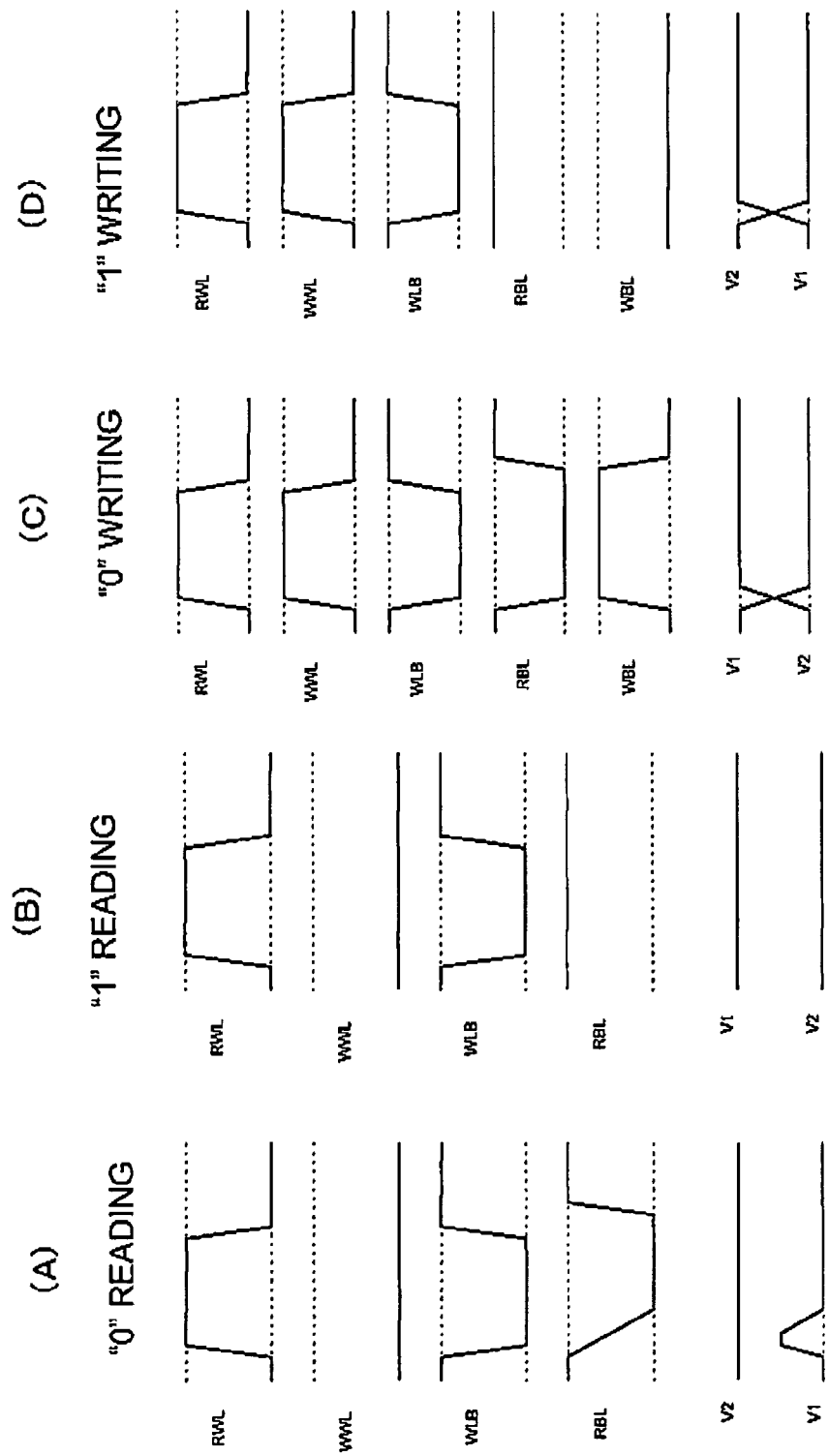
FIGS. 12(A) to (D) are views showing one example of a timing chart of the third embodiment.
Figure 13:
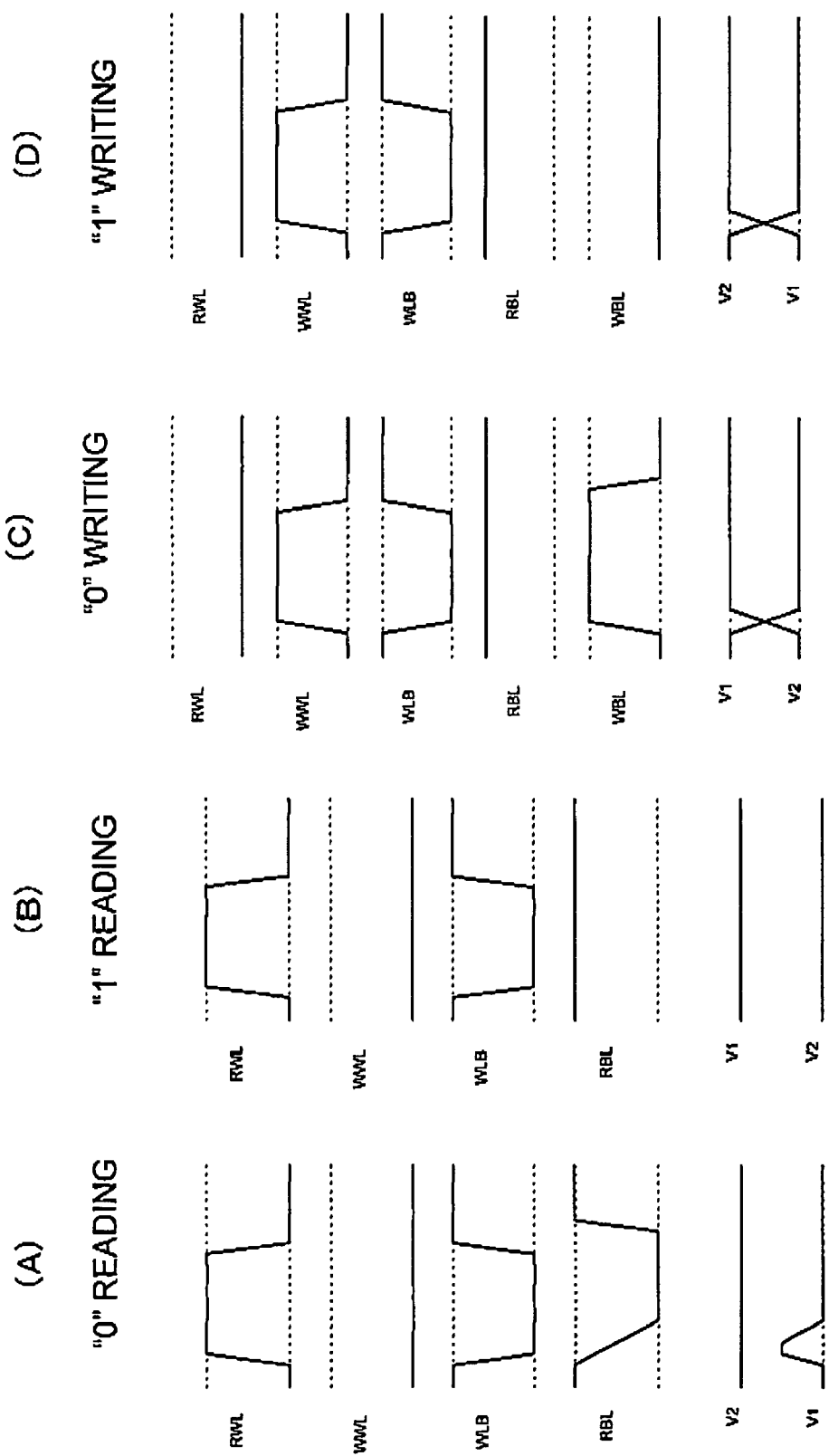
FIGS. 13(A) to (D) are views showing another example of a timing chart of the third embodiment.

A third embodiment according to the present invention is described with reference to FIGS. 11 to 13. FIG. 11 is a view showing a circuit structure of a memory cell of an SRAM of the third embodiment. FIG. 12 is a time chart showing first operation timings and FIG. 13 is a time chart showing second operation timings.

The SRAM cell, shown in FIG. 11(A), is comprised of seven transistors including a PMOS transistor P1 and an NMOS transistor N1 by which a first CMOS inverter is formed, a PMOS transistor P2 and an NMOS transistor N2 by which a second CMOS inverter is formed, NMOS transistors N3 and N4 playing a role as an access means, and an NMOS transistor N5 playing a role as a storage control means.

The first CMOS inverter is comprised of the PMOS transistor P1 and the NMOS transistor N1 and applied with data appearing at the data storage node V2 as an input, thereby outputting data at a data storage node V1. The second CMOS inverter is comprised of the PMOS transistor P2 and the NMOS transistor N2 and applied with data at the data storage node V1 as an input, thereby outputting data at the data storage node V2.

An NMOS transistor N3 is connected to a read bit line RBL for executing data access to the data storage node V1 using the word line signal RWL. An NMOS transistor N4 is connected to a write bit line WBL for executing data access to the data storage node V2 using a write word line signal WWL.

An NMOS transistor N5, plying a role as a storage control means, is inserted between the PMOS transistor P2 and the NMOS transistor N2 to be applied with data at the data storage node V1 as an input, thereby outputting data at the data storage node V2 and has a drain, a source and a gate connected to the drain of the PMOS transistor P2, the drain of the NMOS transistor N2 and an inverted word line signal WLB, thereby performing control not to turn on the NMOS transistor N2 when the memory cell is accessed. That is, under a situation where the memory cell is accessed, data storage states of the first and second CMOS inverters are switched from a static storage mode to a dynamic storage mode, making it possible to prevent the corruption of cell data during the read operation of data from the memory cell and achieve high speed operation while enabling high speed operation when writing data to the memory cell.

The operations are described with reference to time charts shown in FIGS. 12, 13. FIG. 12 is a time chart showing the first operation timings and FIG. 13 is a time chart showing the second operation timings. FIG. 12 shows the time chart by which the operation is performed by the access transistor N3 during the read operation and the operation is performed by the two transistors N3, N4 During write operation and FIG. 13 shows the time chart by which the operation is performed by the access transistor N3 during the read operation and the operation is performed by the access transistor N4 during write operation.

FIG. 12 shows time charts for (A) reading "0", (B) reading "1", (C) writing "0" and (D) writing "1", respectively. During reading "0" in FIG. 12(A), the read word line signal RWL takes the high voltage potential "1" to activate the access transistor N3 and the write word line signal WWL remains intact at the low voltage potential "0" with no activation of the access transistor N4. With the read word line signal RWL taking the high voltage potential "1", the inverted word line signal WLB takes the low voltage potential "0" to turn off the storage control transistor N5.

The inverted word line signal WLB takes the low voltage potential "0" to turn off the storage control transistor N5 and the data storage node V2 stores the high voltage potential "1" while the transistor N1 remains in a turn-on state and the read bit line RBL shifts from a precharged level to the low voltage potential "0", thereby permitting the low voltage potential "0" at the data storage node V1 to be read at the bit line thereby performing the reading "0" from the memory cell. Here, causing the storage control transistor N5 to be turned off prevents a drop in the high voltage potential "1" at the data storage node V2 due to leakage current from the transistor N2, resulting in an advantageous effect of preventing data corruption during the read operation.

During the reading "1" in FIG. 12(B), the read word line signal RWL takes the high voltage potential "1" to activate the access transistor N3 and the write word line signal WWL remains intact at the low voltage potential "0" with no activation of the access transistor N4. With the read word line signal RWL taking the high voltage potential "1", the inverted word line signal WLB takes the low voltage potential "0" to turn off the storage control transistor N5.

While the inverted word line signal WLB takes the low voltage potential "0" to turn off the storage control transistor N5, the data storage node V2 stores the low voltage potential "0" during a short time interval in a reading period and the read bit line RBL allows the high voltage potential "1" at the data storage node V1 to be read at the bit line while keeping the precharged level at the high voltage potential thereby performing the reading "1" from the memory cell.

Although during a period in which the reading is executed, the storage control transistor N5 is turned off to disconnect a route path by which the data storage node V2 stores the low voltage potential "0", no issue arises in operation because the low voltage potential "0" is dynamically stored during a short reading time period and after the reading time period has been elapsed, the transistor N5 is turned on to continuously store data in the data storage node in a static manner.

During writing "0" in FIG. 12(C), the read word line signal RWL and the write word line signal WWL take the high voltage potential "1", thereby activating the access transistors N3 and N4. With the read word line signal RWL and the write word line signal WWL taking the high voltage potential "1", the inverted word line signal WLB takes the low voltage potential "0" and the storage transistor N5 is turned off whereby the read bit line RBL is applied with the low voltage potential "0" serving as write data and the write bit line WBL is applied with the high voltage potential "1" as inverted data.

With the inverted word line signal WLB taking the low voltage potential "0" to turn off the storage transistor N5, the high voltage potential "1" at the write bit line WBL is instantaneously written to the data storage node V2 and, in addition, the transistor N1 is turned on while the transistor P1 is turned off, whereby the low voltage potential "0" at the write bit line RBL is instantaneously written to the data storage node V1 and the writing "0" is performed in the memory cell.

During writing "1" in FIG. 12(D), the read word line signal RWL and the write word line signal WWL take the high voltage potential "1", thereby activating the access transistors N3 and N4. With the read word line signal RWL and the write word line signal WWL taking the high voltage potential "1", the inverted word line signal WLB takes the low voltage potential "0" to turn off the storage transistor N5 whereby the read bit line RBL is applied with the high voltage potential "1" as write data and the write bit line WBL is applied with the low voltage potential "0" as inverted data.

Writing the low voltage potential "0" of the write bit line WBL to the data storage node V2 and writing the high voltage potential "1" of the read bit line RBL to the data storage node V1 to turn off the transistor N1 and turn on and the transistor P1 enables the writing "1" to be executed in the memory cell.

Next, description is made of (A) the reading "0", (B) the reading "1", (C) the writing "0" and (D) the writing "1" shown in FIG. 13. FIG. 13 shows operation modes in which the reading is executed using the access transistor N3 and the writing is executed by the access transistor N4.

The time charts in (A) the reading "0" and (B) the writing "1" shown in FIG. 13 are identical to those of (A) the reading "0" and (B) the reading "1" in FIG. 12 to execute the operation in the same way and description of the same is herein omitted.

During writing "0" in FIG. 13(C), the write word line signal WWL takes the high voltage potential "1" to activate the access transistor N4 and the read word line signal RWL remains intact at the low voltage potential "0" with no activation of the access transistor N3. With the write word line signal WWL taking the high voltage potential "1", the inverted word line signal WLB takes the low voltage potential "0" to turn off the storage control transistor N5, whereby the write bit line WBL is applied with the high voltage potential "1" that is the inversion of write data. The read bit line RBL remains intact at the precharged level.

With the inverted word line signal WLB taking the low voltage potential "0" to turn off the storage control transistor N5, the high voltage potential "1" of the write bit line WBL is instantaneously written to the data storage node V2, whereas turning on the transistor N1 on and turning off the transistor P1 allows the low voltage potential "0" to be written to the data storage node V1, thereby performing the writing "0" in the memory cell.

During writing "1" in FIG. 13(D), the write word line signal WWL takes the high voltage potential "1" to activate the access transistor N4 and the read word line signal RWL remains intact at the low voltage potential "0" with no activation of the access transistor N3. With the write word line signal WWL taking the high voltage potential "1", the inverted word line signal WLB takes the low voltage potential "0" to turn off the storage control transistor N5 and the low voltage potential "0" representing the inversion of write data is applied to the write bit line WBL. The read bit line RBL remains intact at the precharged level.

With the inverted word line signal WLB taking the low voltage potential "0" to turn off the storage control transistor N5, the low voltage potential "0" of the write bit line WBL is written to the data storage node V2 and with the transistor N1 being turned off while the transistor P1 is turned on, the high voltage potential "1" is written to the data storage node V1 and the writing "1" is performed in the memory cell.

Further, FIG. 11(B) shows a second structure of the memory cell. In FIG. 11(B), the NMOS transistor N5 plays a role as a storage control means and is inserted between a second CMOS inverter and a ground potential with a drain connected a source of the transistor N2, a source connected to the ground potential and a gate connected to the inverted word line signal WLB. The storage control transistor N5 is inserted and connected to the drain of the drive transistor N2 of the second CMOS inverter in FIG. 11(A) and inserted and connected to the source in FIG. 11(B).

With the structure of the memory cell in FIG. 11(B), the connecting position of the NMOS transistor N5 playing a role as the storage control means is merely modified and the operation is performed in the same time charts as those of (A) the reading "0", (B) the reading "1", (C) the writing "0" and (D) the writing "1" in FIGS. 12 and 13 and description of the same is herein omitted.

An SRAM of the present embodiment is comprised of seven transistors including first and second inverter circuits, access transistors playing a role as two access means, and the storage control transistor playing a role as a storage control means. Inputting inverted data from the write bit line allows the write word line signal to have the same pulse width as that of the read word line signal with a merit in simply controlling a pulse width. Controllably switching the data storage control means for a data storage state in static storage or dynamic storage while executing the reading of data from the memory cell using one of the access means and executing data writing using the other one of the access means enables the realization of an SRAM that can prevent the corruption of stored data during the read operation and operate at an ultra high speed and ultra low voltage.

Fourth Embodiment

Figure 14:
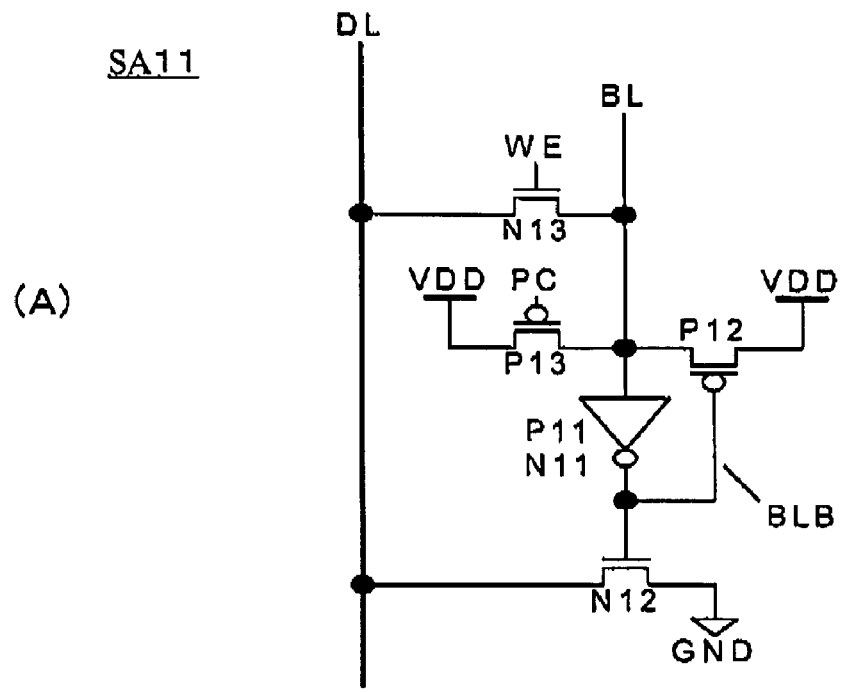
FIGS. 14(A) and (B) show circuit structures of sense amplifiers SA11, SA12 of a fourth embodiment.
Figure 14:
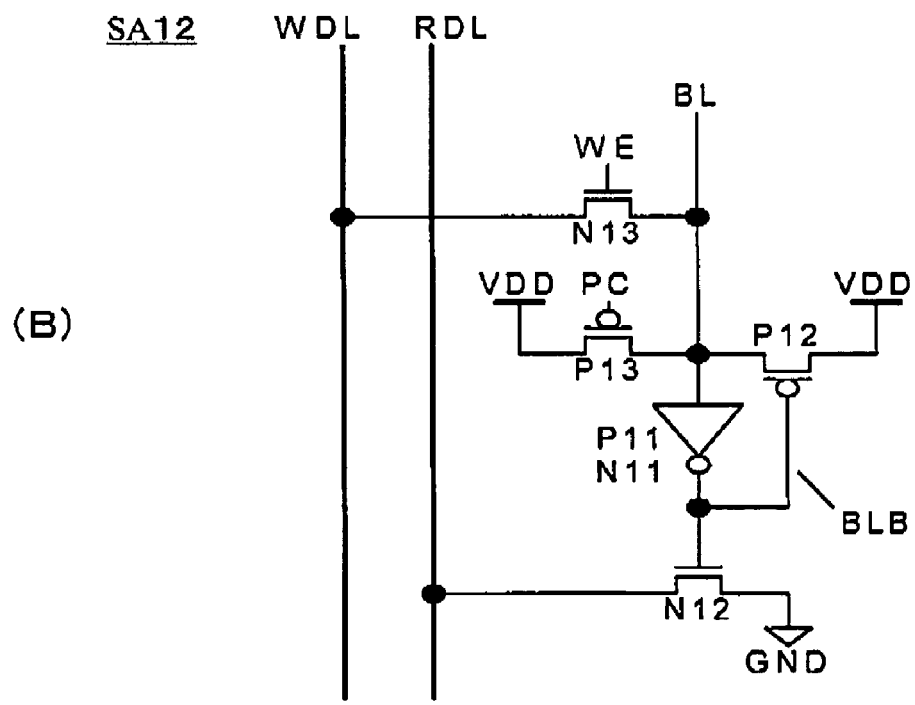
Figure 15:
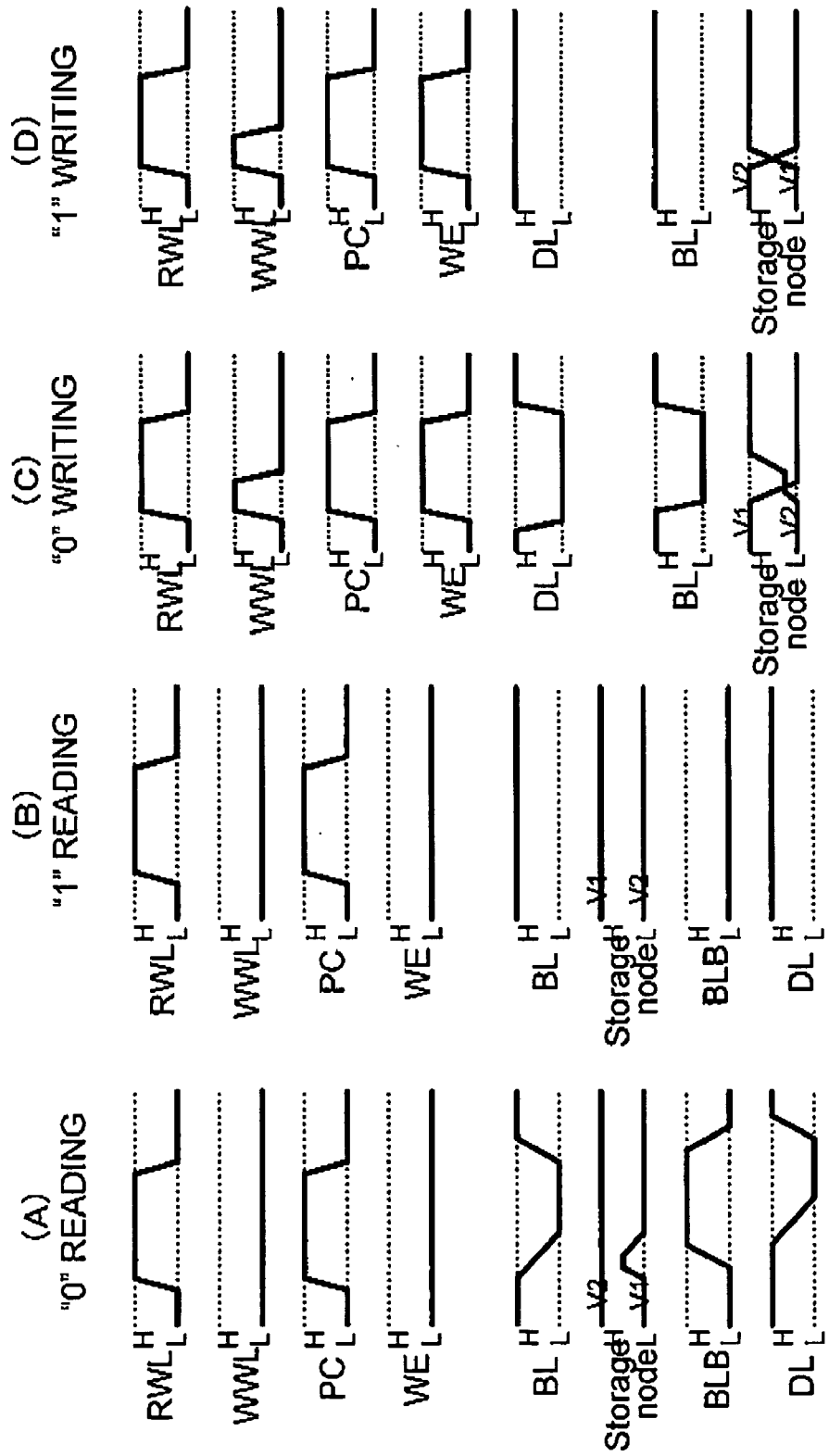
FIG. 15 is an operation-timing chart for the sense amplifier SA11 of the fourth embodiment.

A fourth embodiment according to the present invention represents an embodiment related to a sense amplifier adapted to exchange data to and from the memory cell. This embodiment represents the sense amplifier to exchange data to and from the memory cell using a single bit line. FIG. 14(A) shows a circuit structure of a sense amplifier SA11 adapted to achieve data transfer to and from an input and output circuit using a single data line DL and FIG. 14(B) shows a circuit structure of a sense amplifier SA12 adapted to achieve data transfer to and from the input and output circuit using two lines of a read data line RDL and a write data line WDL, and FIG. 15 shows time charts showing one mode of operations of the sense amplifier SA11.

A circuit structure of the sense amplifier SA11 shown in FIG. 14(A) is described. An inverter circuit is input with data from a bit line BL connected to a memory cell and is comprised of a PMOS transistor P11 and an NMOS transistor N11. An output BLB from the inverter is input to gates of a PMOS transistor P12 and an NMOS transistor N12. The PMOS transistor P12 has a source connected to a power supply voltage VDD and a drain connected to the bit line BL and plays a role as a bit line high level-maintaining transistor that maintains the bit line at a high level when turned on. The NMOS transistor N12 has a source connected to the ground potential GND and a drain connected to a data line DL and plays a role as a read transistor. The data line plays a role as a signal line for exchanging data to and from the sense amplifier and an input and output circuit or an intermediate circuit and is referred to as a global data line.

Connected between the data line DL and the bit line BL is a write NMOS transistor N13 that is input with a write signal WE and a PMOS transistor P13 for precharging has a gate input with a precharge signal PC, a source connected to a power supply voltage VDD and a drain connected to the bit line BL.

The sense amplifier is basically comprised of the inverter circuit that allows data from the memory cell during the read operation to be input from the bit line for transfer to the data line and a read transistor, and a write transistor that allows data from the data line During write operation to be input to the bit line for performing the writing to the memory cell. The precharge transistor and the level-maintaining transistor take a collateral structure for achieving further stable operation. Here, the level-maintaining transistor P12 can be omitted from the sense amplifiers of all the embodiments.

With the sense amplifier SA12 shown in FIG. 14(B), the data line DL of the sense amplifier shown in FIG. 14(A) is separated into and comprised of a write data line WDL and a read data line RDL. The write data line WDL is connected to the write transistor N13 and the read data line RDL is connected to the read transistor N12. The sense amplifiers SA11 and SA12 differ from each other due to the structure of the input and output circuit for exchanging data to and from the sense amplifier or the structure of the intermediate circuit and basic operations of the sense amplifiers are identical to each other.

FIG. 15 shows time charts representing one mode of operations of the sense amplifier SA11 of the embodiment shown in FIG. 14(A). Although no limitation is intended to the memory cell that can be applied to the sense amplifier SA11, the one mode of operations is described as applied to the memory cell of the first or second embodiment.

(A) In case of reading "0": by changing the precharge signal PC to the high voltage potential "1", the precharge transistor P13 is turned off, completing the precharging to the bit line BL. The read word line signal RWL for the memory cell takes the high voltage potential "1" and the bit line BL reads out memory cell data "0" taking the low voltage potential "0". Upon receipt of data from the bit line BL, the inverter output BLB takes the high voltage potential "1" to turn on the read transistor N12 and the data line DL takes the low voltage potential "0", reading out cell data "0". The read word line signal RWL and the precharge signal PC are returned to the low voltage potential "0" upon which the read operation is terminated. During a reading time period, the write word line signal WWL and the write signal WE remain intact at the low voltage potential "0" with no change.

(B) In case of reading "1": by changing the precharge signal PC to the high voltage potential "1", the precharge transistor P13 is turned off, completing the precharging to the bit line BL. The read word line signal RWL for the memory cell takes the high voltage potential "1" and the bit line BL reads out memory cell data "1" taking the high voltage potential "1". Upon receipt of data from the bit line BL, the inverter output BLB takes the low voltage potential "0" to turn off the read transistor N12 and, hence, the data line DL maintains the high voltage potential "1", thereby reading out cell data "1". The read word line signal RWL and the precharge signal PC are returned to the low voltage potential "0" upon which the read operation is completed. During the reading time period, the write word line signal WWL and the write signal WE remain intact at the low voltage potential "0" with no change.

(C) In case of writing "0": by changing the precharge signal PC to the high voltage potential "1", the precharge transistor P13 is turned off, completing the precharging to the bit line BL. The data line DL takes the low voltage potential "0" and the write signal WE takes the high voltage potential "1" whereby the bit line BL takes the low voltage potential "0" via the write transistor N13. The read word line signal RWL for the memory cell and the write word line signal WWL take the high voltage potential "1", thereby writing data "0" of the bit line BL to the memory cell. With the write word line signal WWL taking the low voltage potential "0", resulting in the complete writing "0". The read word line signal RWL, the precharge signal PC and the write signal WE are returned to the low voltage potential "0" and the data line DL and the bit line BL are returned to the high voltage potential "1", completing the writing "0".

(D) In case of writing "1": by changing the precharge signal PC to the high voltage potential "1", the precharge transistor P13 is turned off, completing the precharging to the bit line BL. The data line DL remains intact at the high voltage potential "1" and the write signal WE takes the high voltage potential "1" whereby the bit line BL also maintains the high voltage potential "1" via the write transistor N13. The read word line signal RWL for the memory cell and the write word line signal WWL take the high voltage potential "1", thereby writing data "1" of the bit line BL to the memory cell. The write word line signal WWL takes the low voltage potential "0", thereby writing a complete potential "1" to the memory cell. The read word line signal RWL, the precharge signal PC and the write signal WE are returned to the low voltage potential "0", completing the writing "1".

With the sense amplifier SA12 shown in FIG. 14(B), the data line DL is divided into the read data line DL and the write data line WDL to perform the same basic operation and related operational description is herein omitted.

The sense amplifier of the present embodiment executes data transfer to and from the memory cell via the single bit line. The sense amplifier is comprised of the inverter circuit that is input with stored data from the memory cell via the bit line, the read transistor for transferring an output of the inverter circuit to the data line, the bit-line high-level-maintaining transistor for maintaining the bit line at the high voltage potential when the inverter circuit output takes the low voltage potential, the write transistor for transferring write data to the bit line, and the precharge transistor precharging the bit line at the high voltage potential when no memory cell is accessed.

Fifth Embodiment

Figure 16:
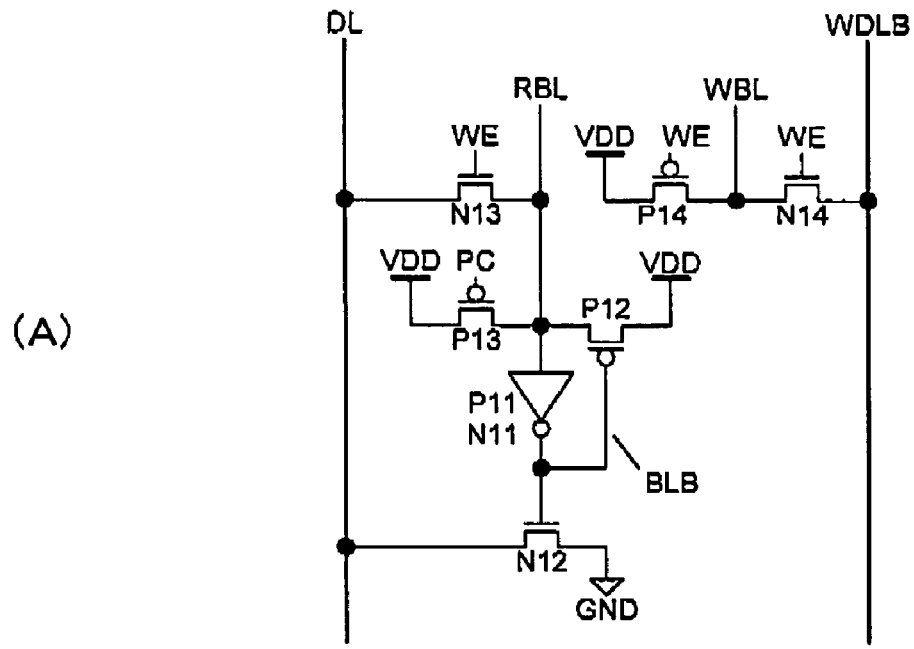
FIGS. 16(A) and (B) show circuit structures of sense amplifiers SA11, SA12 of a fifth embodiment.
Figure 16:
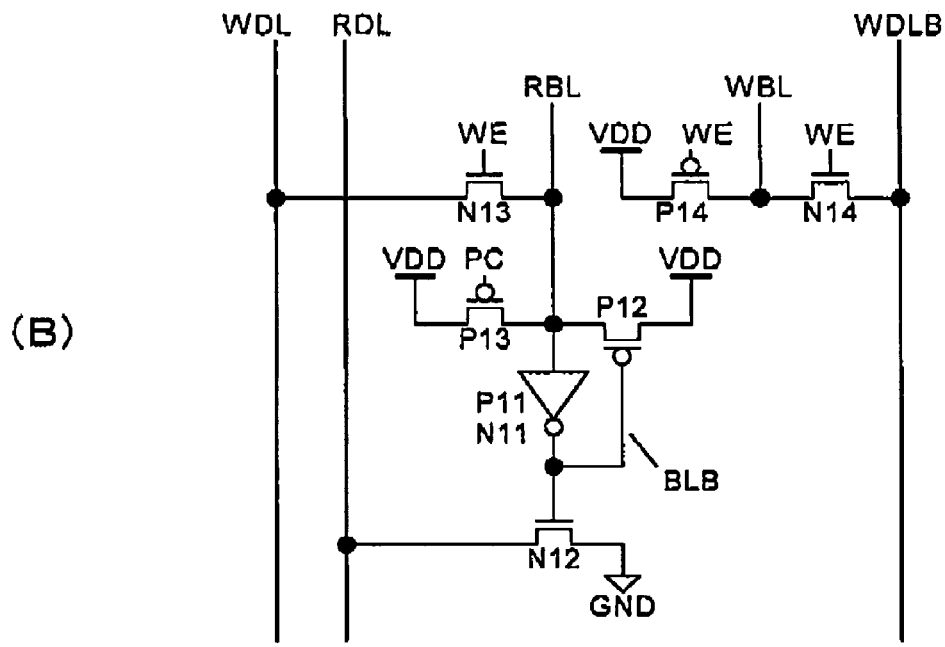
Figure 17:
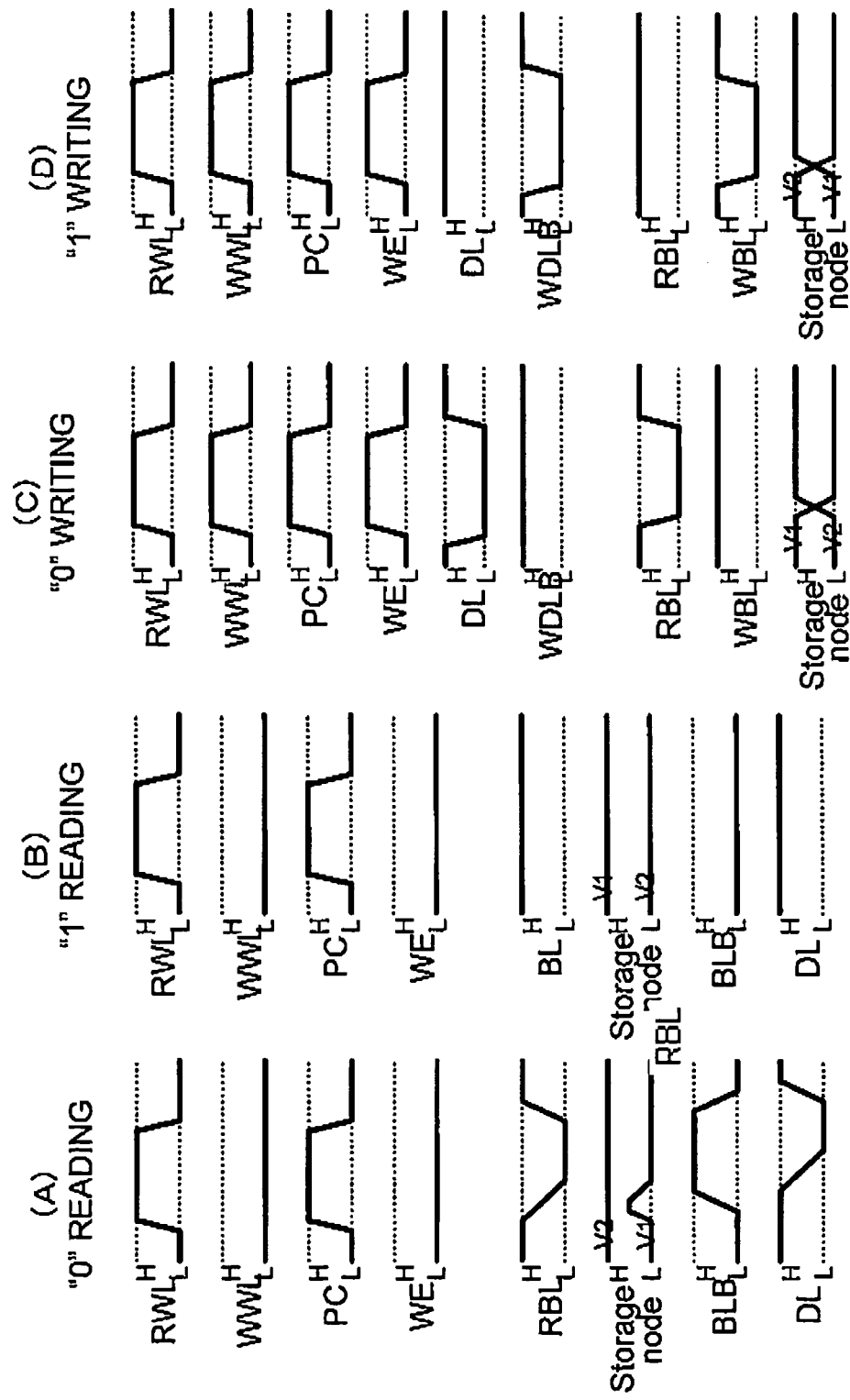
FIGS. 17 (A) to (D) are operation-timing charts for the sense amplifier SA11 of the fifth embodiment.

A fifth embodiment according to the present invention represents an embodiment of a sense amplifier that performs exchange of data to and from a memory cell through a read bit line during data read operation and through the read bit line and a write bit line during data write operation. FIG. 16(A) shows a circuit structure of a sense amplifier SA21 that performs data transfer to and from an input and output circuit using two lines of a data line DL and an inverted write data line WDLB and FIG. 16(B) shows a circuit structure of a sense amplifier SA22 that performs data transfer to and from an input and output circuit using three lines of a read data line RDL, a write data line WDL and an inverted write data line WDLB, with FIG. 17 showing time charts representing one mode of operations of the sense amplifier SA21.

A circuit structure of the sense amplifier SA 21 shown in FIG. 16(A) is described. An inverter circuit is input with data through a read bit line RBL from a memory cell and is comprised of a PMOS transistor P11 and an NMOS transistor N11. An output BLB from the inverter is input to gates of a PMOS transistor P12 and an NMOS transistor N12. The PMOS transistor P12 plays a role as a bit-line high-level-maintaining transistor that has a source connected to a power supply voltage VDD and a drain connected to the read bit line RBL for maintaining the read bit line RBL at a high level when turned on. The NMOS transistor N12 plays a role as a read transistor that has a source connected to the ground potential GND and a drain connected to the data line DL.

Write NMOS transistors N13 and N14 are connected between the data line DL and the read bit line RBL and between the inverted write data line WDLB and the write bit line WBL, respectively, which have gates applied with a write signal WE. Further, the sense amplifier SA21 is comprised of a precharge PMOS transistor P14 having a gate input with the write signal WE, a source connected to a power supply voltage VDD and a drain connected to the write bit line WBL, and a precharge PMOS transistor P13 having a gate input with a precharge signal PC, a source connected to the power supply voltage VDD and a drain connected to the read bit line RBL.

With the sense amplifier SA 22 shown in FIG. 16(B), the data line DL in the sense amplifier SA21 shown in FIG. 16(A) is divided into and comprised of a write data line WDL and a read data line RDL. The write data line WDL and the read data line RDL are connected to the write transistor N13 and the read transistor N12, respectively. The sense amplifiers SA21 and SA22 differ from each other because of the structure of the input and output circuit and the structure of the intermediate circuit and the sense amplifiers execute the same basic operations.

FIG. 17 shows time charts showing one mode of operations of the sense amplifier SA21. Although the memory cell applicable to the sense amplifier SA21 is not limited, the one mode of operation is described as a case as applied to the memory cell of the third embodiment.

With respect to (A) reading "0" and (B) reading "1" in FIG. 17, during a reading time period, the write word line signal WWL and the write signal WE remain intact at the low voltage potential "0" and the inverted write data line WDLB remains unchanged at the high voltage potential "1". Accordingly, the sense amplifier SA21 performs the same operation as the sense amplifier SA 11 upon merely paraphrasing the bit line BL to the read bit line RBL. Detailed description of the same is herein omitted.

(C) In case of writing "0": by changing the precharge signal PC and the write signal WE to the high voltage potential "1", the precharge transistors P13 and P14 are turned off completing the precharging to the read bit line RBL and the write bit line WBL. The data line DL takes the low voltage potential "0" and the inverted write data line WDLB takes the high voltage potential "1" while the write signal WE takes the high voltage potential "1" upon which the read bit line RBL takes the low voltage potential "0" and the write bit line WBL takes the high voltage potential "1" via the transistors N13 and N14, respectively. The read word line signal RWL for the memory cell and the write word line signal WWL take the high voltage potential "1" writing data "0" to the memory cell. The read word line RWL, the write word line signal WWL, the precharge signal PC and the write signal WE are returned to the low voltage potential "0" while the data line DL and the read bit line RBL are returned to the high voltage potential "1" completing the writing "0".

(D) In case of writing "1": by changing the precharge signal PC and the write signal WE to the high voltage potential "1", the precharge transistors P13 and P14 are turned off completing the precharging to the read bit line RBL and the write bit line WBL. The data line DL takes the high voltage potential "1" and the inverted write data line WDLB take the low voltage potential "0" while the write signal WE takes the high voltage potential "1" upon which the read bit line RBL takes the high voltage potential "1" and the write bit line WBL takes the low voltage potential "0" via the transistors N13 and N14, respectively. The read word line signal RWL for the memory cell and the write word line signal WWL take the high voltage potential "1" writing data "1" to the memory cell. The read word line signal RWL, the write word line signal WWL, the precharge signal PC and the write signal WE are returned to the low voltage potential "0" while the inverted write data line WDLB and the write bit line WBL are returned to the high voltage potential "1" completing the writing "1".

The sense amplifier of the present embodiment executes data transfer to and from the memory cell via the single bit line during the read operation and the double lines including the reading line and the writing line during write operation. The sense amplifier is comprised of the inverter circuit input with stored data of the memory cell via the bit line, the read transistor for transferring an output of the inverter circuit to the data line, the bit-line high-level-maintaining transistor for maintaining the bit line at the high voltage potential when the inverter circuit output takes the low voltage potential, the write transistor for transferring write data to the read bit line and the write bit line, and the precharge transistor precharging the read bit line and the write bit line at the high voltage potential, respectively, when these bit lines are ineffective.

Sixth Embodiment

A sixth embodiment according to the present invention represents a sense amplifier that includes a further improvement of the sense amplifier of the fifth embodiment set forth above. This embodiment has a feature in that the precharge transistor for the write bit line is removed from the sense amplifier of the fifth embodiment and a write bit line is connected to an output of an inverter circuit for a read bit line.

Figure 18:
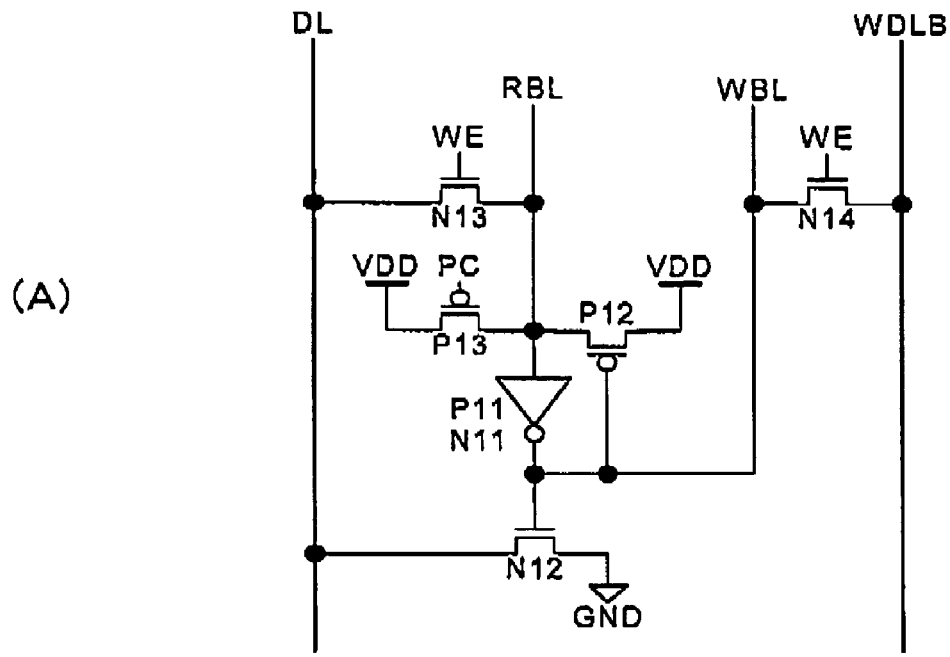
FIGS. 18(A) and (B) show circuit structures of sense amplifiers SA11, SA12 of a sixth embodiment.
Figure 18:
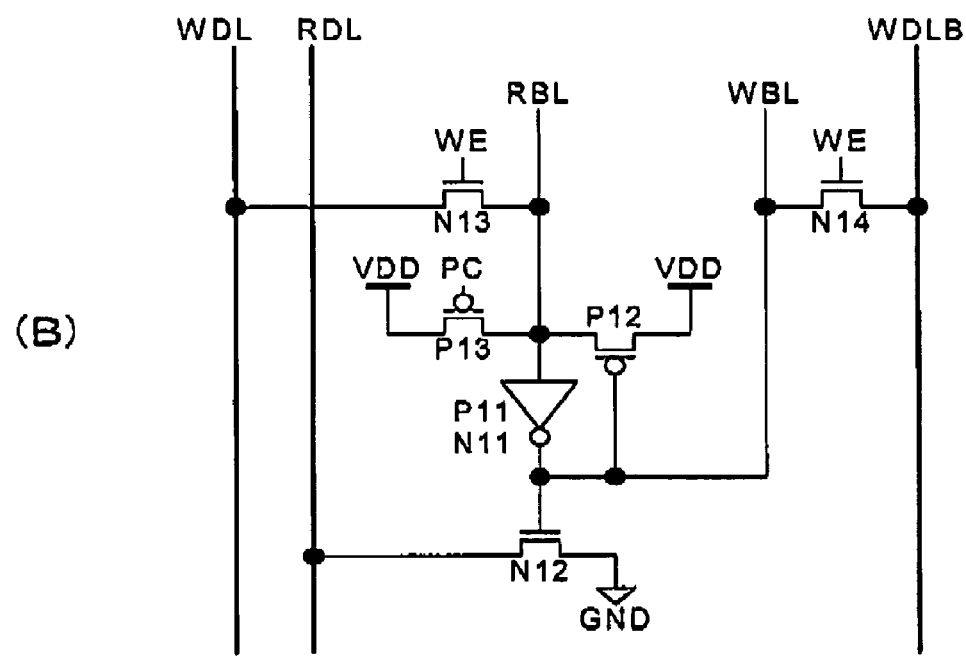
Figure 19:
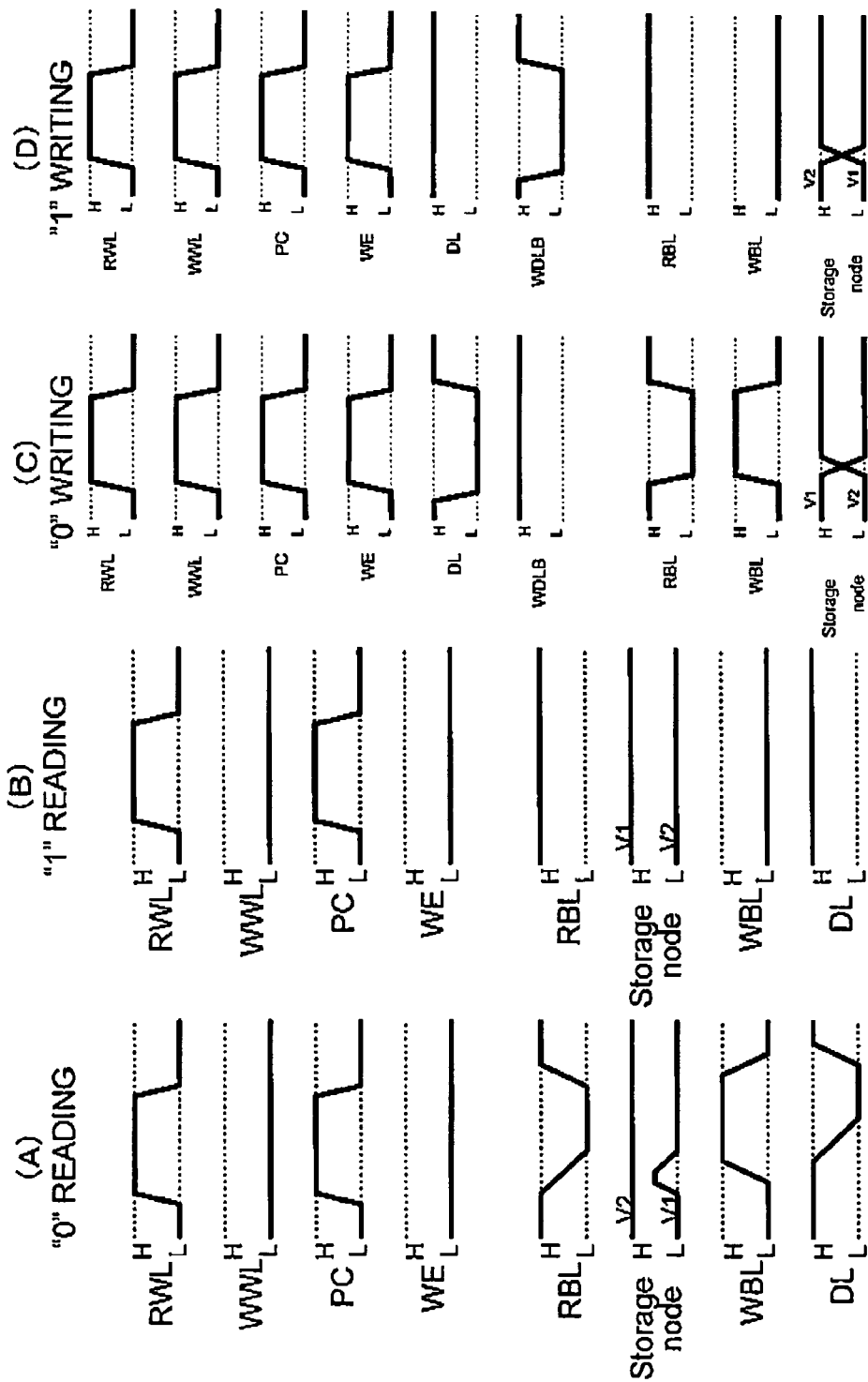
FIGS. 19(A) to (D) are operation-timing charts for the sense amplifier SA11 of the sixth embodiment.

FIG. 18(A) shows a circuit structural view of a sense amplifier SA23 arranged to execute data transfer to and from an input and output circuit using double lines including a data line DL and an inverted write data line WDLB and FIG. 18(B) shows a circuit structural view of a sense amplifier SA24 arranged to execute data transfer to and from an input and output circuit using three lines including a read data line RDL, a write data line WDL and an inverted write data line WDLB, with FIG. 19 showing time charts representing one mode of operations of the sense amplifier SA23.

The sense amplifier SA23 shown in FIG. 18(A) has a circuit structure different from that of the sense amplifier SA21 mentioned above in that the write bit line precharge transistor P14 connected to the write bit line WBL is deleted and the write bite line WBL is connected to the output of the inverter circuit to allow the inverter circuit to perform the precharging. Accordingly, the write bit line WBL has a precharge level at the low voltage potential "0". Other circuit structure is similar to that of the sense amplifier SA21 and no detailed description of the same is given. The sense amplifier SA24 shown in FIG. 18(B) is merely different in structure from the sense amplifier SA23 in that the data line DL is separated into a read data line RDL and a write data line WDL and similar in other structure and operation as those of the sense amplifier SA23.

The operation of the sense amplifier SA23 is described. The operations on (A) the reading "0" and (B) the reading "1" in FIG. 19 are executed in the same manner as those of the sense amplifier SA21 upon merely paraphrasing the inverter circuit output BLB in the sense amplifier SA 21 to the write bit line WBL in the sense amplifier SA23. Likewise, the operations on (C) the writing "0" and (D) the writing "1" in FIG. 19 are executed in the same manner as those of the sense amplifier SA21 except for a point in that the precharge level of the write bit lie WBL takes the low voltage potential "0". Detailed description of the same is herein omitted.

Seventh Embodiment

A seventh embodiment according to the present invention represents a sense amplifier that includes a further improvement of the sense amplifier SA24 of the sixth embodiment set forth above. This embodiment has a feature in that an input means for write data to be written to the write bit line is improved.

Figure 20:
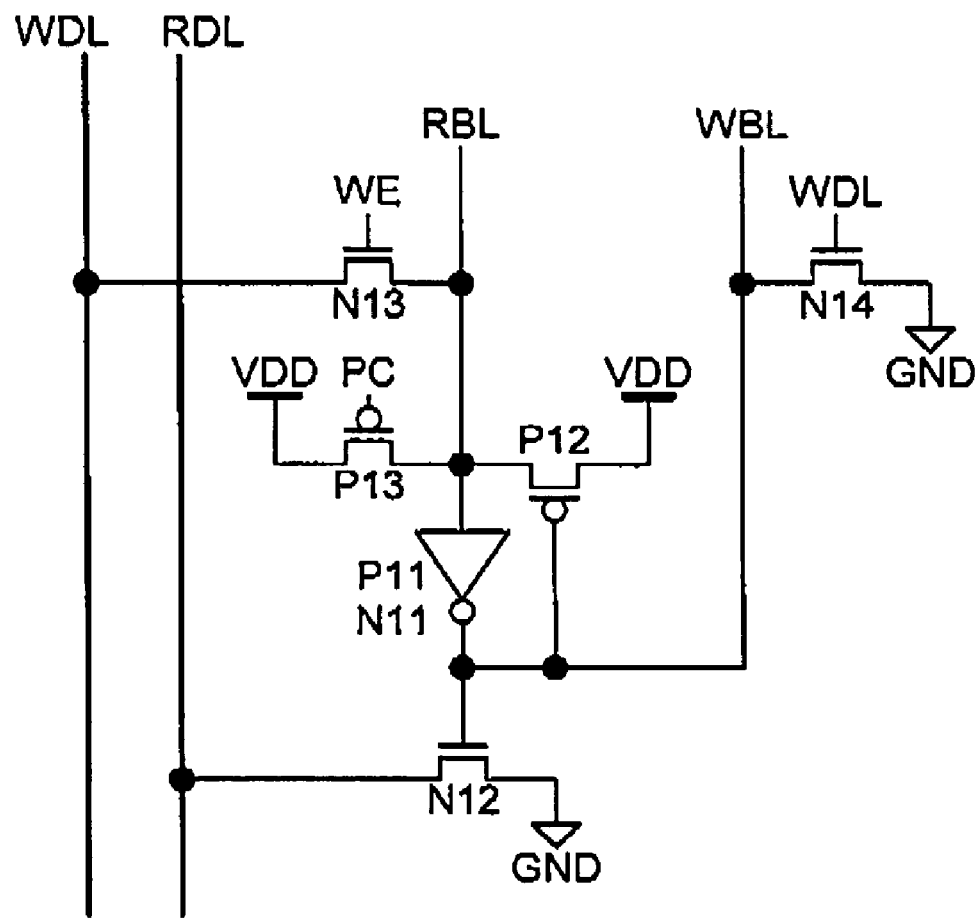
FIG. 20 is a view showing a circuit structure of a sense amplifier of a seventh embodiment.

A sense amplifier SA25 shown in FIG. 20 is different in a circuit structure from the sense amplifier SA24 in respect of an improved method in which the write transistor N14 performs the writing to the write data line WDL. The write transistor N14 has a source connected the ground potential GND and a gate connected to the write data line WDL whereby turning the write transistor on or off depending on a signal level of the write data line WDL allows the writing to the write bit line WBL to be performed.

An inverter circuit is input with cell data via the read bit line RBL from the memory cell and comprised of a PMOS transistor P11 and an NMOS transistor N11. An output of the inverter circuit is output to the write bit line WBL and gates of the PMOS transistor P12 and the NMOS transistor N12. The PMOS transistor P12 plays a role as a bit-line high-level-maintaining transistor and has a source connected to the power supply voltage VDD and a drain connected to the read bit line RBL to maintain the read bit line RBL at a high level when turned on. The NMOS transistor N12 plays a role as a read transistor and has a source connected to the ground potential GND and a drain connected to the read data line RDL.

Connected between the write data line WDL and the read bit line RBL is a write NMOS transistor N13 that has a gate input with a write signal WE. Further, the write transistor N14 has a gate input with the write data line WDL, a source connected to the ground potential GND and a drain connected to the write bit line WBL. A precharge transistor P13 has a gate input with a precharge signal PC, a source connected to the power supply voltage VDD and a drain connected to the read bit line RBL.

Figure 21:
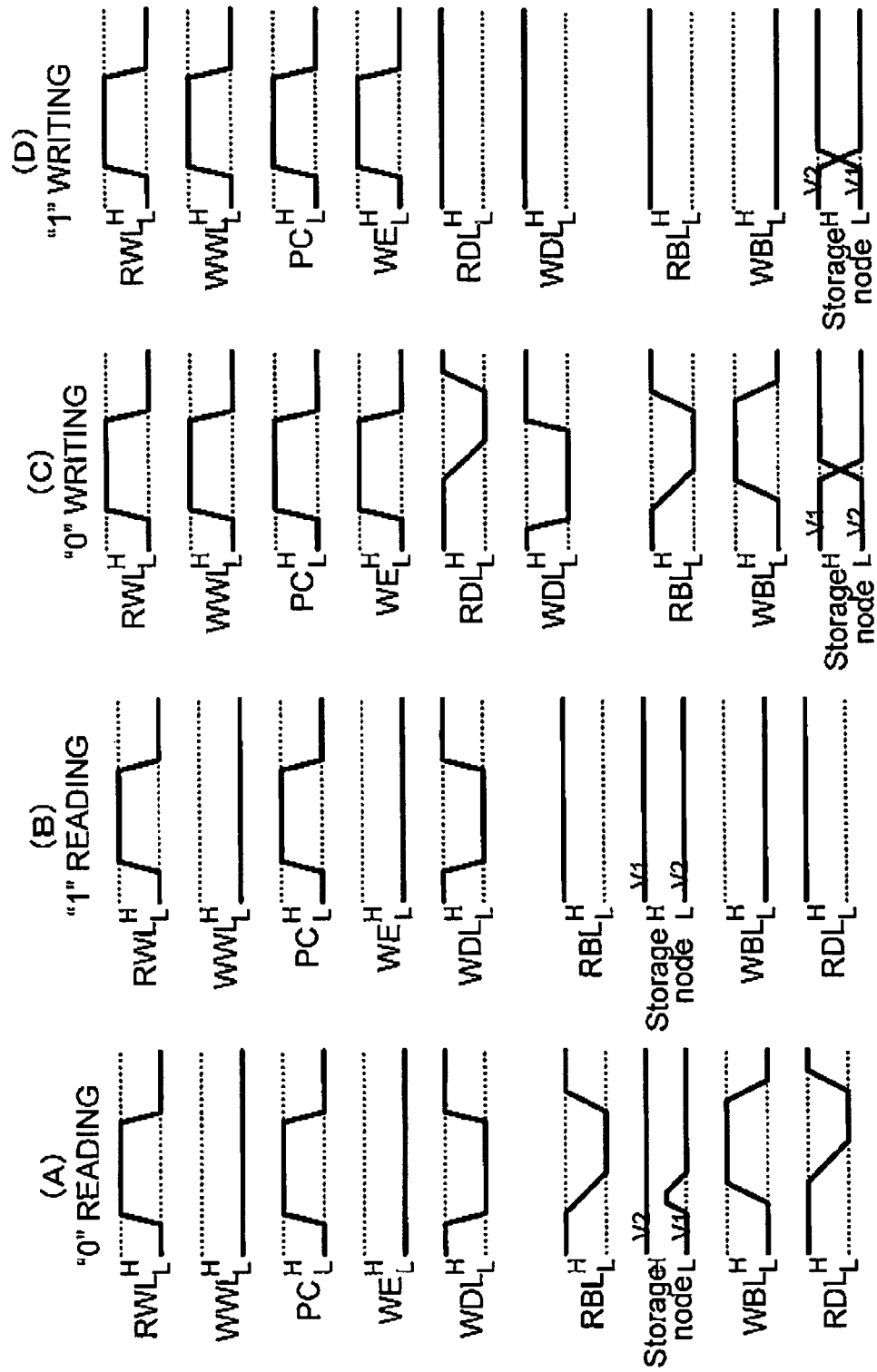
FIGS. 21(A) to (D) are operation-timing charts for the sense amplifier SA25 of the seventh embodiment.

The operation of the sense amplifier SA25 is described with reference to FIG. 21. During operation in reading "0" in FIG. 21 (A): by changing the precharge signal PC to the high voltage potential "1", the precharge transistor P13 is turned off completing the precharging to the read bit line RBL. The write data line WDL lies at the low voltage potential "0", turning off the write transistor N14. The read word line signal RWL for the memory cell takes the high voltage potential "1" and the read bit line RBL reads out memory cell data "0". The write bit line WBL connected to the output of the inverter circuit takes the high voltage potential "1" in response to data of the read bit line RBL to turn on the read transistor N12 in response to data of the read bit line RBL whereby the read data line RDL takes the low voltage potential thereby reading out cell data "0". The read word line signal RWL and the precharge signal PC take the low voltage potential and the write data line WDL is returned to the high voltage potential "1", thereby completing the reading. During a time period in the reading, the write word line signal WWL and the write signal WE remain unchanged at the low voltage potential "0".

(B) In case of reading "1": by changing the precharge signal PC to the high voltage potential "1", the precharge transistor P13 is turned off completing the precharging to the read bit line RBL. The write data line WDL is set to the low voltage potential "0", turning off the write transistor N14. The read word line signal RWL for the memory cell takes the high voltage potential "1" permitting the read bit line RBL to read out memory cell data "1". The write bit line WBL connected to the output of the inverter circuit takes the low voltage potential "0" in response to data of the read bit line RBL and the read transistor N12 remains turned off while the read data line RDL is maintained at the high voltage potential thereby reading out cell data "1". The read word line signal RWL and the precharge signal PC are returned to the low voltage potential "0" and the write data line WDL is returned to the high voltage potential "1", thereby completing the reading.

(C) In case of writing "0": by changing the precharge signal PC to the high voltage potential "1", the precharge transistor P13 is turned off completing the precharging to the bit line BL. The write data line WDL is set to the low voltage potential "0", turning off the write transistor N14. The write data line signal WDL is set to the low voltage potential "0" and the write signal WE is set to the high voltage potential "1" whereby the read bit line RBL takes the low voltage potential via the write transistor N13 upon which the write bit line WBL takes the high voltage potential "1". The read word line signal RWL for the memory cell and the write word line signal WWL take the high voltage potential "1", thereby writing data "0" of the read bit line signal RBL to the memory cell. The read word line signal RWL, the write word line signal WWL, the precharge signal PC and the write signal WE are returned to the low voltage potential "0" and the writ data signal RDL is returned to the high voltage potential "1", thereby completing the writing "0".

(D) In case of writing "1": by changing the precharge signal PC to the high voltage potential "1", the precharge transistor P13 is turned off completing the precharging to the bit line BL. Setting the write signal WE to the high voltage potential while permitting the write data line WDL to remain intact at the high voltage potential "1" allows the read bit line signal RBL to take the high voltage potential "1" via the write transistor N13, thereby causing the write bit line WBL to take the low voltage potential "0". The read word line signal RWL for the memory cell and the write word line signal WWL take the high voltage potential "1", thereby writing data "1" of the read bit line signal RBL to the memory cell. The read word line signal RWL, the write word line signal WWL, the precharge signal PC and the write signal WE are returned to the low voltage potential "0", thereby completing the writing "1".

Eighth Embodiment

An eighth embodiment according to the present invention represents simplified embodiments of the sense amplifiers SA21 and SA22 of the fifth embodiment and has a feature in that the write bit line WBL and the inverted write data line are directly connected to each other. FIG. 22(A) shows a circuit structural view of a sense amplifier SA26 and FIG. 22(B) shows a circuit structural view of a sense amplifier SA27, with FIG. 23 showing time charts illustrating one mode of operations of the sense amplifier SA26.

Figure 22:
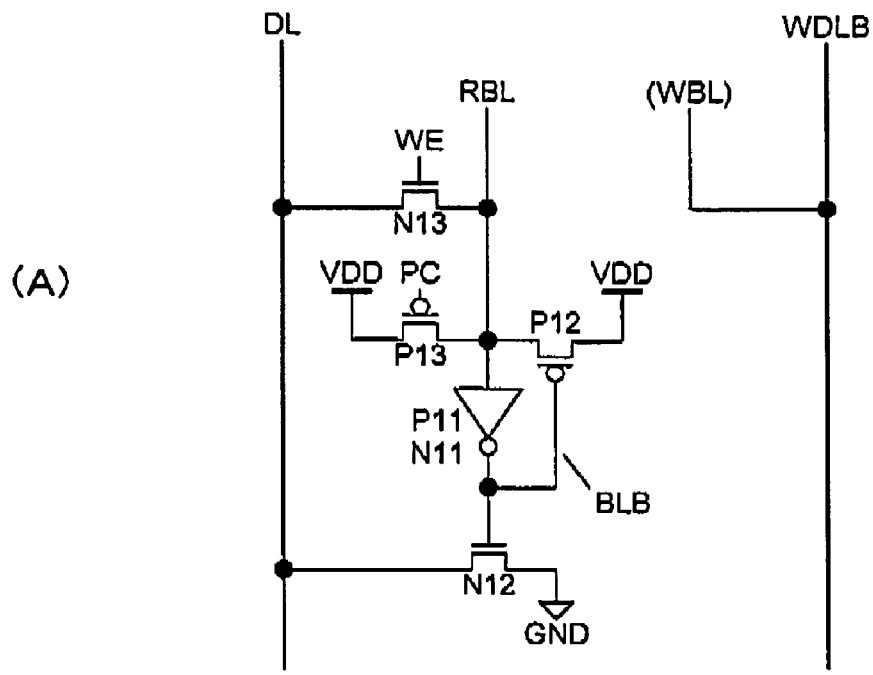
FIGS. 22(A) and (B) show circuit structures of sense amplifiers SA26, SA27 of an eighth embodiment.
Figure 22:
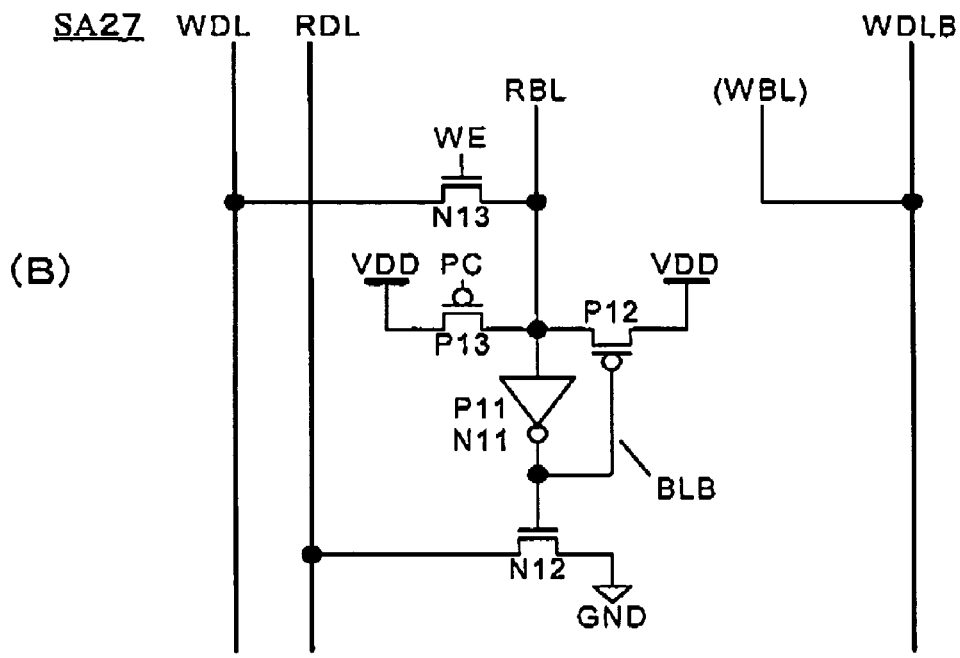

Description is made of the circuit structures of (A) the sense amplifier SA26 and (B) the sense amplifier SA27 shown in FIG. 22. Comparing the circuit structures of (A) the sense amplifier SA26 and (B) the sense amplifier SA27 shown in FIG. 22 to the circuit structures of (A) the sense amplifier SA21 and (B) the sense amplifier SA22 shown in FIG. 16, both are different from each other in that the transistors P14 and N14 are deleted from the sense amplifiers SA 21 and SA22 and the inverted write data line WDLB and the write bit line WBL are directly connected to each other while the other circuit structures are identical to each other.

Figure 23:
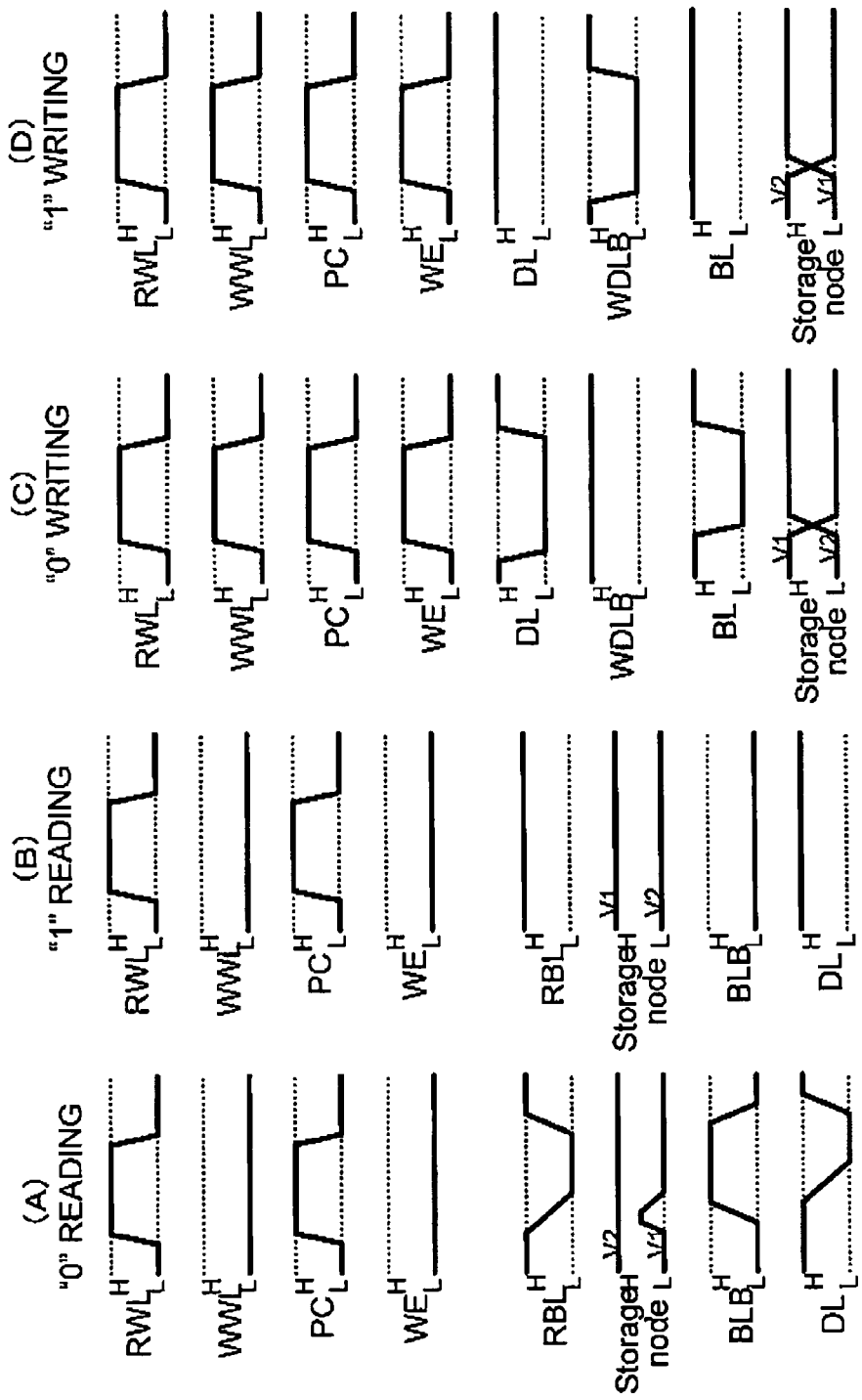
FIGS. 23 (A) to (D) are operation-timing charts for the sense amplifier SA26 of the eighth embodiment.

Further, the time charts representing the operation of the sense amplifier SA26 shown in FIG. 23 are identical to that of the sense amplifier SA21 shown in FIG. 17 and the same operations are executed, with description of the same being herein omitted.

Ninth Embodiment

A ninth embodiment according to the present invention represents a simplified embodiment of the sense amplifier SA22 of the fifth embodiment. The sense amplifier SA22 has a feature in that the write transistors for the write bit line WBL and the read bit line RBL are deleted and the writing is executed using the inverted write data line WDLB. FIG. 24(A) shows a circuit structural view of a sense amplifier SA31 and FIG. 24(B) shows a circuit structural view of a sense amplifier SA32, with FIG. 25 showing time charts illustrating one mode of operations of the sense amplifiers SA31 and SA32.

Figure 24:
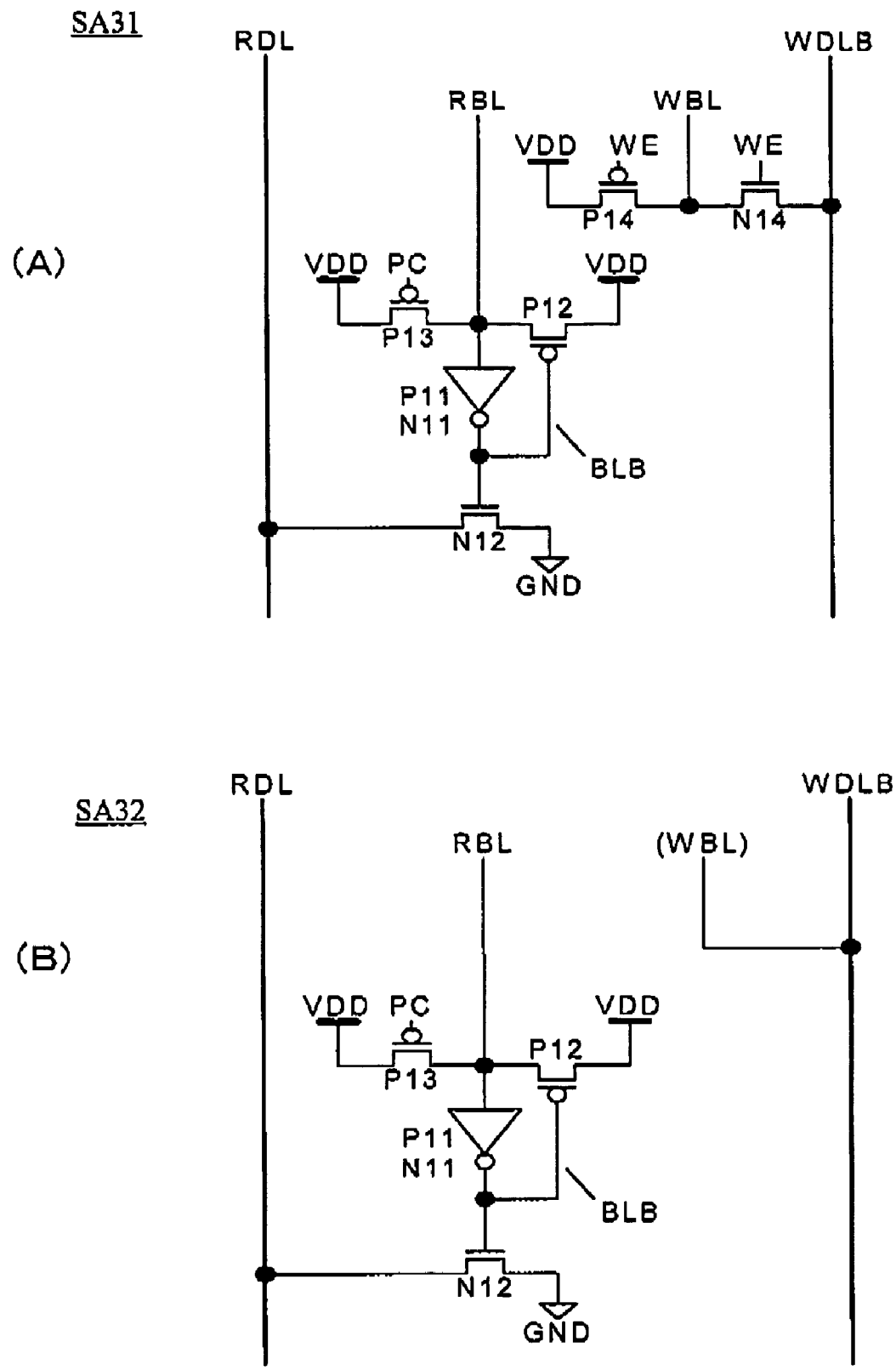
FIGS. 24(A) and (B) show circuit structures of sense amplifiers SA31, SA32 of a ninth embodiment.

Description is made of the circuit structures of (A) the sense amplifier SA31 and (B) the sense amplifier SA32 shown in FIG. 24. Comparing the circuit structure of the sense amplifier SA31 shown in FIG. 24(A) to the sense amplifier SA22 shown in FIG. 16(B), the sense amplifier SA31 includes a circuit in which the write data line WDL and the write transistor N13 are removed from the sense amplifier SA22. Further, the sense amplifier SA 32 shown in FIG. 24(B) corresponds to a structure wherein the transistors P14 and N14 are removed from the sense amplifier SA31 and the inverted write data line WDLB and the write bit line WBL are directly connected to each other, while the other circuit structures are identical to each other. Accordingly, the sense amplifiers SA31 to SA32 operate on the same time charts.

Figure 25:
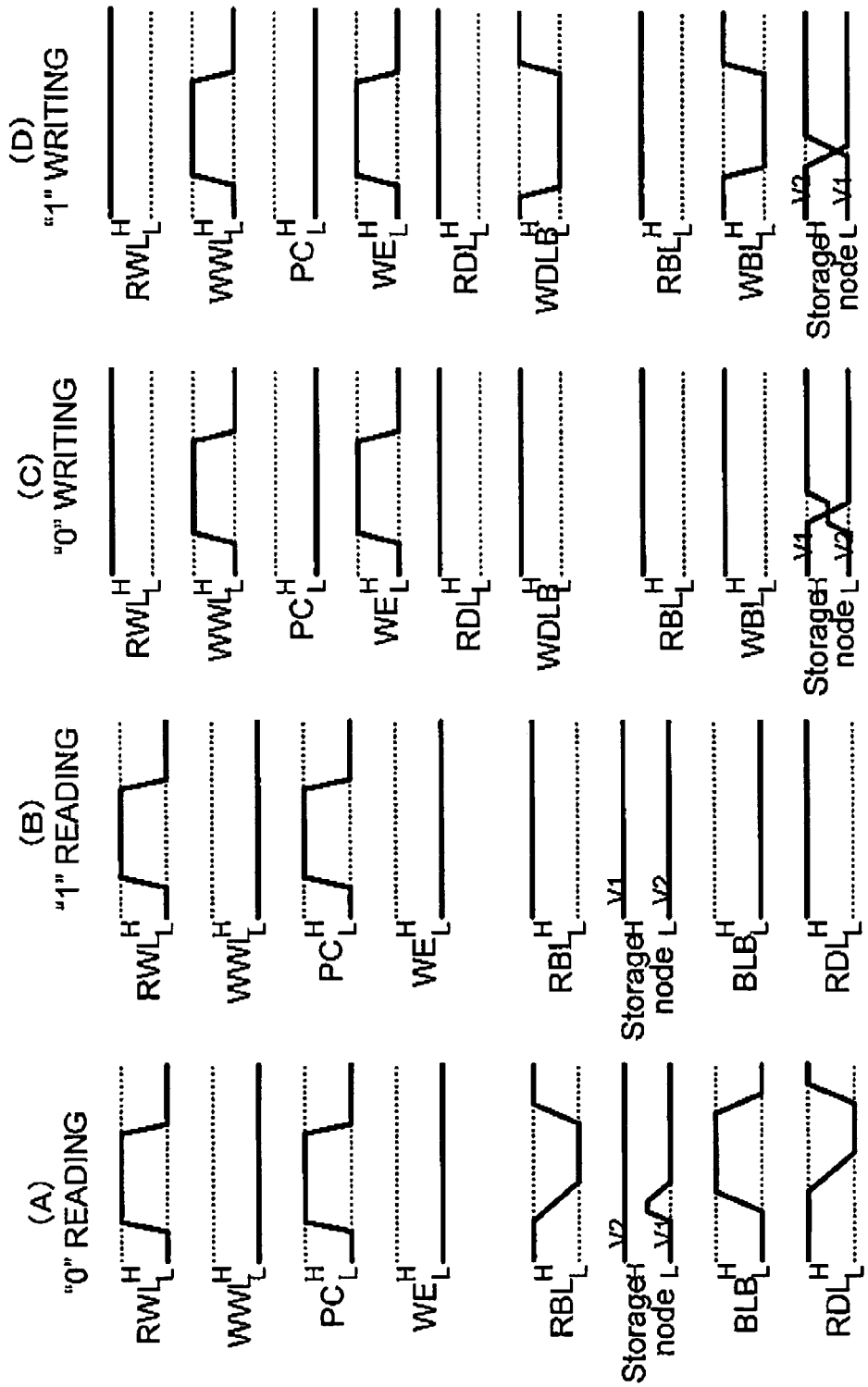
FIGS. 25(A) to (D) are operation-timing charts for the sense amplifier of the ninth embodiment.

The operations of the sense amplifiers SA31 and SA32 shown in FIG. 25 are described. (A) In case of reading "0": by changing the precharge signal PC to the high voltage potential "1", the precharge transistor P13 is turned off completing the precharging to the read bit line RBL. The read word line signal RWL for the memory cell takes the high voltage potential "1" and the read bit line RBL reads out memory cell data "0", taking the low voltage potential "0". The inverter output BLB takes the high voltage potential "1" due to data of the read bit line RBL to turn on the read transistor N12 upon which the read data line RDL takes the low voltage potential "0", thereby reading cell data "0". The read word line signal RWL and the precharge signal PC are returned to the low voltage potential "0" thereby completing the reading. During the reading time period, the write word line signal WWL and the write signal WE remain unchanged at the low voltage potential "0".

(B) In case of reading "1": by changing the precharge signal PC to the high voltage potential "1", the precharge transistor P13 is turned off completing the precharging to the read bit line RBL. The read word line signal RWL for the memory cell takes the high voltage potential "1" and the read bit line RBL reads out memory cell data "1", taking the high voltage potential "1". The inverter output BLB takes the low voltage potential "0" due to data of the read bit line RBL to cause the read transistor N12 to remain turned off while causing the read data line RDL to remain intact at the high voltage potential "1", thereby reading cell data "1". The read word line signal RWL and the precharge signal PC are returned to the low voltage potential "0" thereby completing the reading.

(C) In case of writing "0": by changing the write signal WE to the high voltage potential "1", the precharge transistor P14 is turned off completing the precharging to the write bit line WBL. The write signal WE takes the high voltage potential "1" and the voltage potential "1" of the inverted write data line WDLB is transferred via the write transistor N14 to the write bit line WBL. The write word line signal WWL for the memory takes the high voltage potential "1" to allow data "1" of the write bit line WBL to be written to the second data memory of the memory cell, thereby writing "0" to the first data storage node. The write signal WE is returned to the low voltage potential "0" completing the writing "0".

(D) In case of writing "1": by changing the write signal WE to the high voltage potential "1", the precharge transistor P14 is turned off completing the precharging to the write bit line WBL. The write signal WE takes the high voltage potential "1" and the low voltage potential "0" of the inverted write data line WDLB is transferred via the write transistor N14 to the write bit line WBL that in turn takes the low voltage potential "0". The write word line signal WWL for the memory cell takes the high voltage potential "1" to allow data "0" of the write bit line WBL to be written to the second data storage node of the memory cell, thereby writing "1" to the first data storage node. The write word line signal WWL and the write signal WE are returned to the low voltage potential "0" completing the writing "1".

With the above, the various memory cells and the sense amplifiers forming the semiconductor memory device have been described. Then, description is made of a layout for realizing a semiconductor memory device employing these component elements.

Tenth Embodiment

Figure 26:
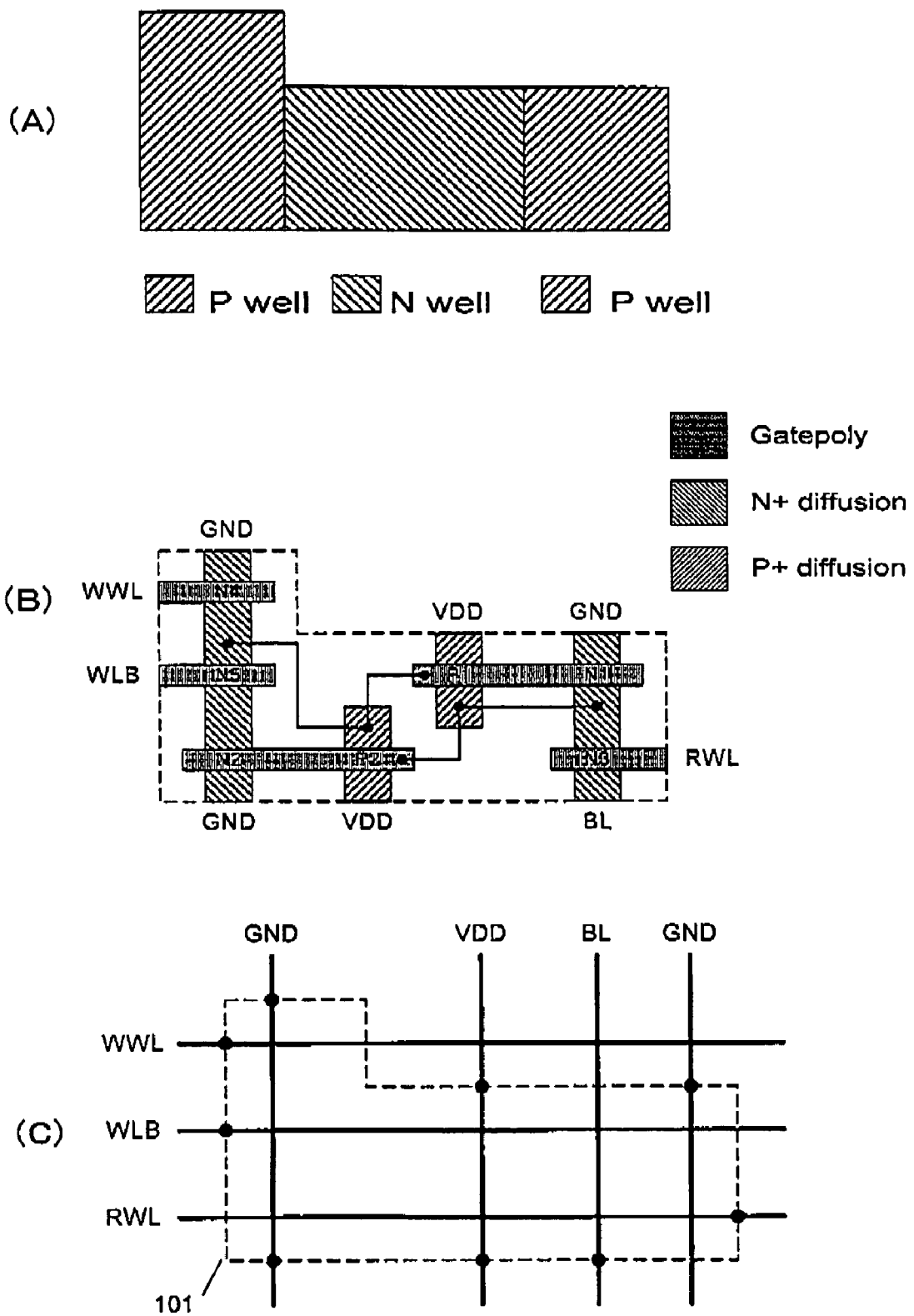
FIGS. 26 (A) to (C) show one example of an SRAM placement layout of a tenth embodiment.

With a tenth embodiment according to the present invention, one embodiment of a layout of an SRAM cell is shown as a layout of a semiconductor memory device. FIG. 26 shows a layout of one cell component of the SRAM cell (FIG. 10) employed in the second embodiment, FIG. 27, a layout of one cell component of the SRAM cell (FIG. 11(A)) employed in the third embodiment, FIG. 28, a layout of two cell components of the SRAM cell (FIG. 10) employed in the second embodiment, and FIG. 29, a layout of two cell components of the SRAM cell (FIG. 11(A)) employed in the third embodiment. Further, FIGS. 30(A), (B), (C), (D) show embodiments of cell arrays each having memory cells disposed in a matrix.

Description is made with reference to FIG. 26. Since the SRAM is structured of a CMOS and has P well regions formed with NMOS transistors and an N well region formed with PMOS transistors. Since the SRAM cell of the present invention is comprised of two PMOS transistors and five NMOS transistors, the SRAM cell has a central area for the N well region and both sides for the P well regions with one of the P well regions taking an increased height to form an L-shaped configuration as one cell as shown FIG. 26 (A). FIG. 26 (B) shows a schematic element layout and (C) shows signal lines and power supply lines.

The NMOS transistors N4, N5 and N2 are disposed in the left-side P well region and the PMOS transistors P1, P2 are disposed in the central N well region while the NMOS transistors N1, N3 are disposed in the right-side P well region. In FIG. 26B, wiring related to the data storage nodes V1 and V2 forming wiring inside the cell are completed inside the cell and designated by solid lines, with resulting junctions being designated in black circles.

Black circles in FIG. 26(C) designate connection points in the form of contacts or through-holes through for taking signal lines or power supply lines into the SRAM cell. The signal lines or the power supply lines are connected to the cell at boundary areas of the SRAM cell. The word line signal RWL, the write word line signal WWL and the inverted word line signal are wired in an X-axis direction. The bit line, input to the drain or source of the transistor, and the power supply line are wired in a Y-axis direction. The power supply voltage VDD and the ground potential are terminated at a boundary of a side that is discontinuous with a low height of the L-shaped configuration of the cell area.

Figure 27:
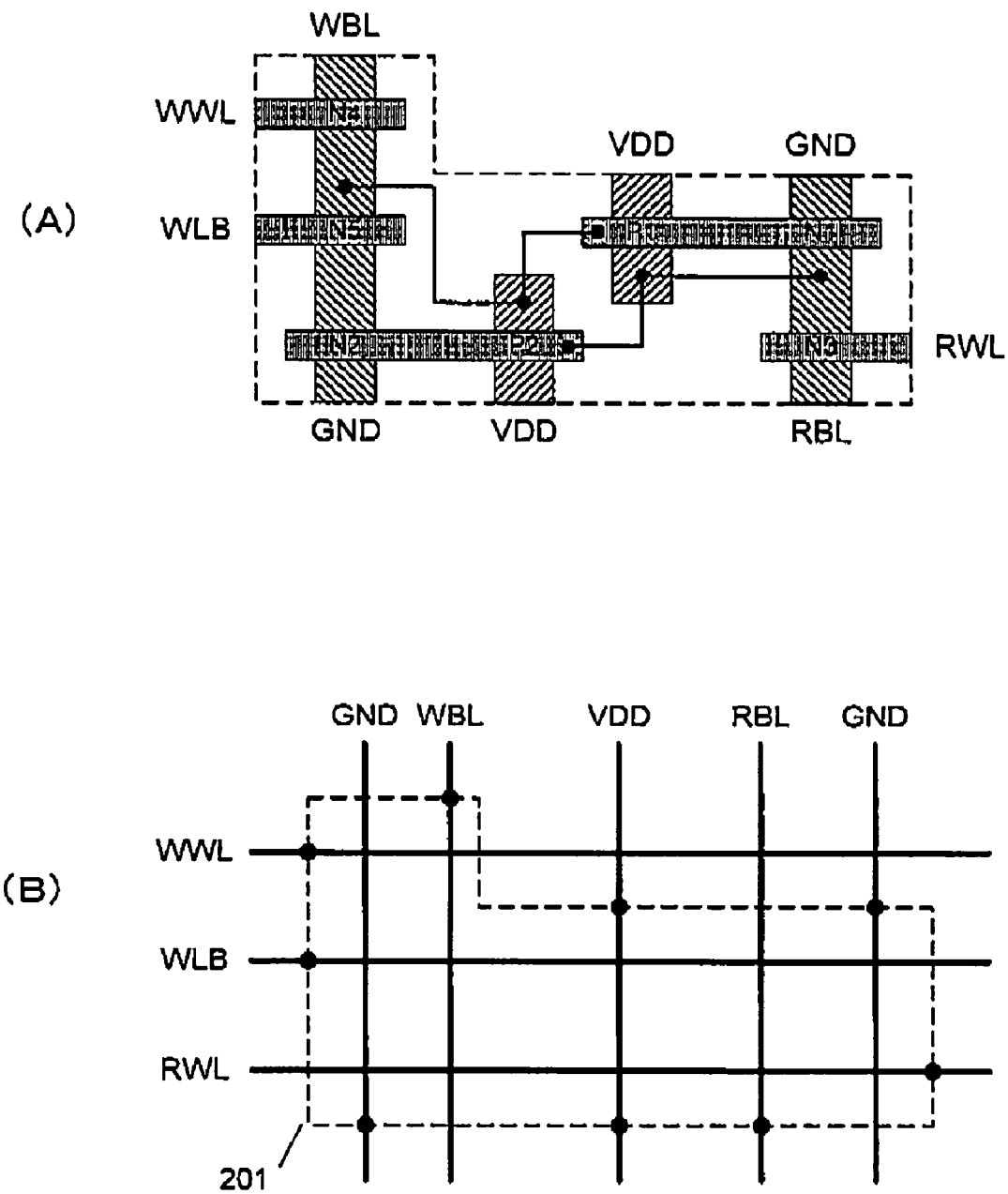
FIGS. 27 (A) and (B) show a modified form of the SRAM placement layout of the tenth embodiment.

FIG. 27 shows a layout of one cell component of the SRAM (FIG. 11(A)) employed in the third embodiment, with (A) showing a schematic element layout and (B) showing signal lines and power supply lines. This layout differs from that of FIG. 26 in that a write bit line is further added and both are similar in other layout with description of the same being herein omitted.

Figure 28:
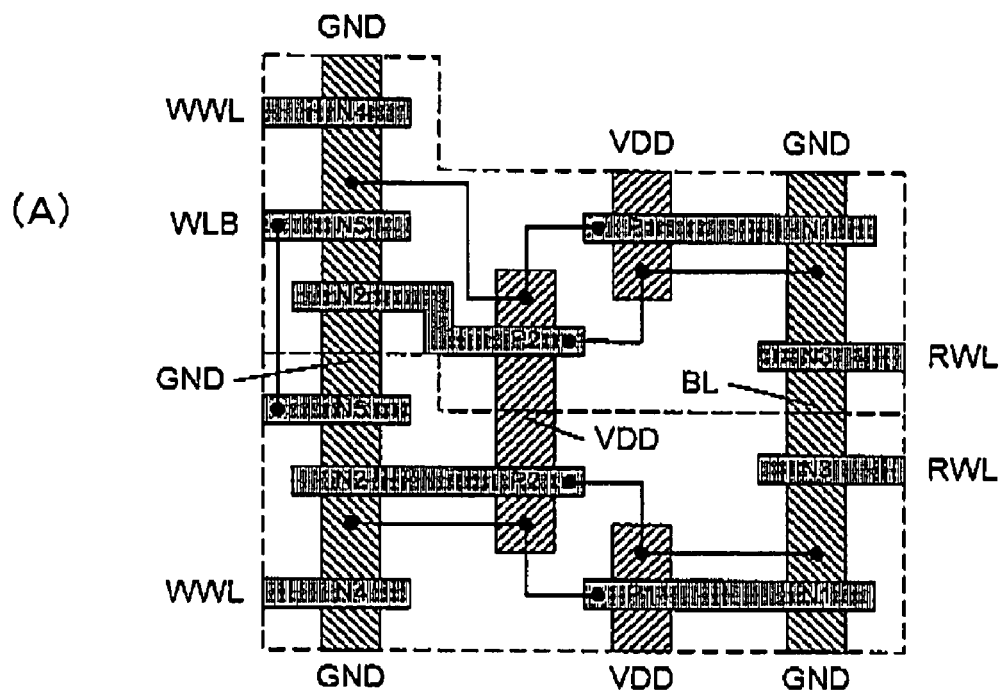
FIGS. 28 (A) and (B) show another modified form of the SRAM placement layout of the tenth embodiment.
Figure 28:
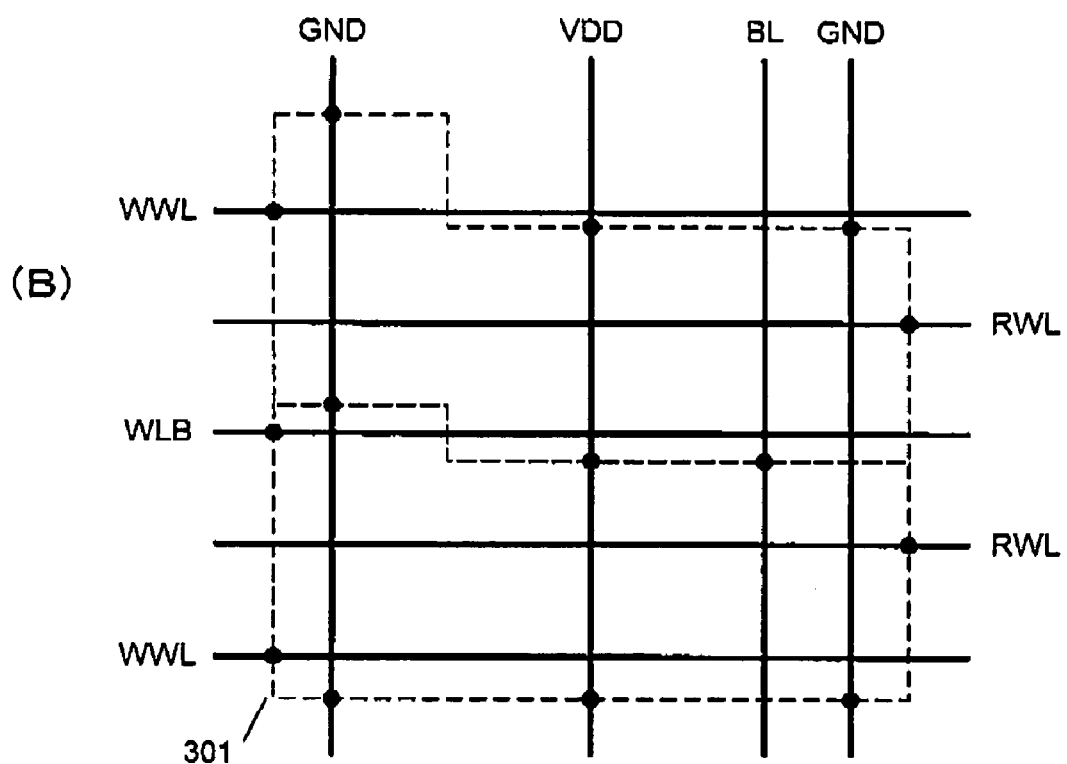
Figure 29:
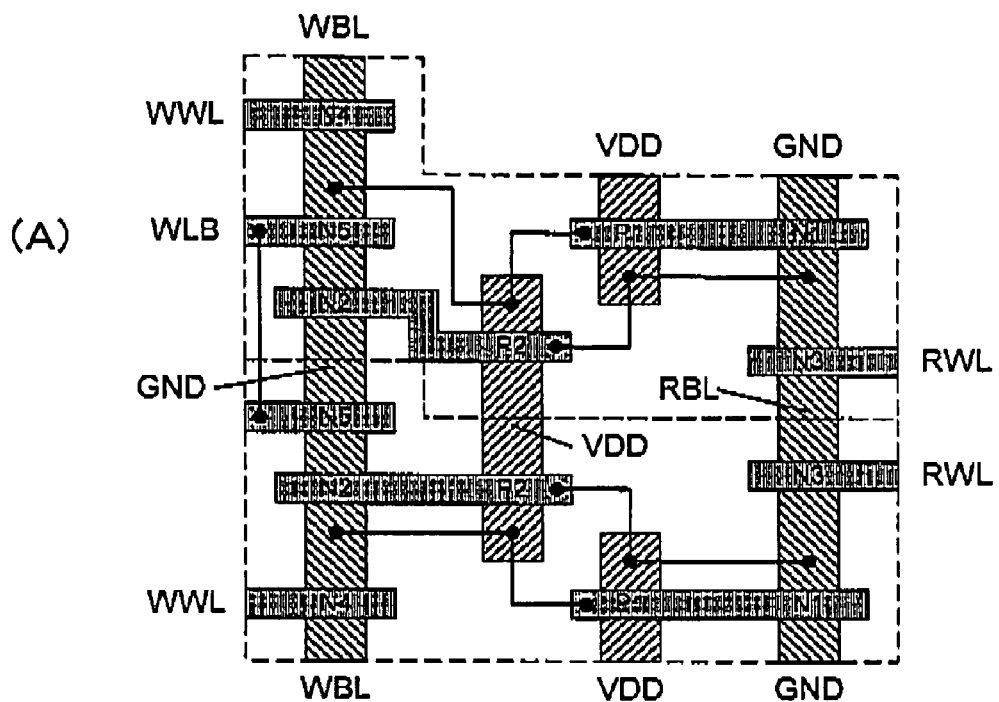
FIGS. 29 (A) and (B) show another modified form of the SRAM placement layout of the tenth embodiment.
Figure 29:
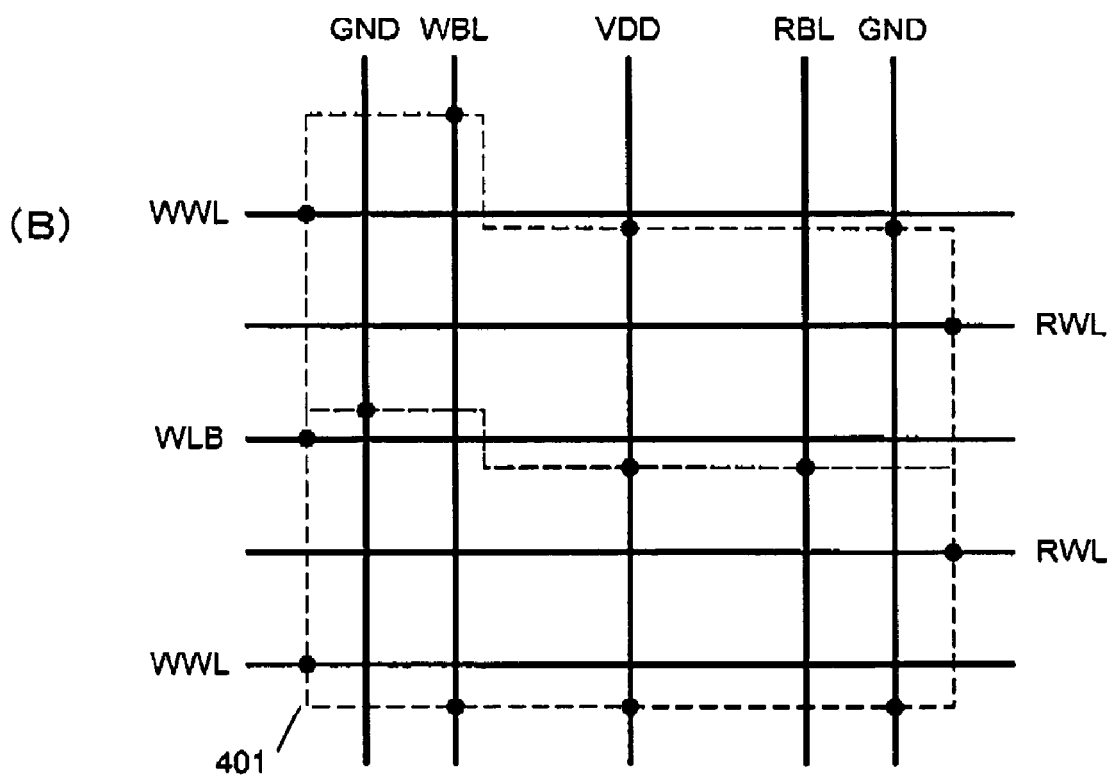

FIGS. 28 and 29 show a layout of an SRAM cell on which two cell components are stacked. With the layout for the two cell components, one cell component is stacked on the other in layout under an inverted condition. Accordingly, these drawing figures show an upper stage contoured in the layout mentioned above and the cell components on a lower stage contoured in a mirror placement at a boundary. Further, in order to introduce inverted word line signals WLB for the two cells in common as a single signal line, the drive transistor N2 of the second inverter and the storage control transistor N5 are altered in position. However, the common standardization of the inverted word line signal WLB and the change in position between the drive transistor N2 and the storage control transistor N5 may not be executed. Other structures such as (A) a schematic element layout and (B) signal lines and a power supply line are arranged in the layout as shown in the drawing figures.

Figure 30:
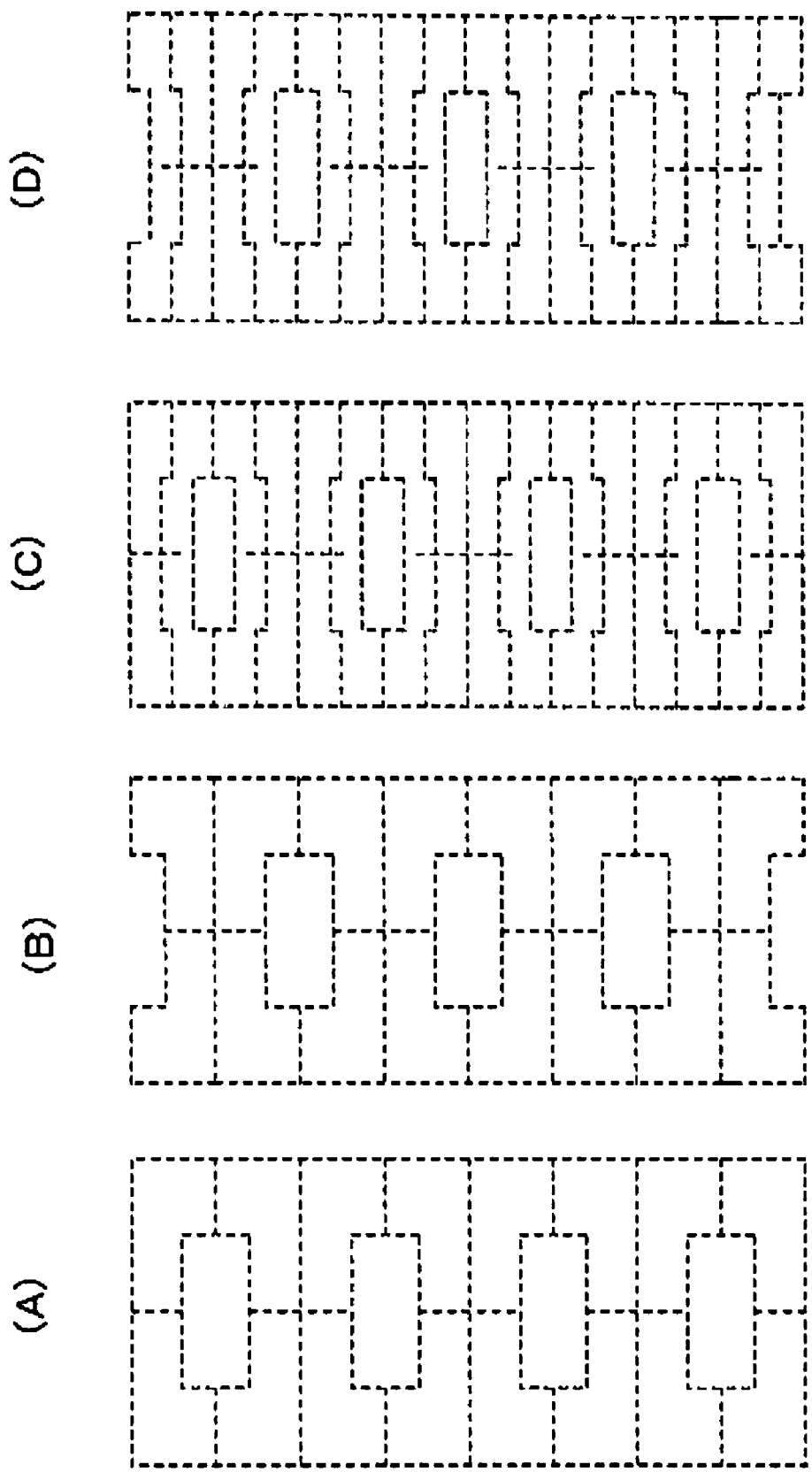
FIGS. 30 (A) to (D) show layouts of cellblocks.

FIG. 30 shows layouts in which plural memory cells are disposed. FIGS. 30(A), (B) show cellblocks A, B in 2×8 bits arranged in two bits in a direction X and 8 bits in a direction Y and FIGS. 30(C), (D) show cellblocks C, D in 2×16 bits arranged in two bits in the direction X and 2×8 bits in the direction Y. The cellblock A of FIG. 30(A) represents a layout of a cellblock in which the memory cells shown in FIG. 26 or FIG. 27 are inverted in mirror in three directions, respectively, to allow four pieces of these memory cells to be stacked to form a 2×8 bit structure, with the cellblock having a terminal end that forms a continuous side on a bottom of an L-shaped configuration of the memory cells. The cellblock B of FIG. 30(B) represents a modified form of the cellblock sown in FIG. 30(A) and differs therefrom in that the cellblock formed in the layout of the 2×8 bit structure has a terminal end forming a discontinuous side of the L-shaped configurations of the memory cells.

Furthermore, FIGS. 30(C), (D) show cellblocks in which the memory cells shown in FIG. 28 or FIG. 29 are inverted in mirror in three directions, respectively, to allow four pieces of the memory cells to be stacked into 2×16 bit structures, with (C) showing a layout of the cellblock C whose terminal end is formed to be continuous and (D) showing a layout of the cellblock D whose terminal end is formed to be discontinuous. Here, with the memory cells inverted in mirror, the resulting central area has a space providing a vacant area with no placement of cell elements to cause the cells to be discontinuous in layout. A side of this space has an area on which the power supply voltage VDD and the ground potential GND are terminally ended.

The cell layout of the present invention is arranged in an L-shaped region and has a cell boundary region in which the signal lines and power supply lines are located. Additionally, the power supply line VDD and the ground potential are terminated at a boundary between the discontinuous sides with reduced heights of the L-shape configurations of the memory cells. Locating these memory cells in layout enables the realization of a semiconductor memory device that can be operated at a high speed and an ultra low voltage.

Eleventh Embodiment

With an eleventh embodiment of the present invention, one embodiment of a layout of a sense amplifier is shown as a layout for a semiconductor memory device. The sense amplifier of the present invention is disposed in an area between the memory cells located in mirror. FIGS. 31 to 48 show embodiments.

Figure 31:
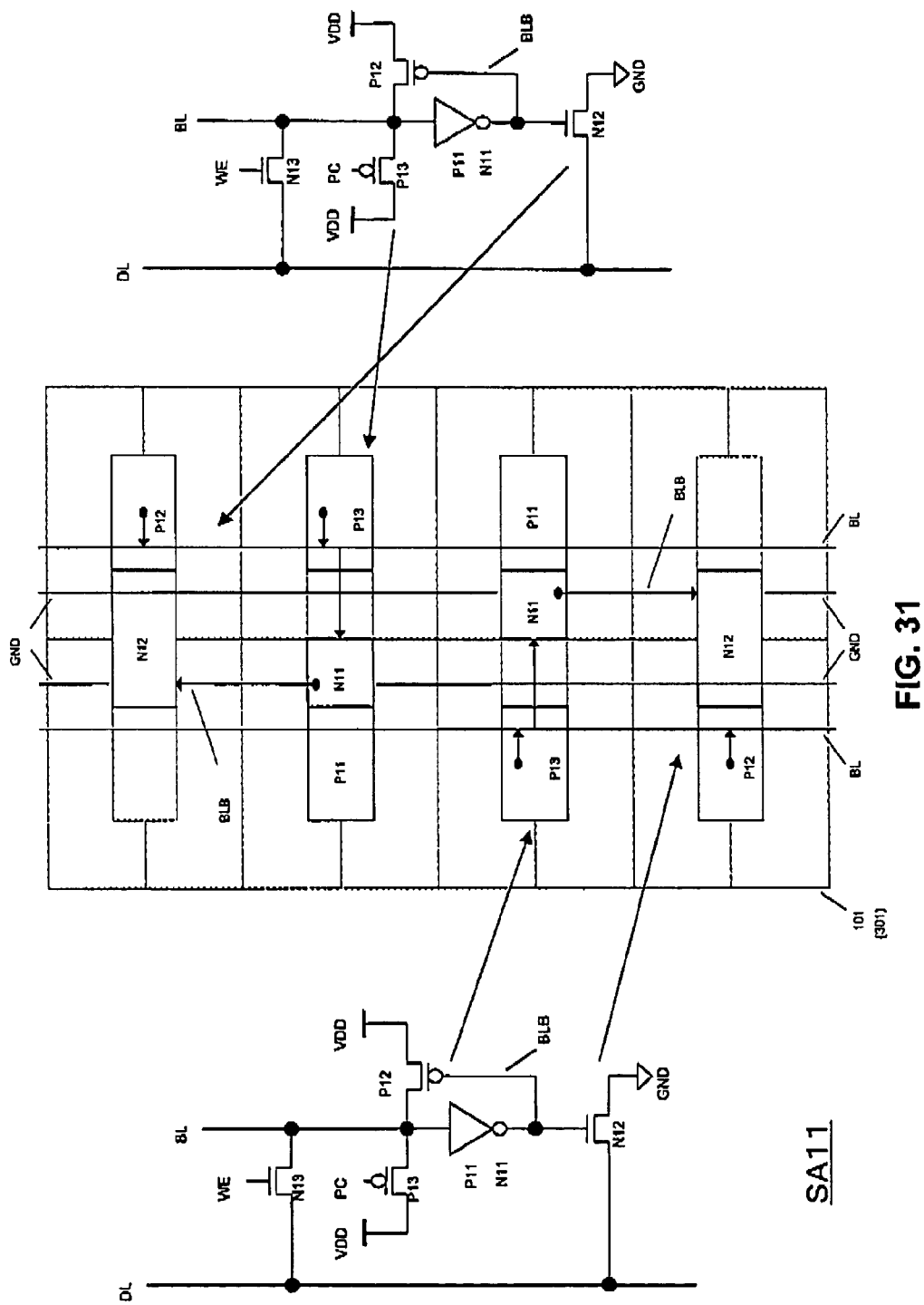
FIG. 31 shows a layout of a sense amplifier SA11 of a cellblock A of an eleventh embodiment.
Figure 32:
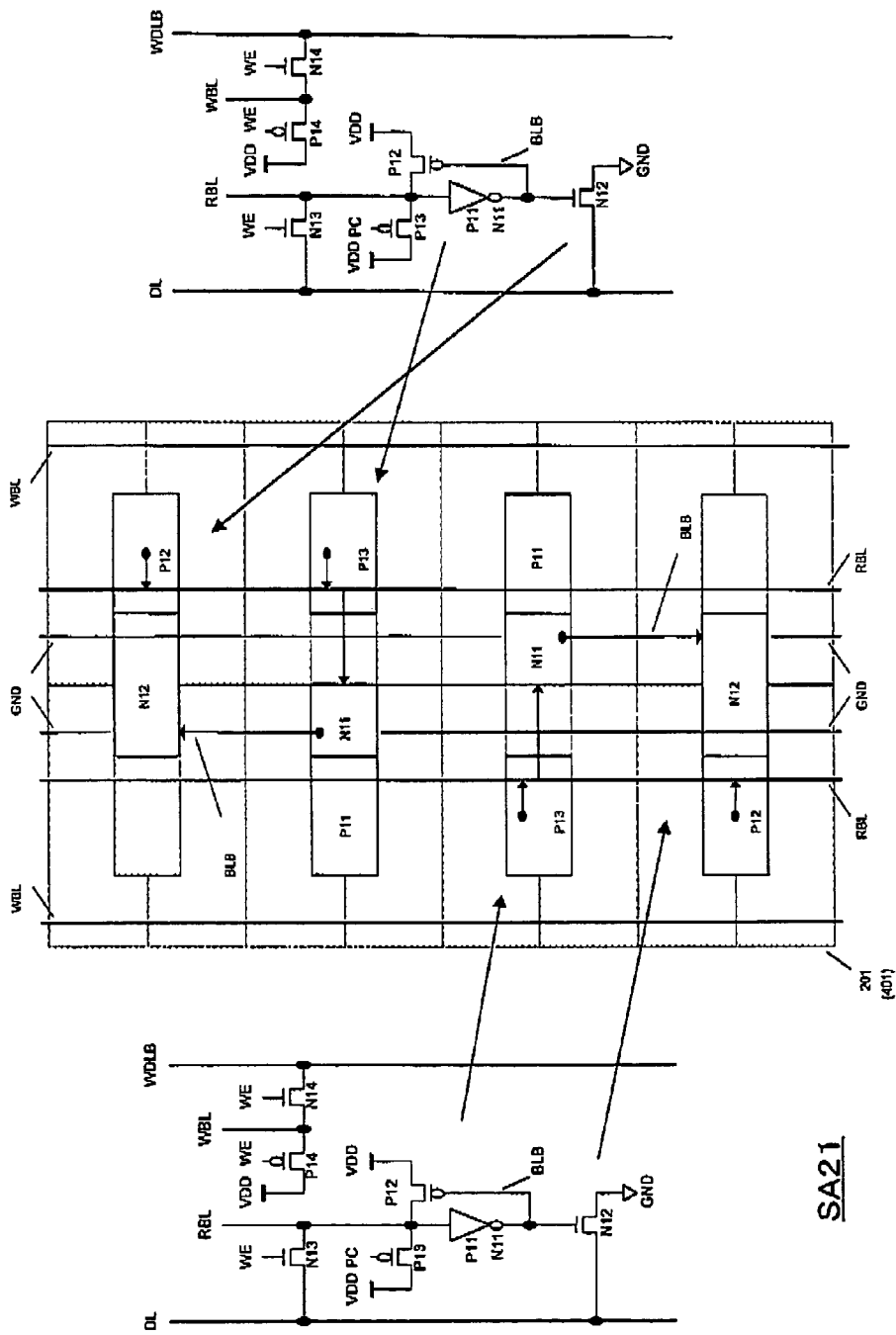
FIG. 32 shows a layout of the sense amplifier SA21 of the cellblock A.
Figure 33:
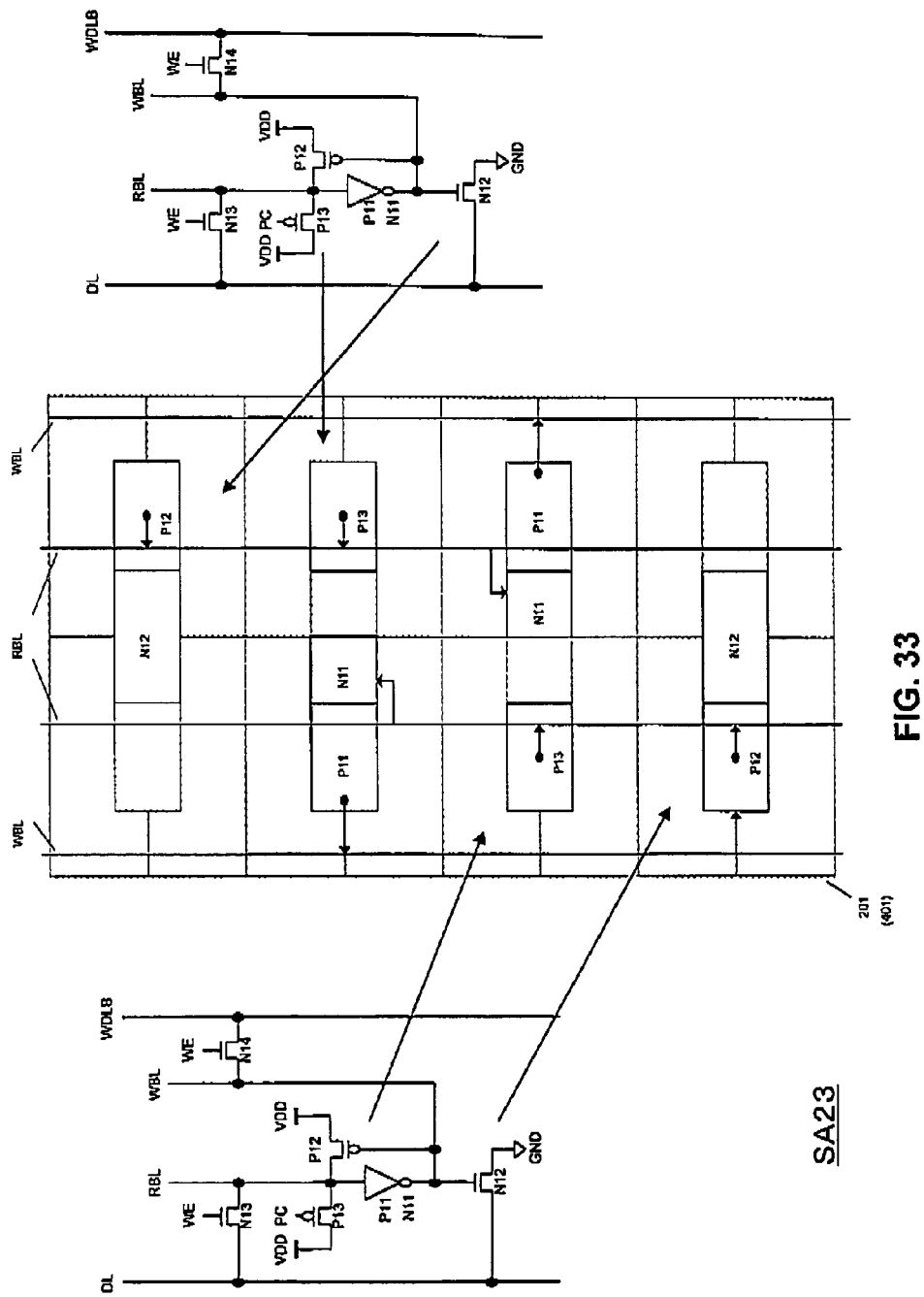
FIG. 33 shows a layout of a sense amplifier SA23 of the cellblock A.
Figure 34:
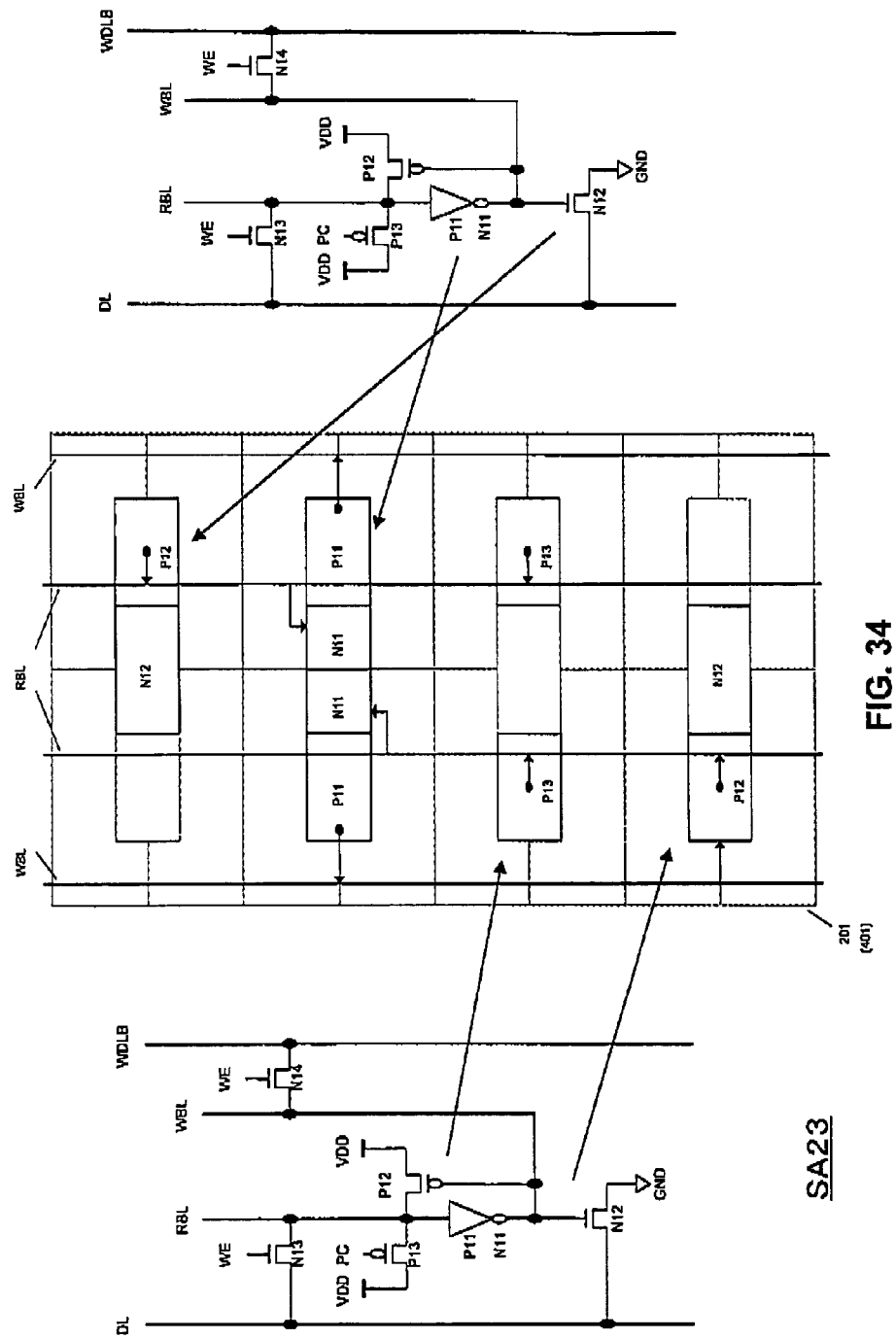
FIG. 34 shows another layout of the sense amplifier SA23 of the cellblock A.
Figure 35:
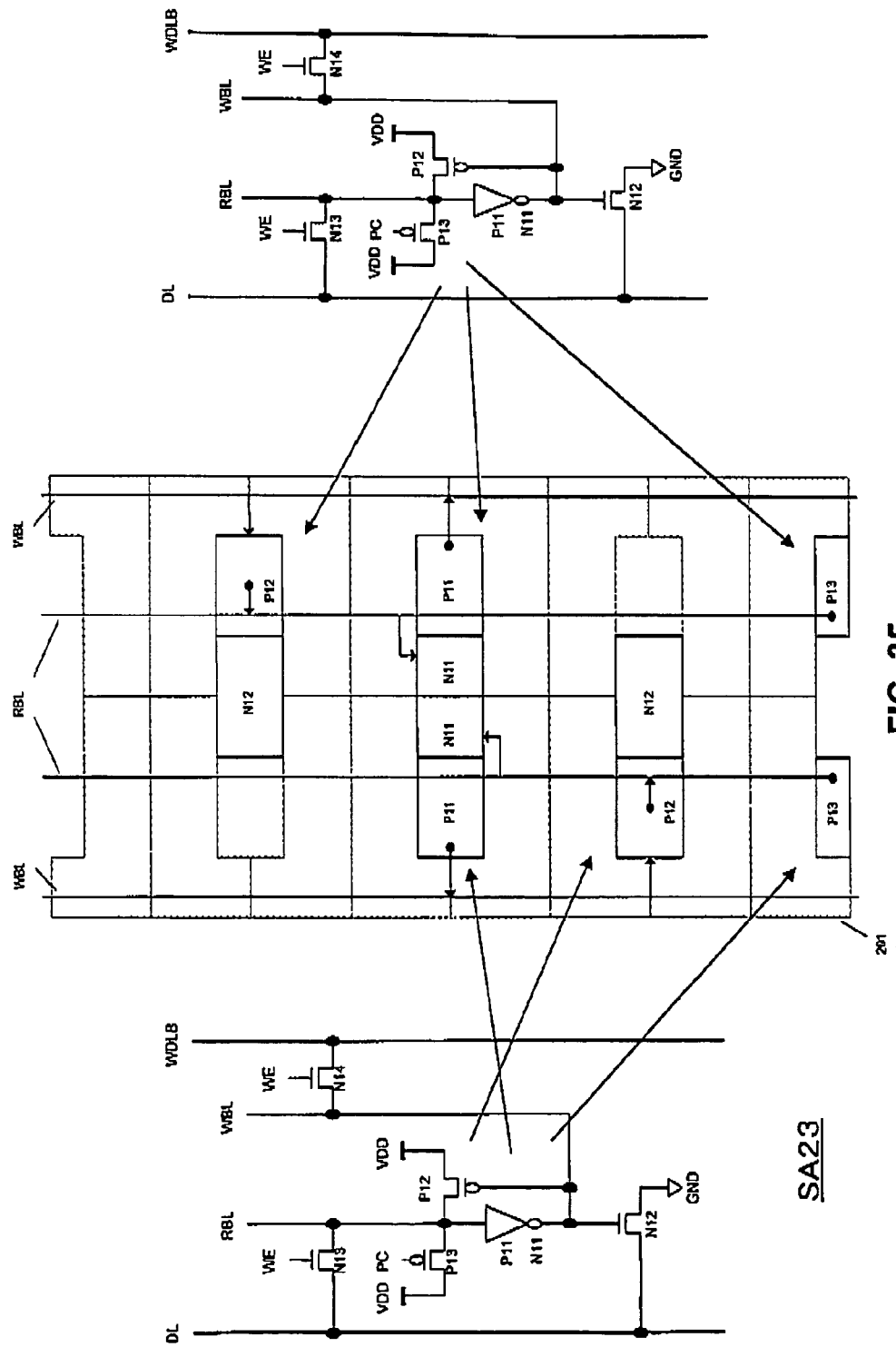
FIG. 35 shows a layout of the sense amplifier SA23 of a cellblock B.
Figure 36:
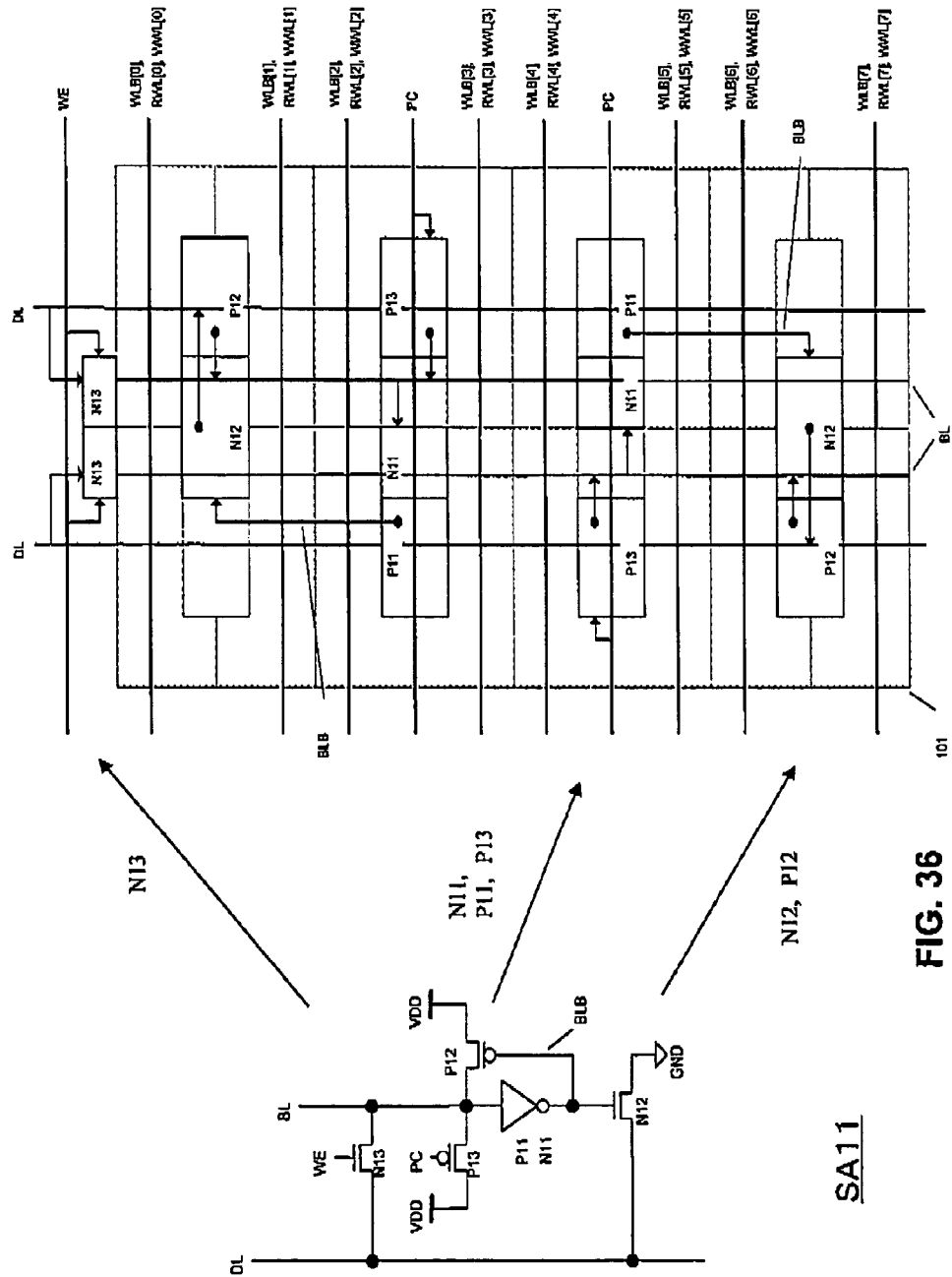
FIG. 36 shows another layout of a sense amplifier SA11 of the cellblock A.
Figure 37:
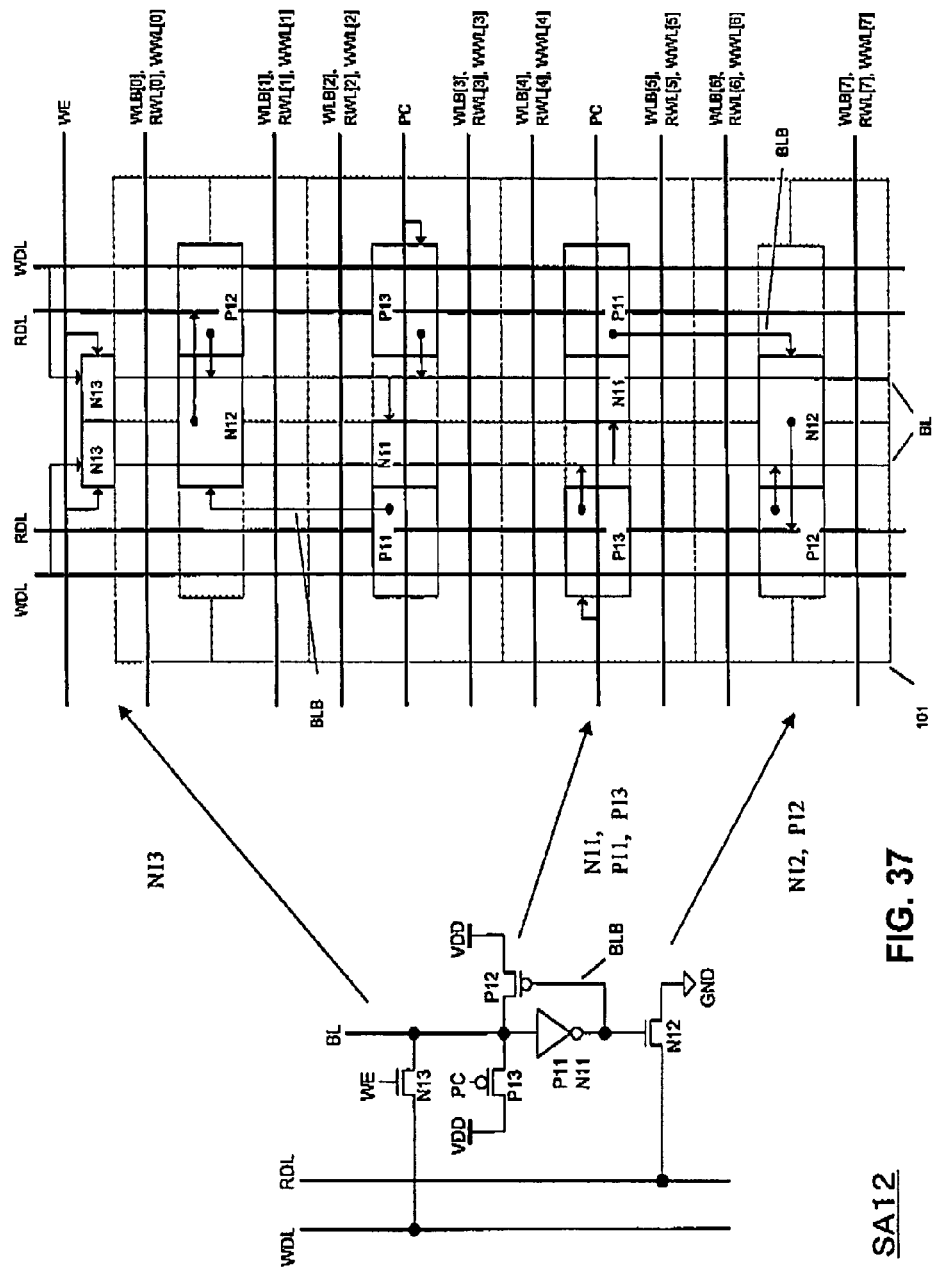
FIG. 37 shows a layout of a sense amplifier SA12 of the cellblock A.
Figure 38:
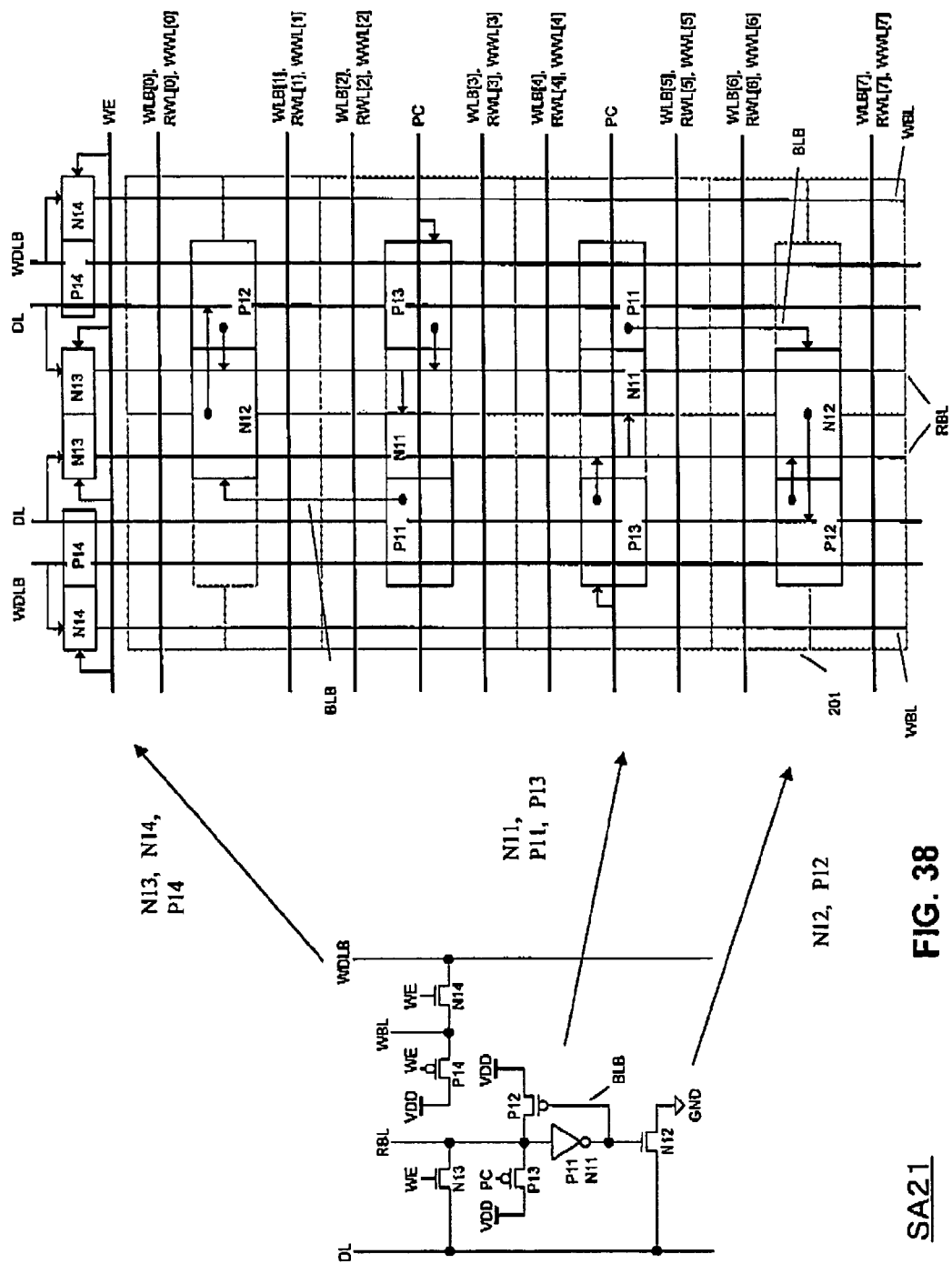
FIG. 38 shows a layout of a sense amplifier SA21 of the cellblock A.
Figure 39:
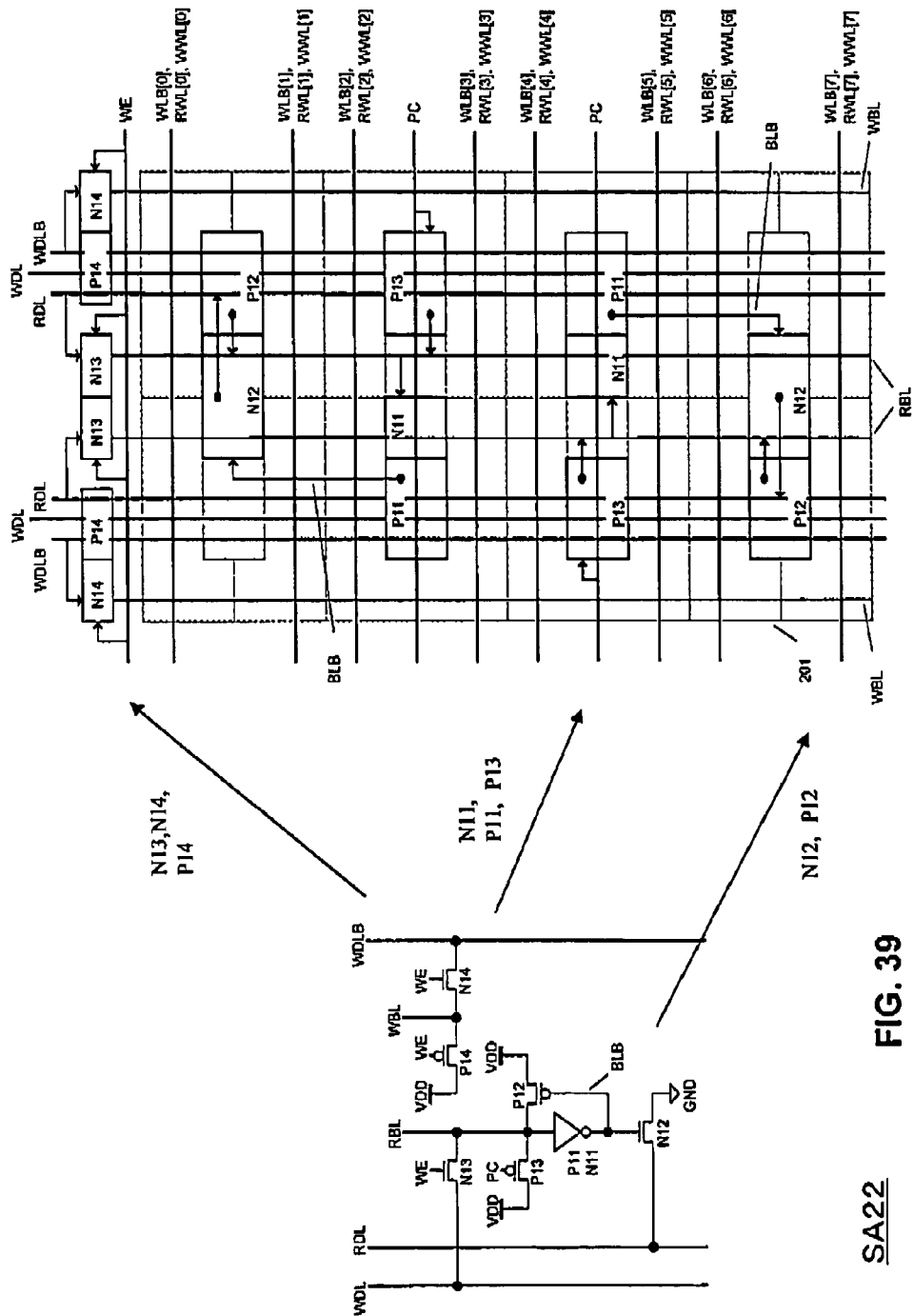
FIG. 39 shows a layout of a sense amplifier SA22 of the cellblock A.
Figure 40:
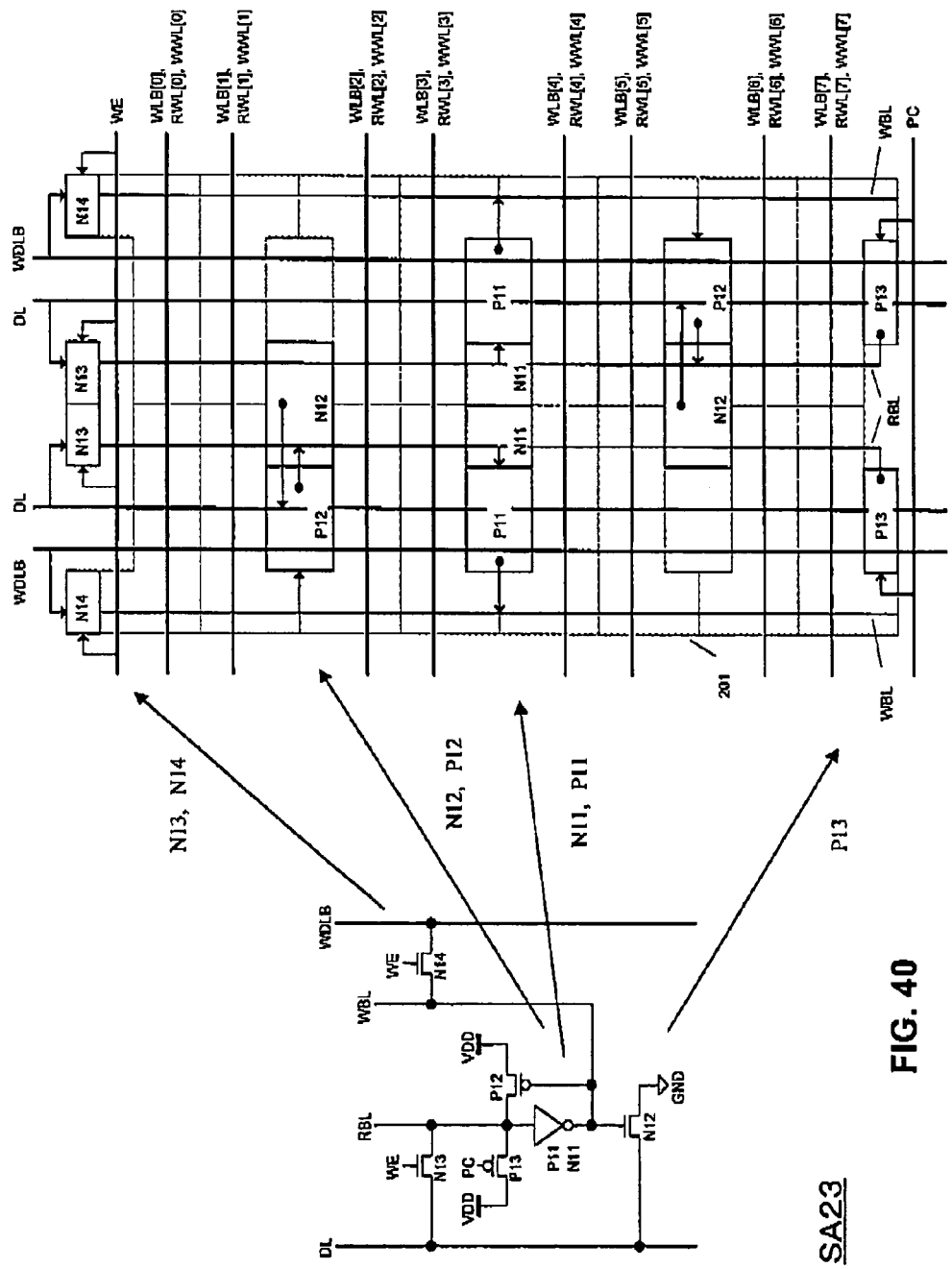
FIG. 40 shows a layout of the sense amplifier SA23 of the cellblock B.
Figure 41:
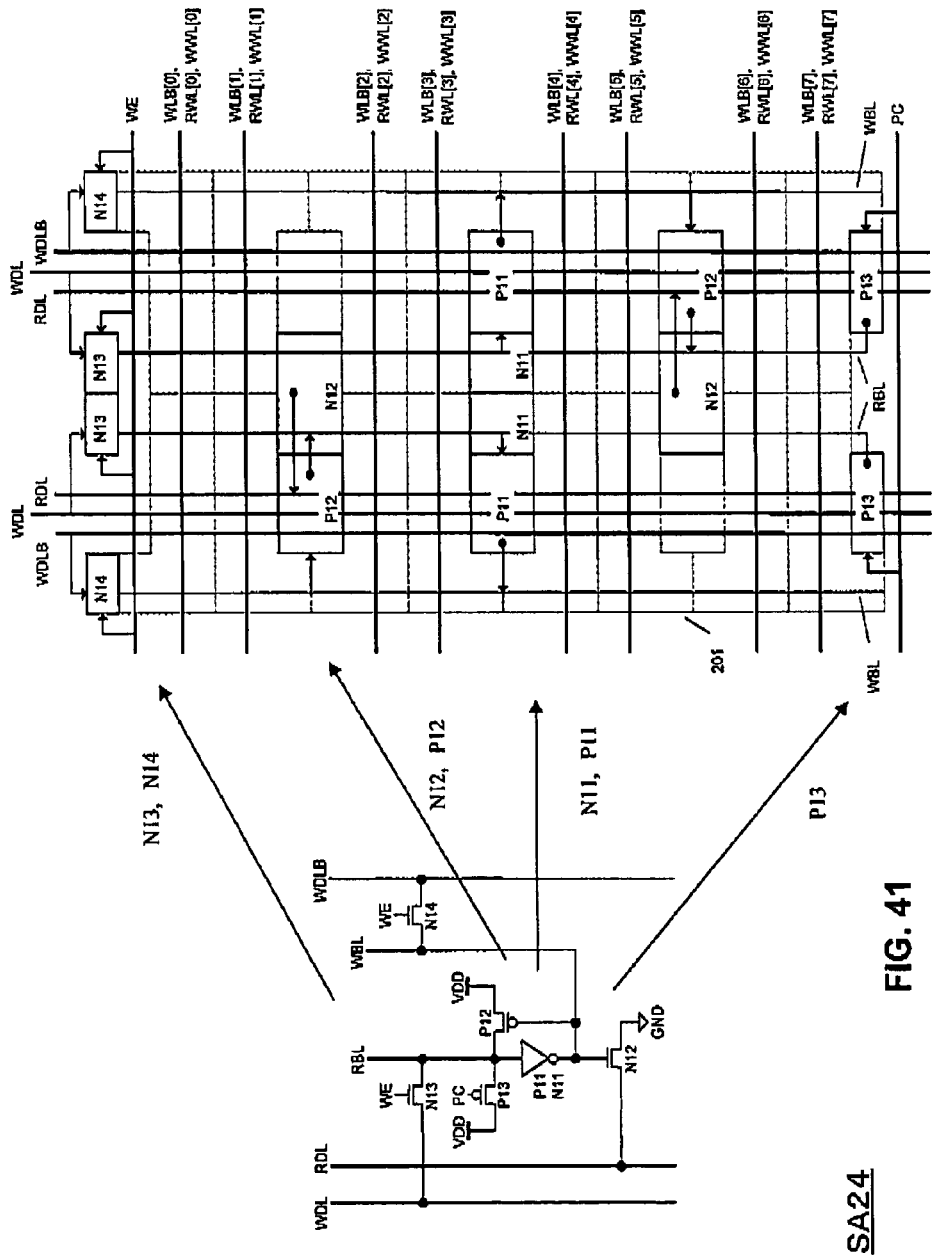
FIG. 41 shows a layout of a sense amplifier SA24 of the cellblock B.
Figure 42:
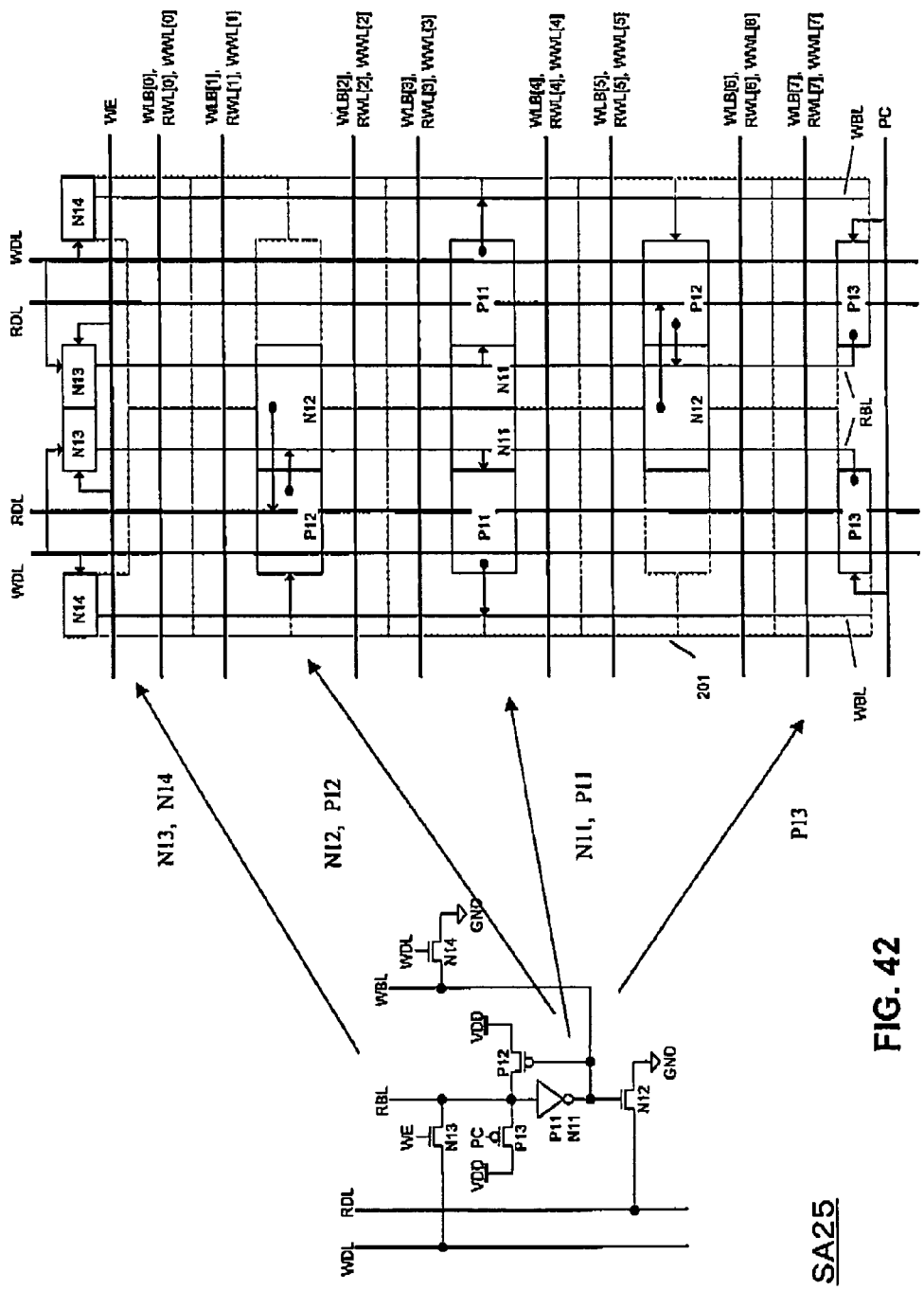
FIG. 42 shows a layout of a sense amplifier SA25 of the cellblock B.
Figure 43:
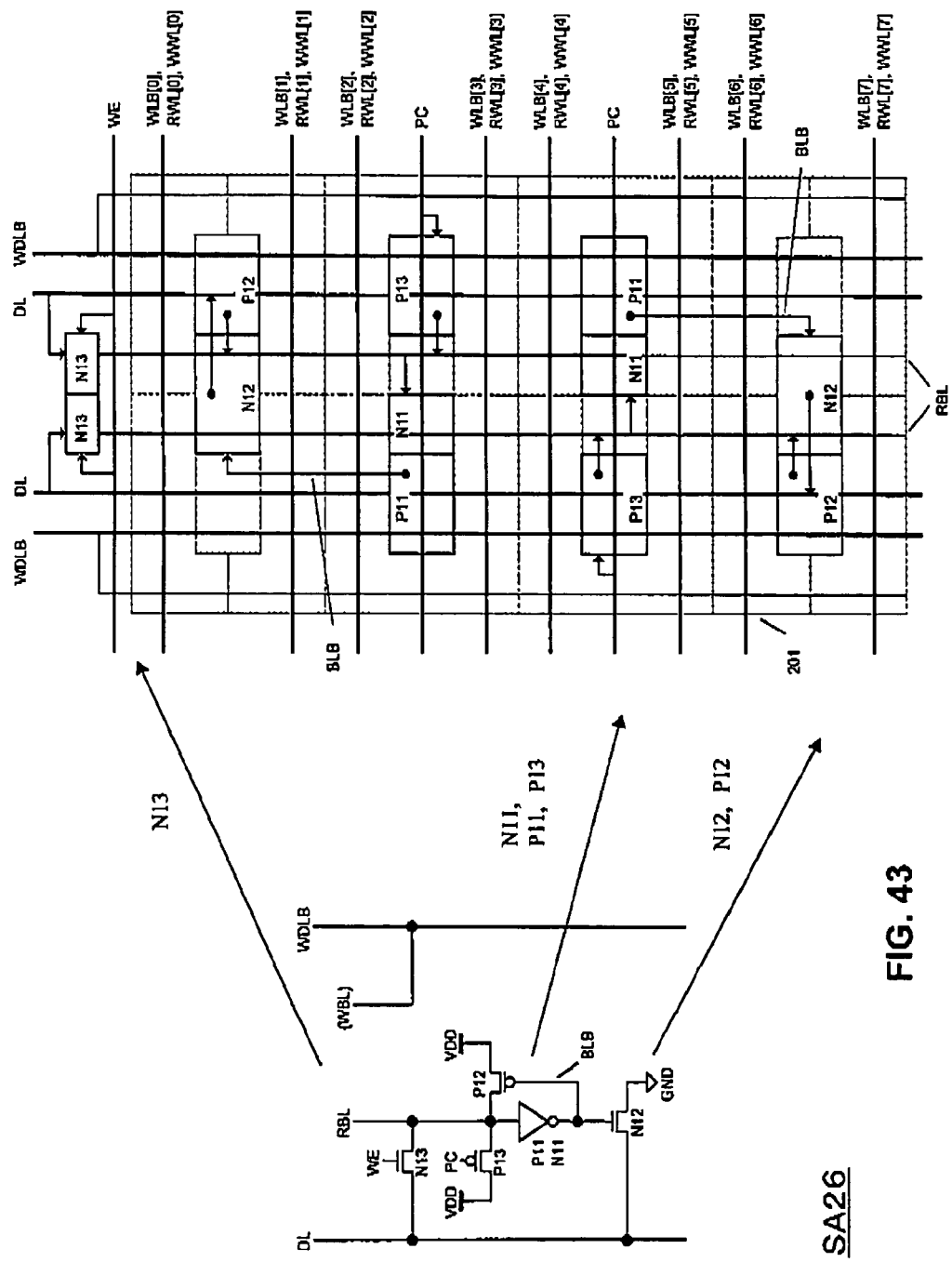
FIG. 43 shows another layout of a sense amplifier SA26 of the cellblock A.
Figure 44:
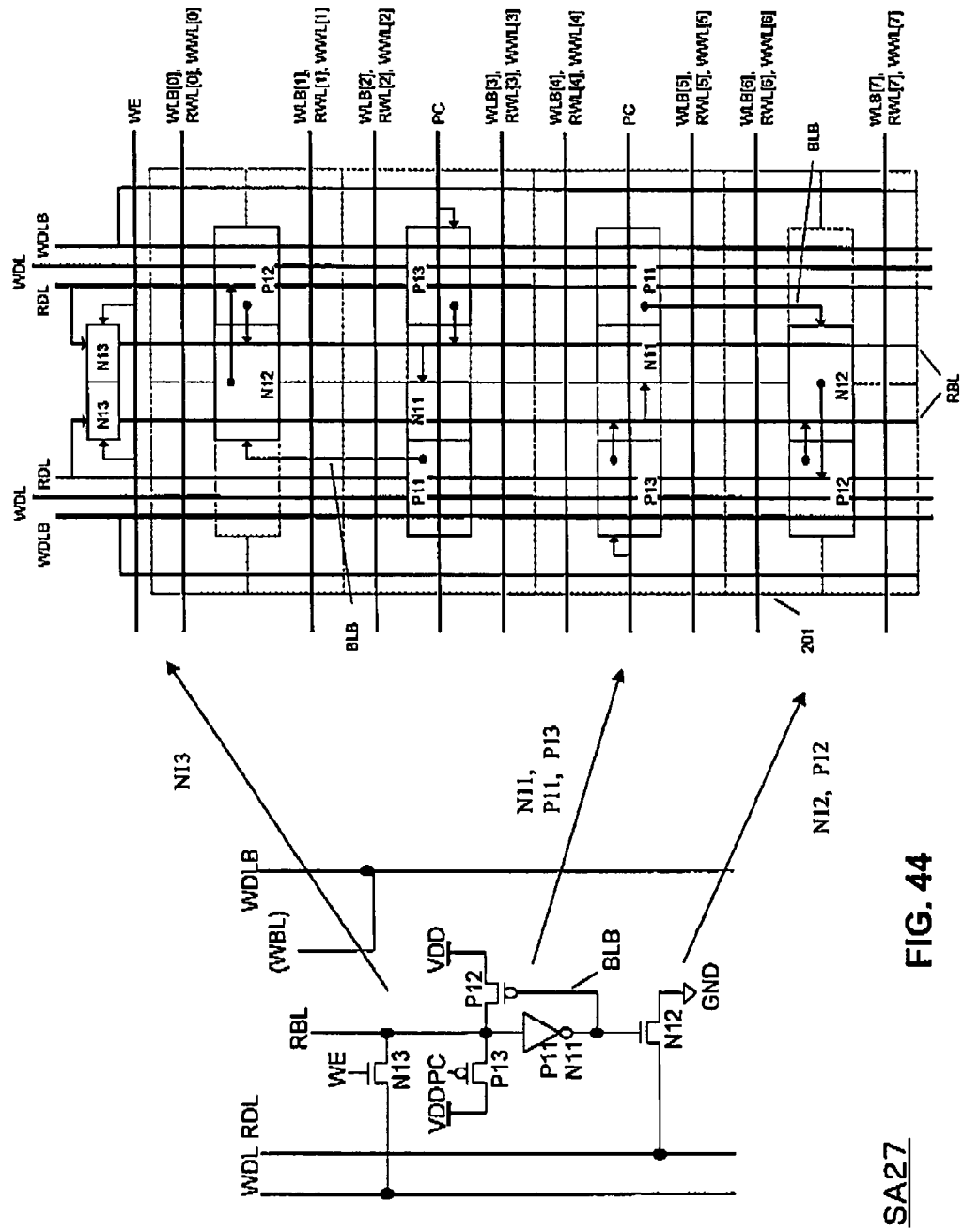
FIG. 44 shows a layout of a sense amplifier SA27 of the cellblock A.
Figure 45:
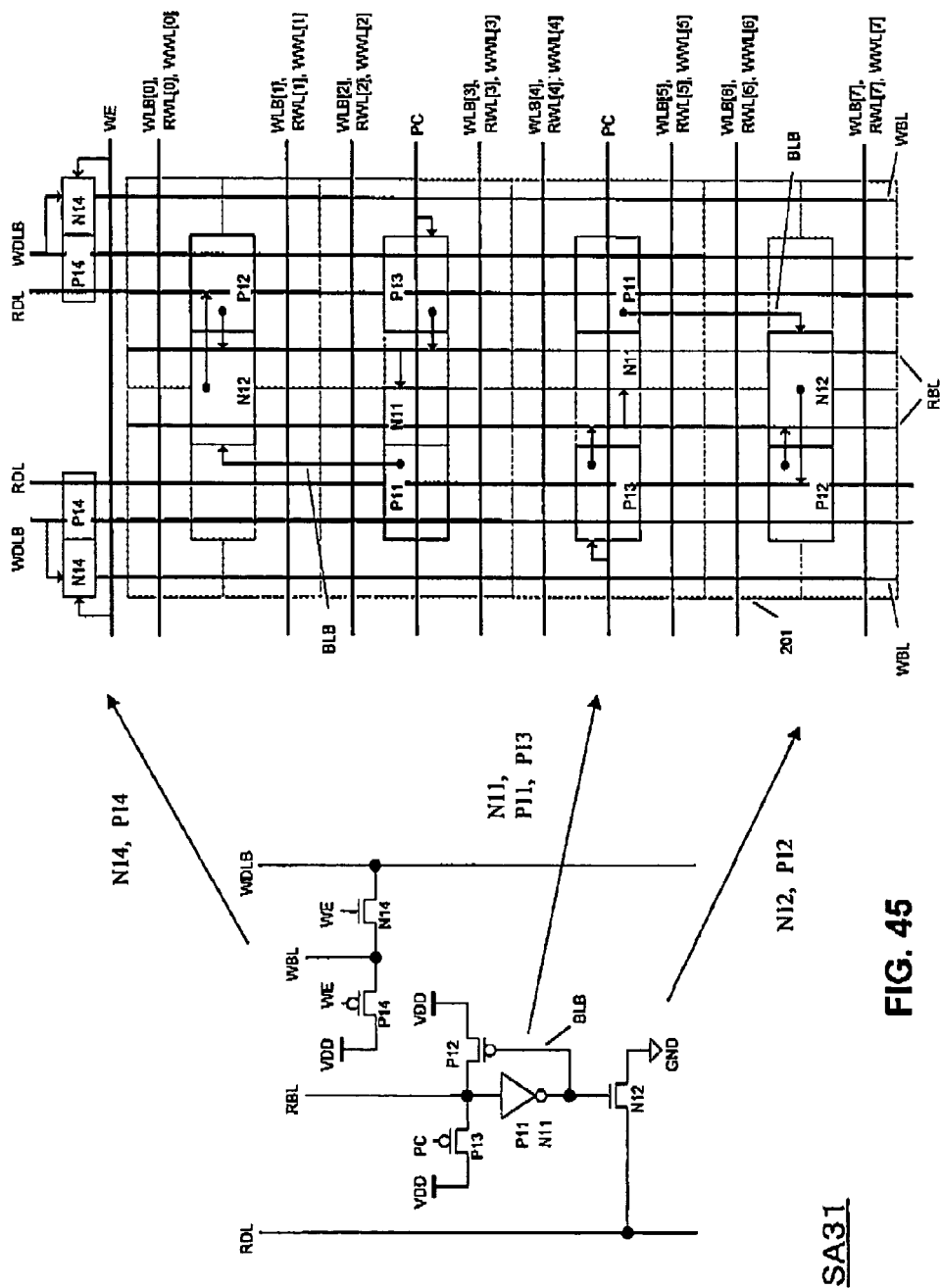
FIG. 45 shows a layout of a sense amplifier SA31 of the cellblock A.
Figure 46:
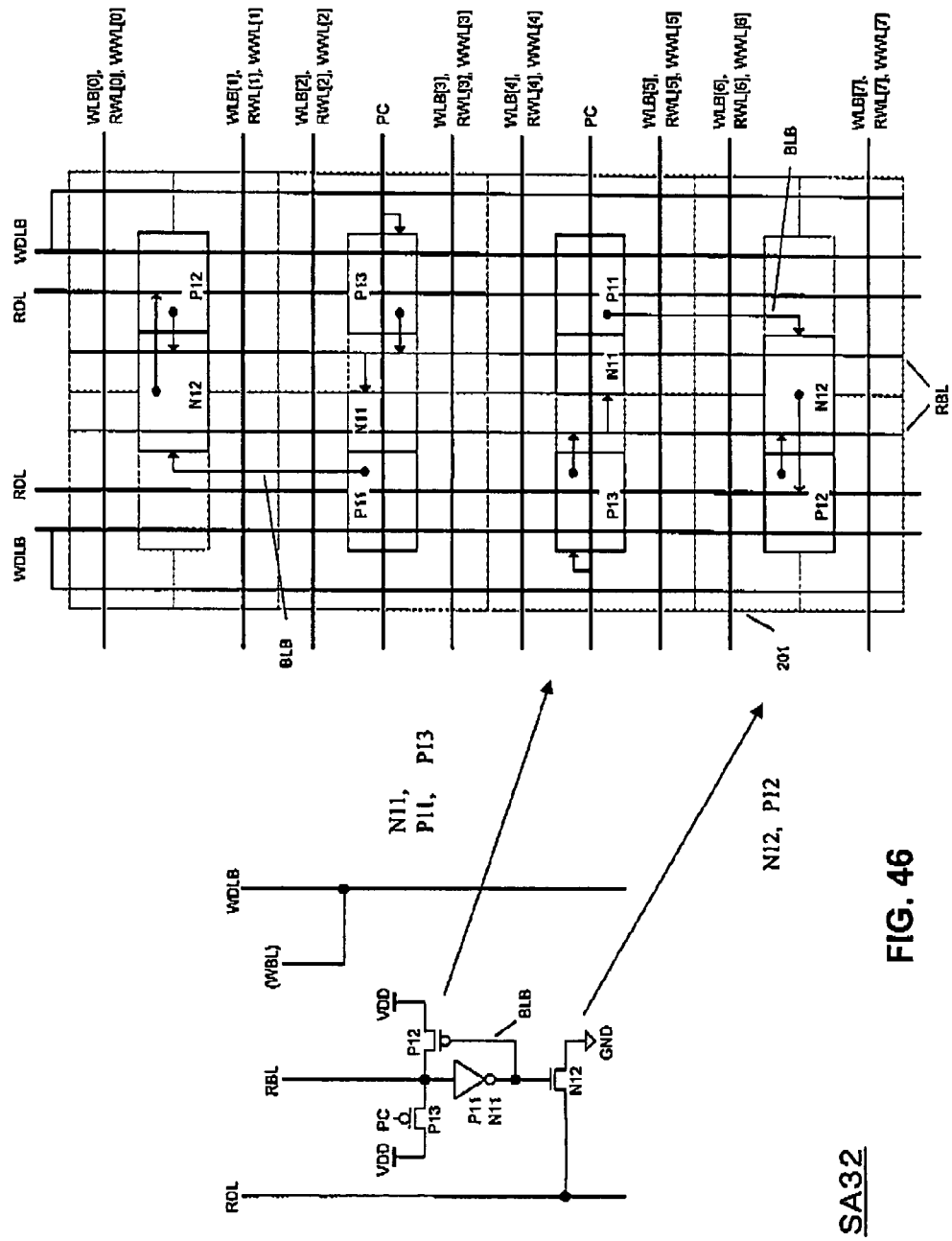
FIG. 46 shows a layout of a sense amplifier SA32 of the cellblock A.

FIG. 31 shows a layout of the sense amplifier SA11 placed in the cellblock A, FIG. 32, a layout of the sense amplifier SA21 placed in the cellblock A, FIG. 33, a layout of the sense amplifier SA23 placed in the cellblock A, FIG. 34, a layout of the sense amplifier SA23 placed in the cellblock A, and FIG. 35, a layout of the sense amplifier SA23 placed in the cellblock B.

In FIG. 31, the cellblock A has a placement layout that includes 8-bit memory cells in an area from left to right for which the sense amplifiers SA11 are disposed one by one, respectively. However, for the layout, not only the sense amplifiers are separately placed in left and right spaces, respectively, but also the layout includes an upper area of the space of the cell block to be allocated to a layout area for the right-side sense amplifiers and a lower area of the space of the cell block to be allocated to a layout area of the left-side sense amplifiers. In such a way, using the space of the associated cell area of the cellblock enables wiring inside the sense amplifiers to be accommodated within a single space. In order to decrease the number of wiring for the sense amplifiers, elements having common connected nodes are disposed in proximate to each other. Units located in different spaces can be replaceable. The transistor N13 is not shown and placed in layout in upper and lower portions of the transistor N13 that is not shown.

A feature of this layout resides in that the layout is made on the space of the adjacent cell area and the inverter circuit output BLB forming a signal of the sense amplifier is wired in the adjacent cell area. A part of a wiring for the ground potential GND is used as a wiring of the signal BLB while the ground potential has wiring formed in a plurality of wiring layers that are connected to each other.

In FIG. 32, the transistors related to the write bit line WBL are added in comparison to the sense amplifier SA11 and placed in layout in upper and lower areas of the cellblock.

In a layout of FIG. 33, also, the transistors N13, N14 are not shown and similarly placed in the upper and lower areas of the cellblock in layout, respectively. With the layout of FIG. 34, the transistors forming the inverter circuit are disposed in the same space and placing precharge signals in the same space enables the number of precharge signal wiring leads by one line. Moreover, FIG. 35 shows an embodiment in which the sense amplifier SA23 is placed in layout in the cellblock B whose terminal end is made discontinuous. The transistors N13, N14, not shown, are similarly placed in the upper and lower areas of the cellblock in layout, respectively, and connected to a diffusion layer through the write word line signal WBL when locating the transistor N14 for reduction in a memory cell dimension.

Figure 47:
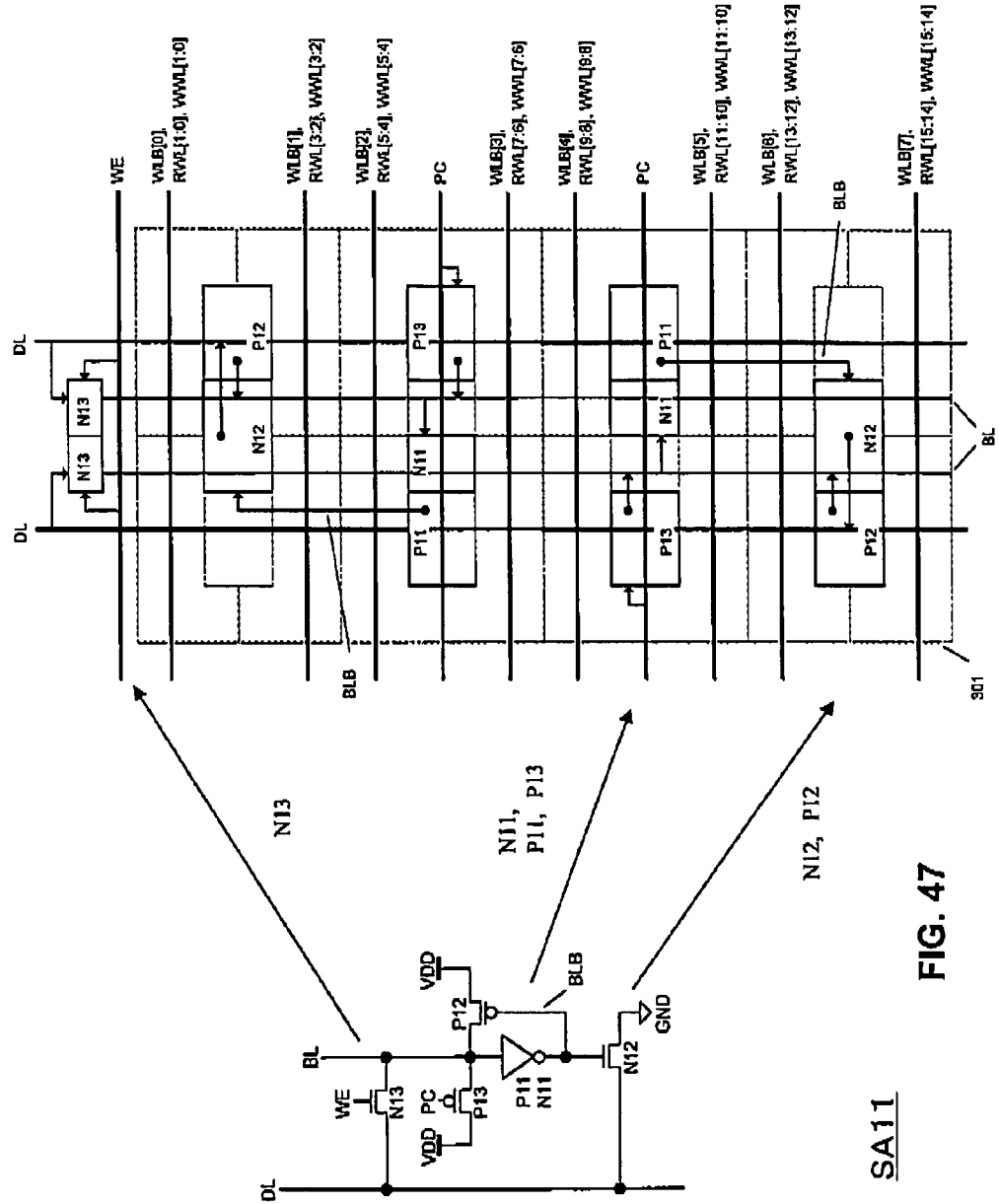
FIG. 47 shows a layout of a sense amplifier SA11 of a cellblock C.
Figure 48:
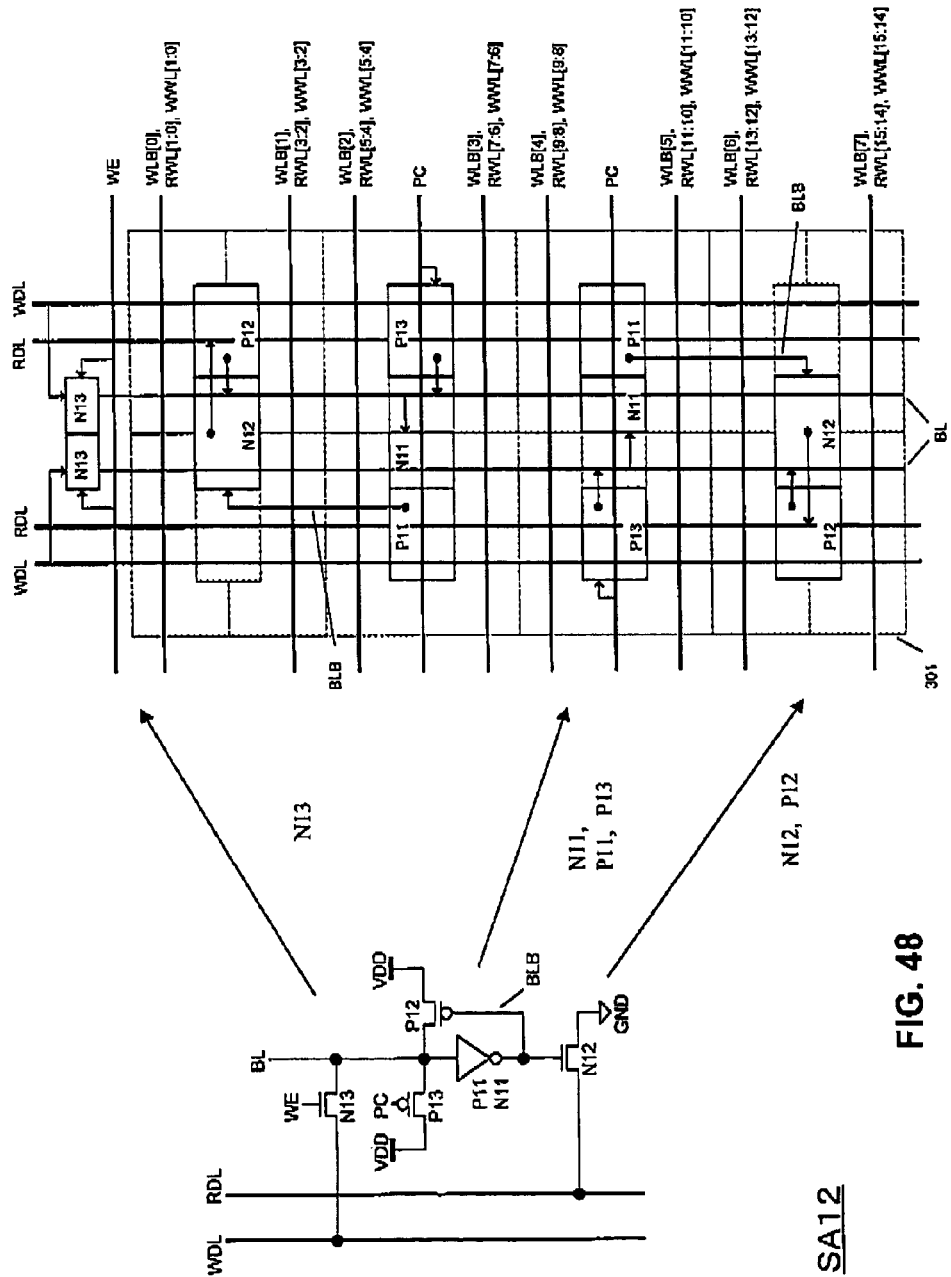
FIG. 48 shows a layout of the sense amplifier SA12 of the cellblock A.

Further, FIGS. 36 to 48 show embodiments of memory cellblocks and layout examples of sense amplifiers disposed for these memory cells. Moreover, FIGS. 47, 48 show layouts of sense amplifiers SA11, SA12 for the 2×8 bit structure of the cellblock C. Accordingly, this layout shows an embodiment including a single sense amplifier for the 16-bit.

With the layout according to the present invention, the elements forming the sense amplifiers are split for placement in layout in the spaces inside the cellblock so as to allow the wiring layers to be disposed in the adjacent memory cell area.

Twelfth Embodiment

Figure 49:
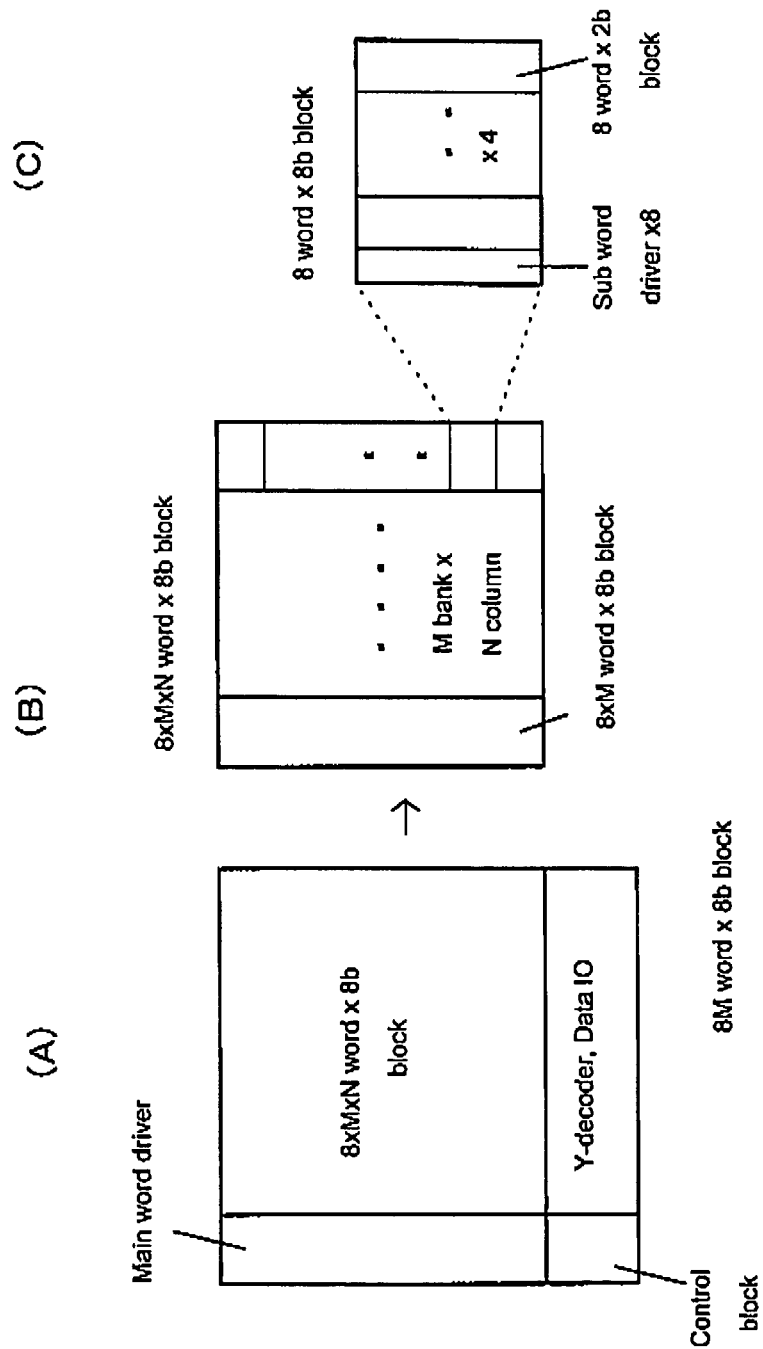
FIGS. 49(A) to (C) show an overall outline of a semiconductor memory device of a twelfth embodiment.

A twelfth embodiment of the present invention is related to a semiconductor memory device in which a block including a plurality of cellblocks and sub decoders is located. FIG. 49 shows overall semiconductor memory device, FIG. 50, blocks and FIG. 51, a sub word circuit structure.

The semiconductor memory device shown in FIG. 49 includes a memory in an 8×M×N word×8-bit structure. The memory is comprised of a control block that generates internal control signals in response to control signals applied through an input and output circuit that is not shown, a main word driver, a Y-decoder and data 10 circuit and a memory cell array (FIG. 49(A)). With the memory cell array, an array of an 8×M×N word×8-bit structure shown in FIG. 49(B) is further comprised of a plurality of 8-word×8-bit blocks. The 8-word×8-bit block shown in FIG. 49(C) includes a sub word driver in 8 words and four 8-word×2-bit cellblocks.

Figure 50:
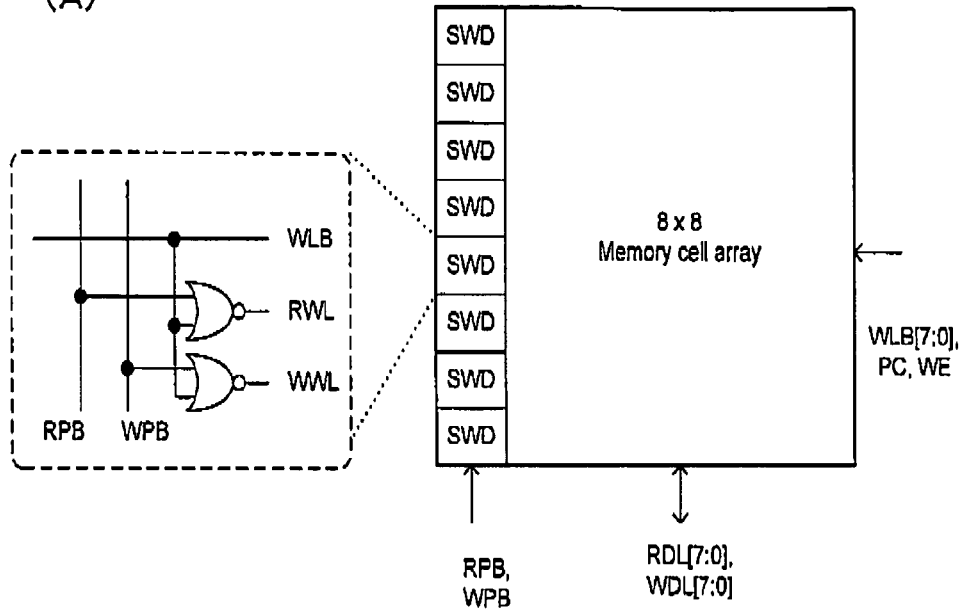
FIG. 50 shows a memory block structure.
Figure 50:
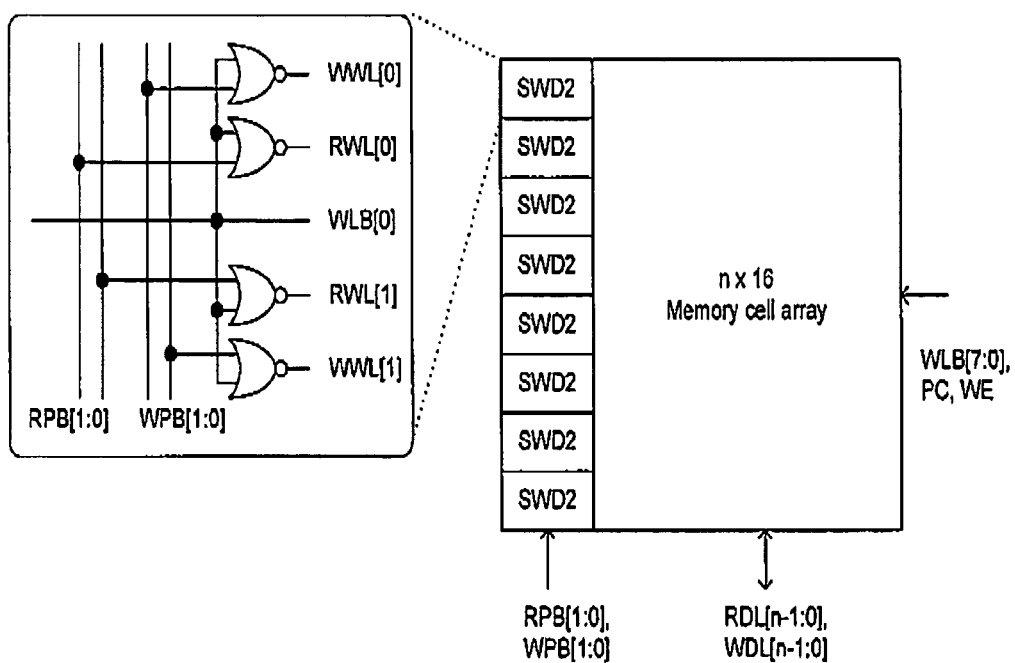

As shown in FIG. 50(A), the block includes sub word drivers for selecting any word line from among 8 words and a memory block in 8×8 bits. Further, FIG. 50 (B) shows a 16-word structure. Here, the cellblock for the 8-word×2-bit structure adopts the cellblocks (A) or (B) described above and the cellblock for the 16-word×2-bit structure adopts the cellblocks (C) or (D) described above.

The sub word driver SWD is comprised of a two-input NOR circuit that is input with main word signals including an inverted word line signal WLB and an inverted read block selection signal RPB, an inverted word line signal WLB and an inverted write block selection signal WPB, with a word line being selected in case where an input takes a low voltage potential "0".

A sub word driver SWD2 includes two read lines and two write word lines. The sub word driver SWD2 includes two sets of two-input NOR circuits that are input with main word signals including an inverted word line signal WLB and an inverted read block selection signal RPB (with "1" or "0"), an inverted word line signal WLB and an inverted write block selection signal WPB (with "1" or "0"), with a word line being selected in case of an input with a low voltage potential "0".

Figure 51:
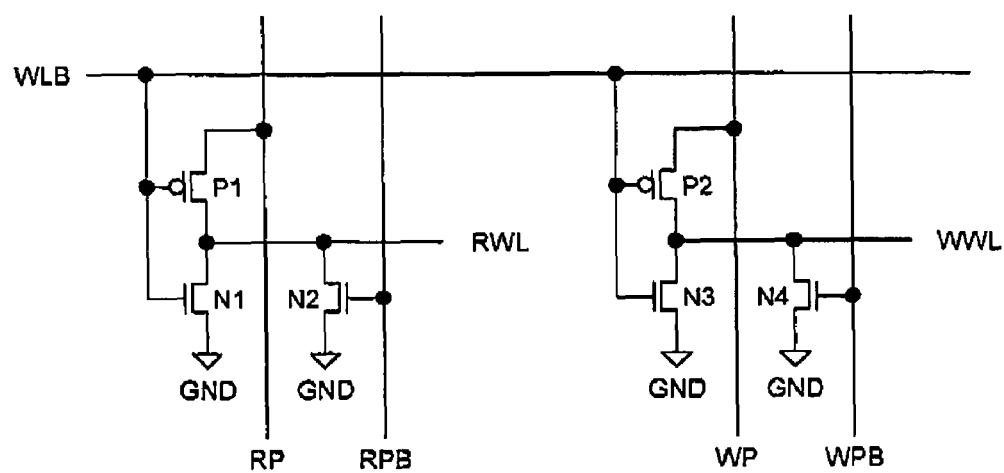
FIG. 51 shows a circuit structure of a sub word driver.

FIG. 51 shows a circuit structure of one embodiment of the sub word driver. The reading sub word driver is input with an inverted word line signal WLB as a main word signal, a read block selection signal RP and an inverted read block selection signal RPB. The inverter circuit is comprised of a PMOS transistor P1 and an NMOS transistor N1 is input with an inverted word line signal WLB and the load transistor P1 has a source to which a read block selection RP is applied.

The drive transistor N1 ha a source connected to the ground potential GND and a read word line signal RWL is output from drains of the transistors P1, N1. Moreover, the inverter has an output to which the drain of the NMOS transistor N2 is connected and the NMOS transistor N2 has a source connected to the ground potential GND and a gate to which the inverted read block selection RPB is input (as shown in FIG. 51). With this circuit structure, the two-input NOR circuit is comprised of three transistors, whereby a read word line signal RWL is selected when the inverted word line signal WLB and the inverted read block selection signal RPB take the low voltage potential.

The write sub word driver is input with the inverted word line signal WLB, playing a role as the main word signal, the write block selection signal WP and the inverted write word selection signal WPB. The inverter circuit is comprised of the PMOS transistor P2 and the NMOS transistor N3 is input with the inverted word line signal WLB, playing a role as the main word signal, and the source of the load transistor P2 is input with the write block selection signal WP.

The drive transistor N3 has a source connected to the ground potential GND and a write word line signal WWL is output from drains of the transistors P2, N3. Additionally, the inverter has an output connected to a drain of the NMOS transistor N4 that has a source connected to the ground potential GND and a gate to which the inverted write word selection signal WPB is input.

With this circuit structure, the two-input NOR circuit is comprised of three transistors, whereby a write word line signal WWL is selected when the inverted word line signal WLB and the inverted write block selection signal WPB take the low voltage potential and the write block selection signal WP takes the high voltage potential.

The sub word driver circuit is comprised of the NOR gate composed of the three transistors that are input with the main word signal, the block selection signal and the inverted block signal. Further, the semiconductor memory device of the present invention is comprised the sub word driver circuits, or the sense amplifier or the memory cells and can operate at a high speed and an ultra low voltage.

With the above, the embodiments of the present invention have been described above in detail, detailed structures may not be limited to these embodiments and may be involved in modifications within a range without departing from a scope of the present invention. For example, the sense amplifier may have application not only to the SRAM playing a role as the memory cell but also to all types of memory cells having a single read bit line.

INDUSTRIAL APPLICABILITY

According to the present invention, a semiconductor memory device performs data storage of a data storage node that is controlled by a transistor connected to the data storage node as a memory cell by switching a data storage method between a "static mode" when maintaining the storage and a "dynamic mode" when performing access for thereby preventing corruption to stored data during the read operation. The sense amplifier takes a novel structure upon executing one input through a bit line and located in a memory array in divided form. The semiconductor memory device operating at ultrahigh-speeds and ultra-low voltages can be efficiently realized in a small memory cell dimension to be applicable to all semiconductor memory devices.

The invention claimed is:

1. A semiconductor memory device comprising
a memory cell comprising first and second data storage nodes, wherein the memory cell comprises:
a first inverter circuit including an input allocated to the second data storage node and an output allocated to the first data storage node, and a second inverter circuit including an input allocated to the first data storage node and an output allocated to the second data storage node; and
first access means connected to the first data storage node for reading out data, and storage control means serially connected only to a drive transistor of the second inverter circuit.

2. A semiconductor memory device according to claim 1, wherein the memory cell further comprises second access means for accessing the second data storage node, the second access means being activated with a write signal thereby performing data transfer between a write bit line and the second data storage node.

3. A semiconductor memory device according to claim 2, wherein the first access means is activated with the memory access signal thereby performing data transfer between a read bit line and the first data storage node.

4. A semiconductor memory device according to claim 3, wherein the first and second inverter circuits forming the memory cell includes a CMOS inverter circuit and the first and second access means and the storage control means include NMOS transistors.

5. A semiconductor memory device according to claim 1, wherein the memory cell further comprises second access means for accessing the second data storage node and the second access means is activated by a write signal to reset the second data storage node.

6. A semiconductor memory device according to claim 5, wherein the first and second inverter circuits forming the memory cell includes a CMOS inverter circuit and the first and second access means and the storage control means include NMOS transistors.

7. A semiconductor memory device comprising
a memory cell comprising first and second data storage nodes, wherein the memory cell comprises:
a first inverter circuit including an input allocated to the second data storage node and an output allocated to the first data storage node, and a second inverter circuit including an input allocated to the first data storage node and having an output allocated to the second data storage node; and
a first access transistor connected to the first data storage node for reading out data, and a transistor serially connected only to a drive transistor of the second inverter circuit.

8. A semiconductor memory device according to claim 7, wherein the memory cell further comprises a second access transistor for accessing the second data storage node and the second data storage node is activated by a write signal to perform data transfer between a write bit line and the second data storage node.

9. A semiconductor memory device according to claim 8, wherein the first access transistor is activated by the memory access signal to perform data transfer between a read bit line and the first data storage node.

10. A semiconductor memory device according to claim 7, wherein the memory cell further comprises a second access transistor for accessing the second data storage node and the second data storage node is activated by a write signal to reset the second data storage node.

11. A semiconductor memory device comprising:
first and second data storage nodes;
a first inverter circuit including an input allocated to the second data storage node and an output allocated to the first data storage node, and a second inverter circuit including an input allocated to the first data storage node and including an output allocated to the second data storage node; and
a first access transistor connected to the first data storage node for reading out data, and a transistor serially connected only to a drive transistor of the second inverter circuit, wherein the transistor is turned off during reading of data from the first data storage node.

12. A semiconductor memory device according to claim 2, further comprising a sense amplifier including a bit line for transferring data to and from the memory cell, a data line for transferring data to and from an input and output circuit, an inverter circuit including an input allocated to the bit line, data read means for transferring an output of the inverter circuit to the data line, and data write means activated by a write signal for transferring data from the data line to the bit line.

13. A semiconductor memory device according to claim 12, wherein the sense amplifier further comprises precharge means for precharging the bit line, and level-maintaining means having an input applied with the output of the inverter circuit for maintaining a level of the bit line.

14. A semiconductor memory device according to claim 13, wherein the data line of the sense amplifier comprises a read data line connected to the read means, and a write data line connected to the write means.

15. A semiconductor memory device according to claim 13, wherein the sense amplifier further comprises write precharge means connected to a write bit line, and second write means for transferring inverted write data from an inverted write data line to the write bit line.

16. A semiconductor memory device according to claim 14, wherein the sense amplifier further comprises precharge means connected to a write bit line, and second write means for transferring inverted write data from an inverted write data line to the write bit line.

17. A semiconductor memory device according to claim 13, wherein the sense amplifier further comprises a write bit line connected to the output of the inverter circuit, and second write means for transferring inverted write data from an inverted write data line to the write bit line.

18. A semiconductor memory device according to claim 14, wherein the sense amplifier further comprises a write bit line connected to the output of the inverter circuit, and second write means for transferring inverted write data from an inverted write data line to the write bit line.

19. A semiconductor memory device according to claim 14, wherein the sense amplifier further comprises a write bit line connected to the output of the inverter circuit, and a write transistor having a gate input applied with a signal from the write data line, a source connected to a ground potential and a drain connected to the write bit line.

20. A semiconductor memory device according to claim 13, wherein the sense amplifier further comprises a write bit line connected to an inverted write data line.

21. A semiconductor memory device according to claim 14, wherein the sense amplifier further comprises a write bit line connected to an inverted write data line.

22. A semiconductor memory device according to claim 2, further comprising a sense amplifier which comprises a bit line and a write bit line for transferring data to and from the memory cell, a read data line and an inverted write data line for transferring data to and from an input and output circuit, an inverter circuit having an input allocated to the bit line, data read means for transferring an output of the inverter circuit to the read data line, data write means activated by a write signal for transferring data from the inverted write data line to the write bit line, precharge means for precharging the bit line, and level-maintaining means input with the output of the inverter circuit for maintaining a level of the bit line.

23. A semiconductor memory device according to claim 2, further comprising a sense amplifier which comprises a bit line and a write bit line for transferring data to and from the memory cell, a read data line and an inverted write data line for transferring data to and from an input and output circuit, an inverter circuit having an input allocated to the bit line, data read means for transferring an output of the inverter circuit to the read data line, precharge means for precharging the bit line, and level-maintaining means input with the output of the inverter circuit for maintaining a level of the bit line, wherein the write bit line is directly connected to the inverted write data line.

24. A semiconductor memory device according to claim 2, further comprising a sub word driver for selecting a read word line in response to a main word signal, a read block selection signal and an inverted read block selection signal and selecting a write word line in response to a main word line, a write block selection signal and an inverted write block selection signal.

25. A semiconductor memory device according to claim 24, wherein the sub word driver comprises a first inverter circuit having an input applied with the main word signal for outputting a read word line signal, and a first transistor having a drain applied with the read word line signal, wherein the first inverter circuit is formed between the read block selection signal and a ground potential and the first transistor has a gate applied with the inverted read block selection and a source connected to a ground potential.

26. A semiconductor memory device according to claim 24, wherein the sub word driver comprises a second inverter circuit having an input applied with the main word signal for outputting a write word line signal, and a second transistor having a drain applied with the write word line signal, wherein the second inverter circuit is formed between the write block selection signal and a ground potential and the second transistor has a gate applied with the inverted write block signal and a source connected to a ground potential.

27. A semiconductor memory device according to claim 2, wherein elements forming the memory cell are placed in layout in an L-shaped region.

28. A semiconductor memory according to claim 27, wherein a memory cell array including memory cells arranged so that two adjacent ones of the memory cells are disposed in mirror symmetry with each other with respect to a side of the memory cell as a mirror symmetry line to leave a vacant space in a central part in the memory cell array, so that sense amplifiers are disposed in the line vacant space.

29. A semiconductor memory device according to claim 5, wherein elements forming the memory cell are placed in layout in an L-shaped region.

* * * * *